(12) United States Patent
Kimura et al.

(10) Patent No.: US 9,887,212 B2
(45) Date of Patent: Feb. 6, 2018

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Hajime Kimura, Kanagawa (JP); Tomoaki Atsumi, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/637,557

(22) Filed: Mar. 4, 2015

(65) Prior Publication Data

US 2015/0263047 A1  Sep. 17, 2015

(30) Foreign Application Priority Data

Mar. 14, 2014 (JP) ................... 2014-051988
Mar. 14, 2014 (JP) ................... 2014-052001

(51) Int. Cl.
*G11C 5/06* (2006.01)
*G11C 11/24* (2006.01)
*H01L 27/12* (2006.01)
*H01L 29/786* (2006.01)
(Continued)

(52) U.S. Cl.
CPC .......... *H01L 27/1222* (2013.01); *G11C 11/24* (2013.01); *G11C 11/56* (2013.01); *G11C 11/565* (2013.01); *G11C 11/5685* (2013.01); *G11C 13/0002* (2013.01); *G11C 13/003* (2013.01); *G11C 13/0007* (2013.01); *H01L 27/1225* (2013.01); *H01L 29/7869* (2013.01);
(Continued)

(58) Field of Classification Search
USPC ..................................... 365/63, 149; 257/296
See application file for complete search history.

(56) References Cited

U.S. PATENT DOCUMENTS 5,731,856 A   3/1998  Kim et al.
5,744,864 A   4/1998  Cillessen et al.
6,294,274 B1  9/2001  Kawazoe et al.
(Continued)

FOREIGN PATENT DOCUMENTS

EP   1737044 A   12/2006
EP   2226847 A   9/2010
(Continued)

OTHER PUBLICATIONS

Asakuma.N. et al., "Crystallization and Reduction of sol-gel-Derived Zinc Oxide Films by Irradiation With Ultraviolet Lamp", Journal of sol-gel Science and Technology, 2003, vol. 26, pp. 181-184.
(Continued)

*Primary Examiner* — Vu Le
(74) *Attorney, Agent, or Firm* — Fish and Richardson P.C.

(57) ABSTRACT

A semiconductor device that can store multilevel data is provided. A circuit includes a transistor. The circuit includes another circuit including a terminal, for example. The terminal is connected to a gate of the transistor. One of a source and a drain of the transistor is connected to a wiring, and the other of the source and the drain is connected to another wiring.

32 Claims, 71 Drawing Sheets

(51) Int. Cl.
*G11C 11/56* (2006.01)
*G11C 13/00* (2006.01)

(52) U.S. Cl.
CPC ...... *G11C 2213/53* (2013.01); *G11C 2213/74* (2013.01); *G11C 2213/79* (2013.01)

(56) References Cited

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,339,828 B2 * | 12/2012 | Yamazaki | G11C 16/0433 365/185.05 |
| 8,363,452 B2 | 1/2013 | Yamazaki et al. | |
| 8,487,303 B2 * | 7/2013 | Takemura | G11C 8/14 257/296 |
| 8,508,967 B2 * | 8/2013 | Yamazaki | G11C 5/025 365/149 |
| 8,520,426 B2 | 8/2013 | Ohnuki | |
| 8,542,528 B2 | 9/2013 | Sekine et al. | |
| 8,553,447 B2 | 10/2013 | Takemura | |
| 8,570,065 B2 * | 10/2013 | Kobayashi | H03K 19/17796 365/149 |
| 8,614,916 B2 | 12/2013 | Nagatsuka et al. | |
| 8,619,454 B2 | 12/2013 | Yamazaki et al. | |
| 8,659,935 B2 | 2/2014 | Yamazaki et al. | |
| 8,686,415 B2 | 4/2014 | Kamata | |
| 8,705,292 B2 * | 4/2014 | Fujita | G11C 11/403 365/188 |
| 8,767,443 B2 * | 7/2014 | Saito | G11C 11/404 365/149 |
| 8,773,906 B2 * | 7/2014 | Ohmaru | G11C 14/0063 365/149 |
| 8,792,284 B2 | 7/2014 | Ohnuki | |
| 8,804,396 B2 | 8/2014 | Yamazaki et al. | |
| 8,804,405 B2 * | 8/2014 | Kimura | G11C 11/005 365/149 |
| 8,824,192 B2 * | 9/2014 | Endo | H01L 257/1225 365/149 |
| 8,837,202 B2 * | 9/2014 | Takemura | G11C 8/14 365/129 |
| 8,848,464 B2 * | 9/2014 | Sekine | G11C 11/403 365/149 |
| 8,854,865 B2 | 10/2014 | Saito | |
| 8,923,076 B2 * | 12/2014 | Kurokawa | H01L 27/1225 365/149 |
| 8,929,128 B2 * | 1/2015 | Shionoiri | G11C 11/409 365/149 |
| 8,929,161 B2 * | 1/2015 | Matsuzaki | H01L 27/1225 365/149 |
| 8,953,358 B2 * | 2/2015 | Nishijima | G11C 11/404 365/129 |
| 8,975,917 B2 * | 3/2015 | Yoneda | H03K 19/173 365/149 |
| 9,001,566 B2 | 4/2015 | Yamazaki et al. | |
| 9,076,505 B2 * | 7/2015 | Atsumi | G11C 8/08 365/149 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0025170 A1 * | 2/2007 | Barth, Jr. | G11C 7/02 365/208 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0260158 A1 * | 10/2011 | Takemura | G11C 11/404 257/43 |

(56) References Cited

U.S. PATENT DOCUMENTS

| | | | |
|---|---|---|---|
| 2012/0033488 A1* | 2/2012 | Nagatsuka | G11C 16/0433 |
| | | | 365/149 |
| 2014/0016407 A1 | 1/2014 | Sekine et al. | |
| 2014/0092681 A1 | 4/2014 | Yamazaki et al. | |
| 2014/0177345 A1 | 6/2014 | Yamazaki et al. | |
| 2014/0241054 A1 | 8/2014 | Koyama | |
| 2014/0269063 A1 | 9/2014 | Nagatsuka et al. | |
| 2014/0269099 A1 | 9/2014 | Nagatsuka et al. | |
| 2014/0286073 A1 | 9/2014 | Onuki | |
| 2014/0332802 A1 | 11/2014 | Ohnuki | |
| 2014/0340953 A1 | 11/2014 | Yamazaki et al. | |
| 2014/0374747 A1 | 12/2014 | Kurokawa | |
| 2015/0023090 A1 | 1/2015 | Saito | |
| 2015/0255157 A1* | 9/2015 | Ikeda | G11C 16/0441 |
| | | | 365/185.23 |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2012-256400 A | 12/2012 | |
| WO | WO-2004/114391 | 12/2004 | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phy. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YBFe2O4, and YB2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides",Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., The phase relations in the In2O3—Ga2ZnO4—ZnO system at 1350° C., Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009. pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

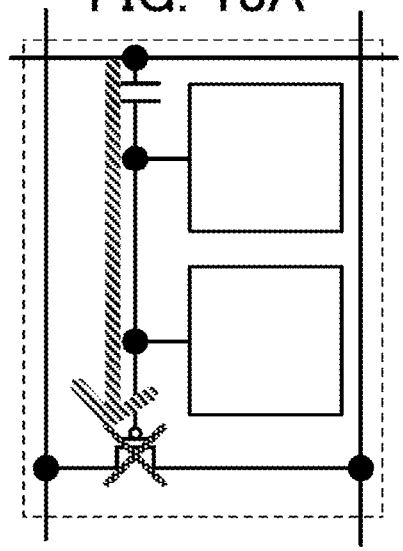
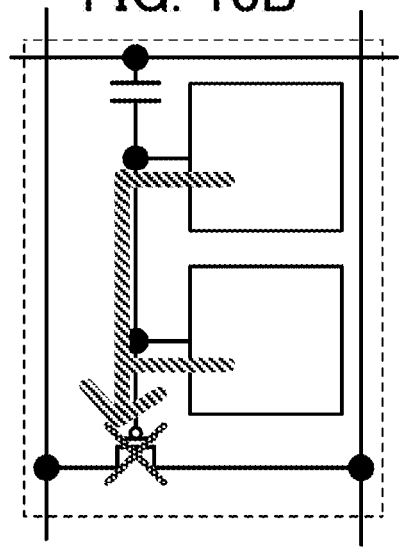
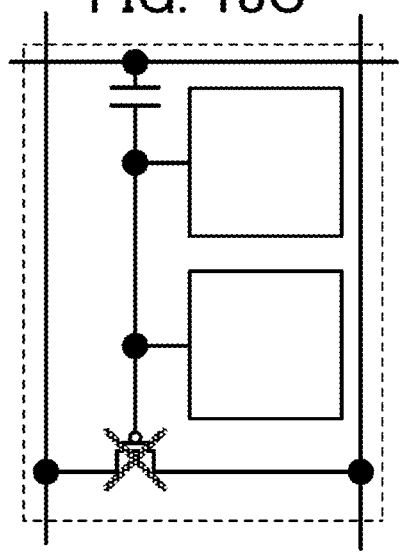

FIG. 19A
FIG. 19B
FIG. 19C
FIG. 19D
FIG. 19E
FIG. 19F
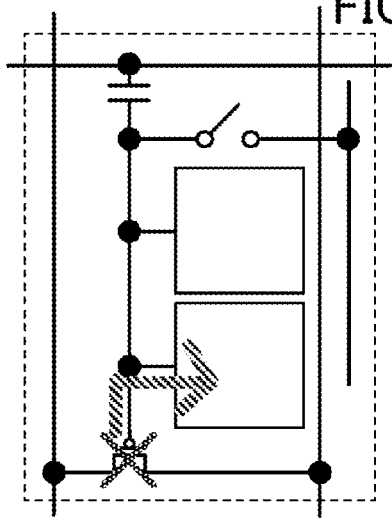
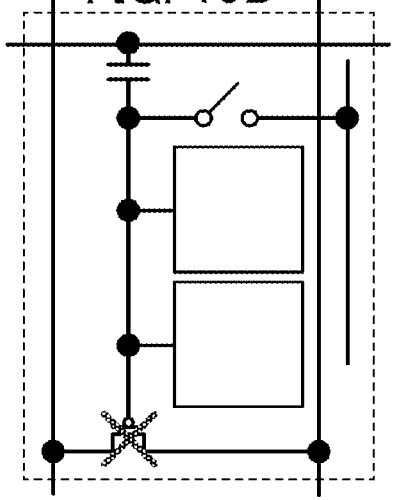
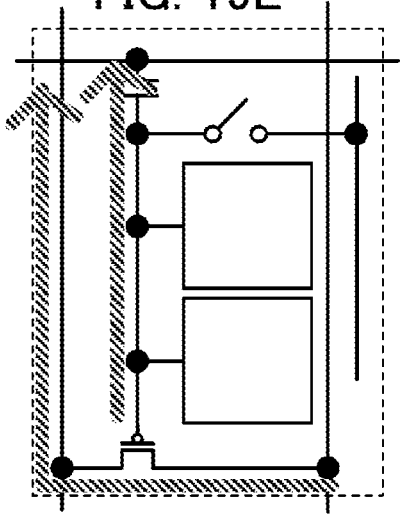
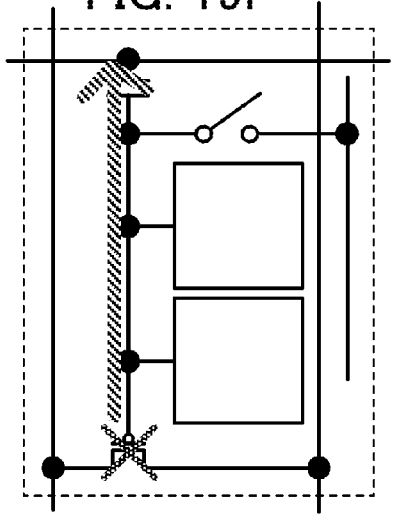

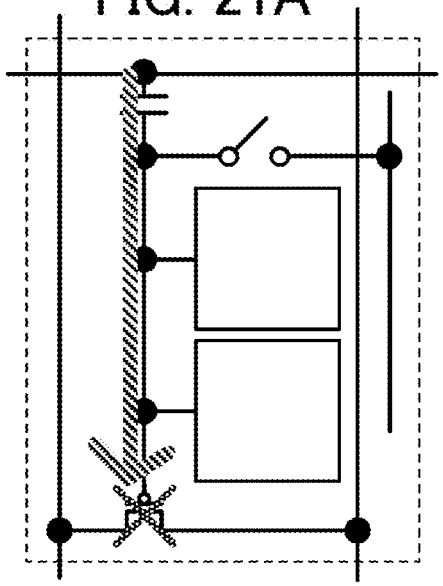
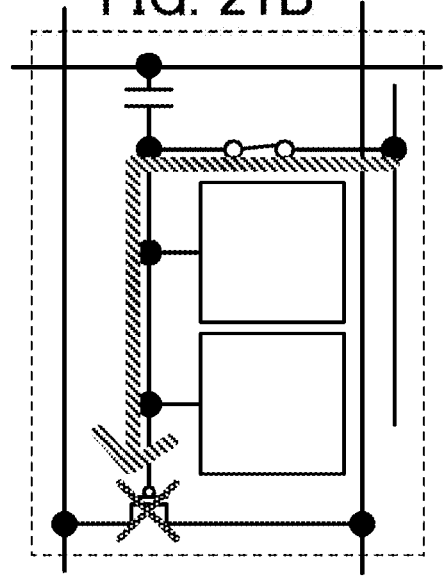
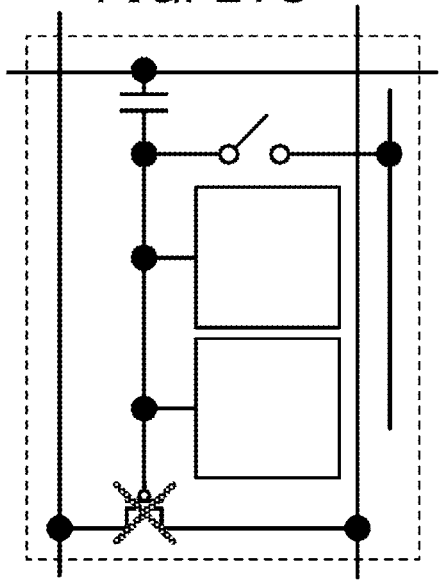

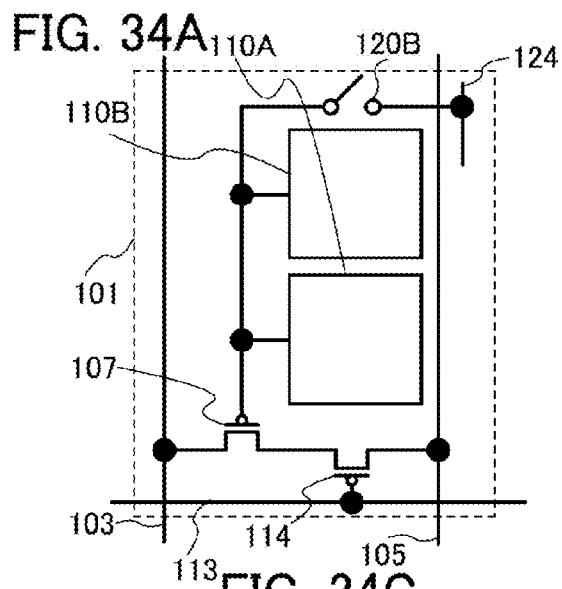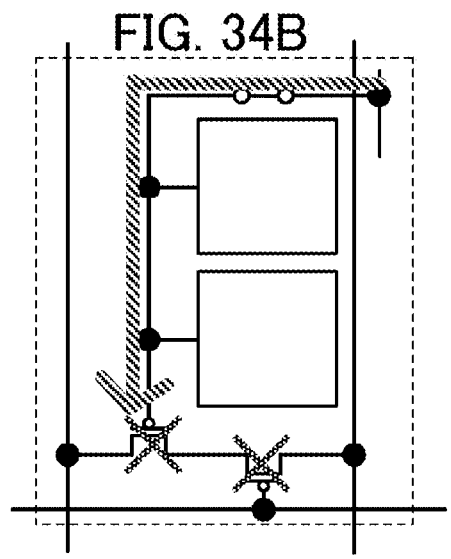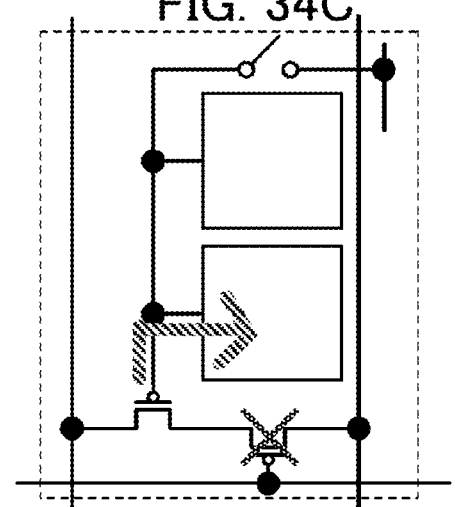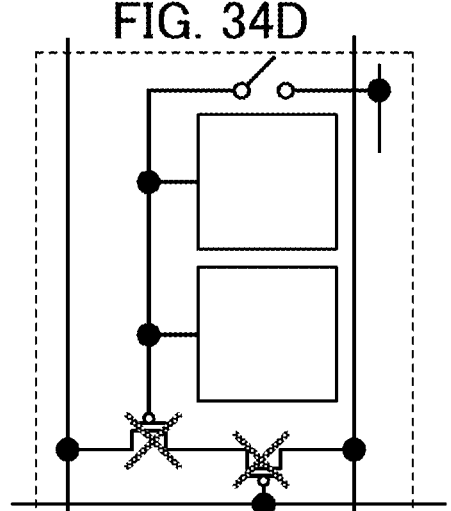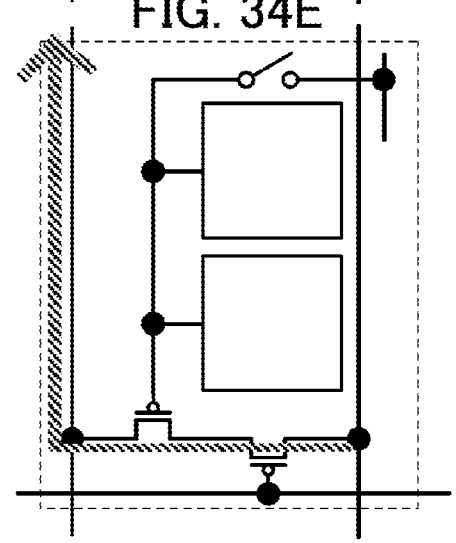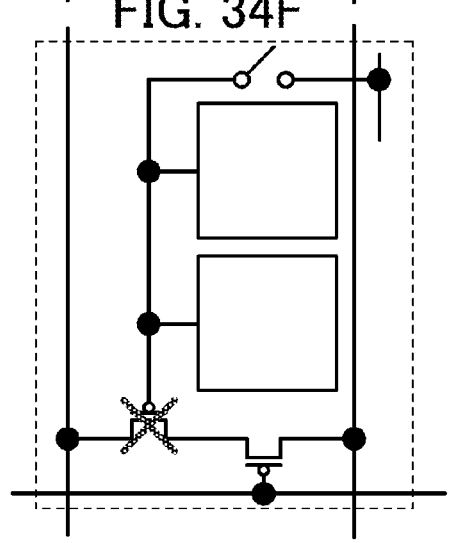

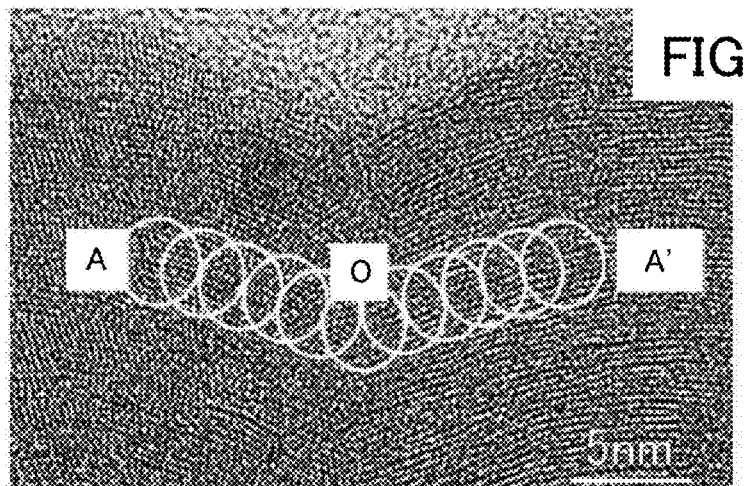
FIG. 60A
FIG. 60B
FIG. 60C
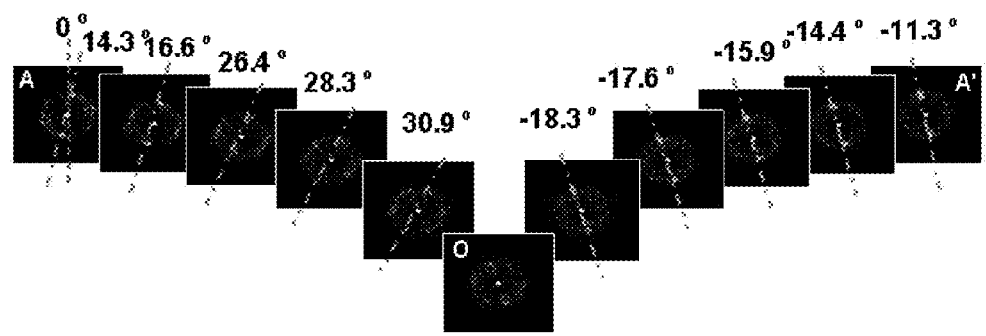

CAAC-OS nc-OS

□ non-CAAC    ⊟ CAAC as-sputtered after heat treatment at 450 °C

SEMICONDUCTOR DEVICE AND ELECTRONIC DEVICE

BACKGROUND OF THE INVENTION

1. Field of the Invention

One embodiment of the present invention relates to a memory device which includes a transistor including an oxide semiconductor, and a method for driving the memory device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

2. Description of the Related Art

A semiconductor device that can hold data even after power supply is stopped by using a transistor including semiconductor silicon (Si) in its channel formation region (such a transistor is referred to as a Si transistor in the following description) and a transistor including an oxide semiconductor (e.g., an oxide including In, Ga, and Zn) in its channel formation region in combination, has attracted attention (see Patent Document 1).

In recent years, with the increase in the amount of data manipulated, a semiconductor device having a larger storage capacity has been required. In such situations, the semiconductor device disclosed in Patent Document 1 has a structure in which multilevel data is stored and read.

REFERENCE

Patent Document

[Patent Document 1] Japanese Published Patent Application No. 2012-256400

SUMMARY OF THE INVENTION

In general, a transistor including semiconductor silicon has a low withstand voltage in operation, in some cases, which means that various problems may occur in the transistor including semiconductor silicon when high voltage is applied to the transistor in operation. The problems are, for example, avalanche breakdown, breakdown of a semiconductor joint portion, breakdown of a gate insulating film, and other various phenomena. To avoid these problems, a complex process for manufacturing the transistor including semiconductor silicon is used. Moreover, a low voltage is applied to the transistor including semiconductor silicon in operation in order to avoid the problems. Accordingly, in the case of manufacturing a semiconductor device that stores multilevel data using such a transistor, the number of bits of data the semiconductor device can store is small.

In consideration of this circumstance, an object of one embodiment of the present invention is to provide a semiconductor device that has a high withstand voltage. An object of one embodiment of the present invention is to provide a semiconductor device that has a large storage capacity. An object of one embodiment of the present invention is to provide a multilevel memory device. An object of one embodiment of the present invention is to provide a novel semiconductor device.

Note that the descriptions of these objects do not disturb the existence of other objects. In one embodiment of the present invention, there is no need to achieve all of these objects. Other objects will be apparent from and can be derived from the description of the specification, the drawings, the claims, and the like.

One embodiment of the present invention is a semiconductor device including a first transistor, a first circuit, and a second circuit. In the semiconductor device, a first terminal of the first transistor is electrically connected to a first wiring, a second terminal of the first transistor is electrically connected to a second wiring, a gate of the first transistor is electrically connected to a first terminal of the first circuit, and the gate of the first transistor is electrically connected to a first terminal of the second circuit. The first circuit includes a second transistor, a third transistor, and a first capacitor. A first terminal of the second transistor is electrically connected to the first terminal of the first circuit, a gate of the second transistor is electrically connected to a first terminal of the first capacitor, and a first terminal of the third transistor is electrically connected to the gate of the second transistor. The second circuit includes a fourth transistor, a fifth transistor, and a second capacitor. A first terminal of the fourth transistor is electrically connected to the first terminal of the second circuit, a gate of the fourth transistor is electrically connected to a first terminal of the second capacitor, and a first terminal of the fifth transistor is electrically connected to the gate of the fourth transistor.

One embodiment of the present invention is a semiconductor device having the above-described structure and further including a third capacitor. A first terminal of the third capacitor is electrically connected to the gate of the first transistor.

One embodiment of the present invention is a semiconductor device having the above-described structure and further including a sixth transistor. A first terminal of the sixth transistor is electrically connected to the gate of the first transistor.

One embodiment of the present invention is a semiconductor device having the above-described structure, in which a second terminal of the second transistor is electrically connected to a second terminal of the third transistor, and a second terminal of the fourth transistor is electrically connected to a second terminal of the fifth transistor.

One embodiment of the present invention is a semiconductor device having the above-described structure, in which the first transistor includes single crystal silicon in its channel formation region, and the second transistor, the third transistor, the fourth transistor, and the fifth transistor each include an oxide semiconductor in their channel formation regions.

One embodiment of the present invention is a semiconductor device having the above-described structure, in which the second transistor, the third transistor, the fourth transistor, and the fifth transistor each have the same polarity, and the first transistor has a polarity different from the polarity of the second transistor.

One embodiment of the present invention is a semiconductor device having the above-described structure, in which an amplitude of a potential of the gate of the first transistor is smaller than an amplitude of a potential of the gate of the second transistor.

One embodiment of the present invention is a semiconductor device including a first transistor, a second transistor, a first circuit, and a second circuit. In the semiconductor device, the first transistor and the second transistor are electrically connected in series to each other between a first wiring and a second wiring, a first terminal of the first transistor is electrically connected to a first terminal of the second transistor, a gate of the first transistor is electrically connected to a first terminal of the first circuit, and the gate of the first transistor is electrically connected to a first terminal of the second circuit. The first circuit includes a third transistor, a fourth transistor, and a first capacitor. A first terminal of the third transistor is electrically connected to the first terminal of the first circuit, a gate of the third transistor is electrically connected to a first terminal of the first capacitor, and a first terminal of the fourth transistor is electrically connected to the gate of the third transistor. The second circuit includes a fifth transistor, a sixth transistor, and a second capacitor. A first terminal of the fifth transistor is electrically connected to the first terminal of the second circuit, a gate of the fifth transistor is electrically connected to a first terminal of the second capacitor, and a first terminal of the sixth transistor is electrically connected to the gate of the fifth transistor.

One embodiment of the present invention is a semiconductor device having the above-described structure and further including a seventh transistor. A first terminal of the seventh transistor is electrically connected to the gate of the first transistor.

One embodiment of the present invention is a semiconductor device having the above-described structure, in which a second terminal of the third transistor is electrically connected to a second terminal of the fourth transistor, and a second terminal of the fifth transistor is electrically connected to a second terminal of the sixth transistor.

One embodiment of the present invention is a semiconductor device having the above-described structure, in which the first transistor has the same polarity as the second transistor.

One embodiment of the present invention is a semiconductor device having the above-described structure, in which the first transistor and the second transistor each include single crystal silicon in their channel regions, and the third transistor, the fourth transistor, the fifth transistor, and the sixth transistor include an oxide semiconductor in their channel regions.

One embodiment of the present invention is a semiconductor device having the above-described structure, in which the third transistor, the fourth transistor, the fifth transistor, and the sixth transistor each have the same polarity, and the first transistor has a polarity different from the polarity of the third transistor.

One embodiment of the present invention is a semiconductor device having the above-described structure, in which an amplitude of a potential of the gate of the first transistor is smaller than an amplitude of a potential of the gate of the third transistor.

One embodiment of the present invention is a semiconductor device having the above-described structure, in which the first circuit can store data of one bit or more, and the second circuit can store data of one bit or more.

One embodiment of the present invention is an electronic device including the semiconductor device having any of the above-described structures and a display device.

With one embodiment of the present invention, a semiconductor device that has a high withstand voltage can be provided. With one embodiment of the present invention, a semiconductor device that has a large storage capacity can be provided. With one embodiment of the present invention, a multilevel memory device can be provided. With one embodiment of the present invention, a novel semiconductor device can be provided.

Note that the description of these effects does not disturb the existence of other effects. One embodiment of the present invention does not necessarily achieve all of these effects. Other effects will be apparent from and can be derived from the description of the specification, the drawings, the claims, and the like.

BRIEF DESCRIPTION OF THE DRAWINGS

In the accompanying drawings:

FIGS. 18A to 18C illustrate an operation of a semiconductor device according to one embodiment of the present invention;

FIGS. 19A to 19F illustrate an operation of a semiconductor device according to one embodiment of the present invention;

FIGS. 21A to 21C illustrate an operation of a semiconductor device according to one embodiment of the present invention;

FIGS. 34A to 34F illustrate an operation of a semiconductor device according to one embodiment of the present invention;

FIGS. 60A and 60B are high-resolution cross-sectional TEM images and FIG. 60C is a local Fourier transform image of an oxide semiconductor;

DETAILED DESCRIPTION OF THE INVENTION

Figure 1:
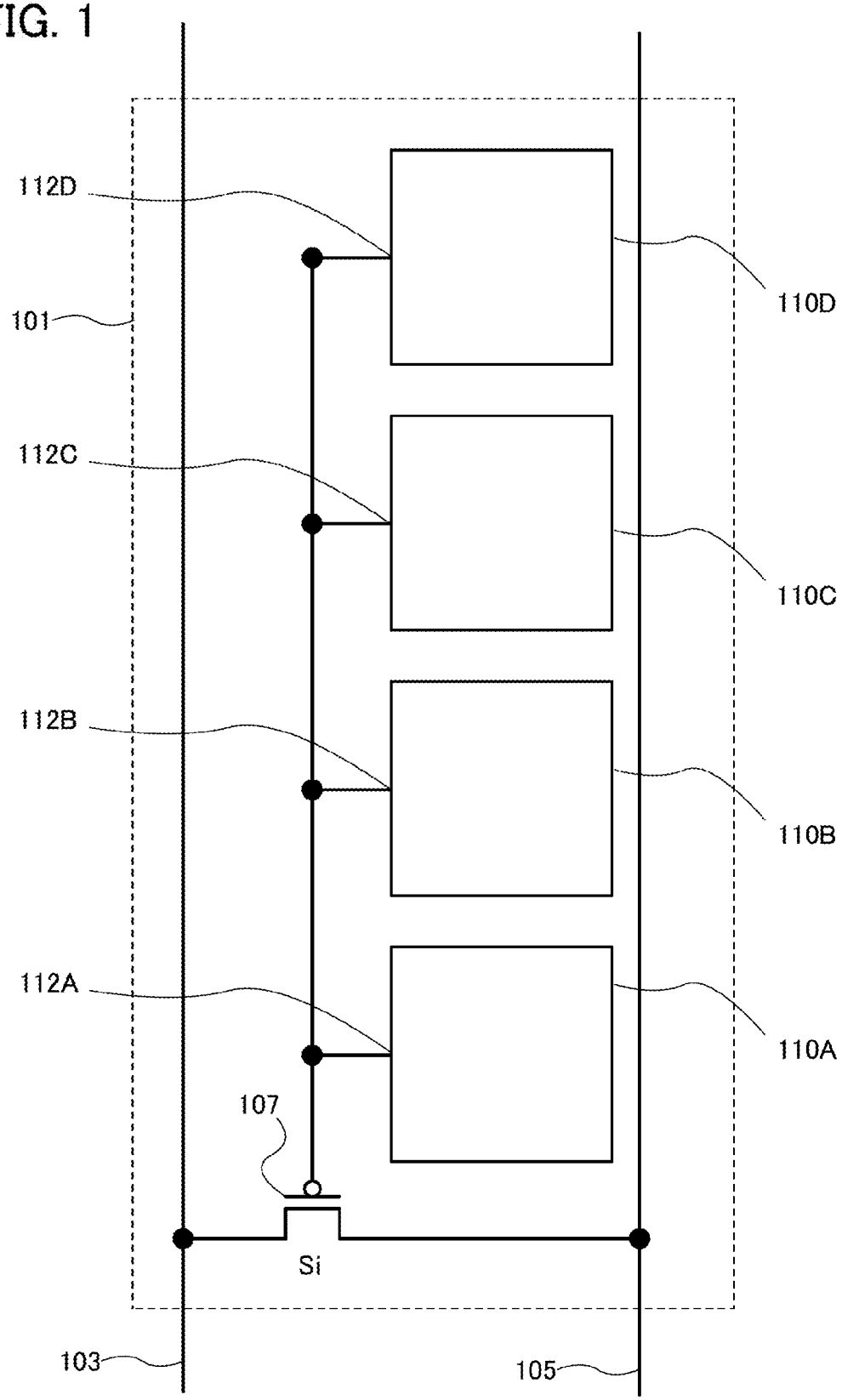
FIG. 1 is a circuit diagram of a semiconductor device according to one embodiment of the present invention.

Embodiments of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiments described below. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa. Note that the potential indicates a relative value. Accordingly, "ground potential" does not necessarily mean 0 V.

Note that the ordinal numbers such as "first" and "second" are used for convenience and do not denote the order of steps or the stacking order of layers. Therefore, the terms such as "first", "second", and "third" do not limit the number of elements, members, regions, layers, areas, and the like. Furthermore, for example, "first" can be replaced with "second", "third", or the like.

Note that a "semiconductor" may have characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" may have characteristics of a "conductor" in some cases when the conductivity is sufficiently high, for example. A "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

Note that in the embodiments described below, an insulator may be formed to have, for example, a single-layer structure or a stacked-layer structure including an insulator containing one or more kinds of boron, carbon, nitrogen, oxygen, fluorine, magnesium, aluminum, silicon, phosphorus, chlorine, argon, gallium, germanium, yttrium, zirconium, lanthanum, neodymium, hafnium, and tantalum unless otherwise specified. A resin may be used as the insulator. For example, a resin containing polyimide, polyamide, acrylic, silicone, or the like may be used. The use of a resin does not need planarization treatment performed on a top surface of the insulator in some cases. By using a resin, a thick film can be formed in a short time; thus, the productivity can be increased. The insulator may be preferably formed to have a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

Note that in the following embodiments, unless otherwise specified, a conductor may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy film or a compound film of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In this specification, the phrase "A has a region with a concentration B" means, for example, "the concentration of the entire region of A in the depth direction is B", "the average concentration in a region of A in the depth direction is B", "the median value of the concentration in a region of A in the depth direction is B", "the maximum value of the concentration in a region of A in the depth direction is B", "the minimum value of the concentration in a region of A in the depth direction is B", "a convergence value of the concentration in a region of A in the depth direction is B", and "the concentration in a region in which a probable value of A can be obtained in measurement is B".

In this specification, the phrase "A has a region with a size B, a length B, a thickness B, a width B, or a distance B" means, for example, "the size, the length, the thickness, the width, or the distance of the entire region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region in which a probable value of A can be obtained in measurement is B".

Note that in this specification, the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths are not necessarily the same in all regions. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths are not necessarily the same in all regions. In other words, the channel width of one transistor is not limited to one value in some cases. Therefore, in this specification, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, without accurate information on the shape of a semiconductor, it is difficult to measure an effective channel width accurately.

Note that functions of a "source" and a "drain" of a transistor are sometimes replaced with each other when a transistor of opposite polarity is used or when the direction of current flow is changed in circuit operation, for example. Therefore, the terms "source" and "drain" can be replaced with each other in this specification.

Note that in this specification, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly includes the case where the angle is greater than or equal to 85° and less than or equal to 95°.

Note that the layout of circuit blocks in a drawing is the one for specifying the positional relationship in description. Thus, even when a drawing shows that different functions are achieved in different circuit blocks, an actual circuit or region may be configured so that the different functions are achieved in the same circuit block. Furthermore, the function of each circuit block in a drawing is specified for description. Thus, even when one circuit block is illustrated, an actual circuit or region may be configured so that processing which is illustrated as being performed in the one circuit block is performed in a plurality of circuit blocks.

(Embodiment 1)

In this embodiment, an example of the basic structure of a circuit of one embodiment of the present invention will be described.

FIG. 1 illustrates an example of a circuit 101. The circuit 101 has a function of storing data, for example. That is, the circuit 101 has a function of storing data of two or more levels (one bit or more). In other words, the circuit 101 has a function of a memory cell. For example, by providing a plurality of circuits 101 in a matrix, a memory device can be formed.

Next, an example of the circuit configuration of the circuit 101 will be described. The circuit 101 includes a transistor 107, for example. The circuit 101 includes a circuit 110, for example. Note that a plurality of circuits 110 may be provided in the circuit 101, or only one circuit 110 may be provided in the circuit 101. As an example, FIG. 1 illustrates an example of providing four circuits 110, that is, a circuit 110A, a circuit 110B, a circuit 110C, and a circuit 110D. The circuits 110 each include a terminal 112 connected to a gate of the transistor 107. That is, the circuit 110A includes a terminal 112A, the circuit 110B includes a terminal 112B, the circuit 110C includes a terminal 112C, and the circuit 110D includes a terminal 112D. The terminal 112A, the terminal 112B, the terminal 112C, and the terminal 112D are connected to the gate of the transistor 107. One of a source and a drain of the transistor 107 is connected to a wiring 103. The other of the source and the drain of the transistor 107 is connected to a wiring 105.

Next, an example of a function of the circuit 101 will be described. The circuit 110 (e.g., the circuit 110A, the circuit 110B, the circuit 110C, and the circuit 110D) has a function of storing data. For example, the circuit 110 (e.g., the circuit 110A, the circuit 110B, the circuit 110C, and the circuit 110D) has a function of storing two-level (one-bit) data or data of more than two levels (one bit). Accordingly, in the case where the circuit 101 includes a plurality of circuits 110, the circuit 101 can store data of four or more levels (two or more bits). That is, the circuit 101 can function as a multilevel memory cell. Note that in the case where the circuit 101 includes one circuit 110, the circuit 101 functions as a one-bit memory cell or a multilevel memory cell in accordance with the amount of data the circuit 110 can store.

The circuit 110 (e.g., the circuit 110A, the circuit 110B, the circuit 110C, and the circuit 110D) can output data to the transistor 107 through the terminal 112 (e.g., the terminal 112A, the terminal 112B, the terminal 112C, and the terminal 112D). The transistor 107 can output data through the wiring 103 and the wiring 105. That is, data can be read from the circuit 101 through the wiring 103 and the wiring 105. In other words, the wiring 103 and/or the wiring 105 have a function of a bit line.

In the case where a plurality of circuits 110 are provided, for example, in the case where the circuit 110A, the circuit 110B, the circuit 110C, and the circuit 110D are provided, data can be sequentially output from the circuits 110A to 110D to the transistor 107. Note that in the case where the circuit 110A, the circuit 110B, the circuit 110C, and the circuit 110D each store data of more than two levels (one bit), after all the data of more than two levels (one bit) in one of the circuits 110 (e.g., the circuit 110A) is output to the transistor 107, all the data of more than two levels (one bit) in the next circuit 110 (e.g., the circuit 110B) may be output to the transistor 107. Alternatively, after part of the data of more than two levels (one bit) in one of the circuits 110 (e.g., the circuit 110A) is output to the transistor 107, part of the data of more than two levels (one bit) in the next circuit 110 (e.g., the circuit 110B) may be output to the transistor 107; then another part of the data of more than two levels (one bit) in one of the circuits 110 (e.g., the circuit 110A) may be output to the transistor 107, and then another part of the data of more than two levels (one bit) in the next circuit 110 (e.g., the circuit 110B) may be output to the transistor 107. Alternatively, the data stored across the plurality of circuits 101 may be partly read from each of the plurality of circuits 101.

Figure 2:
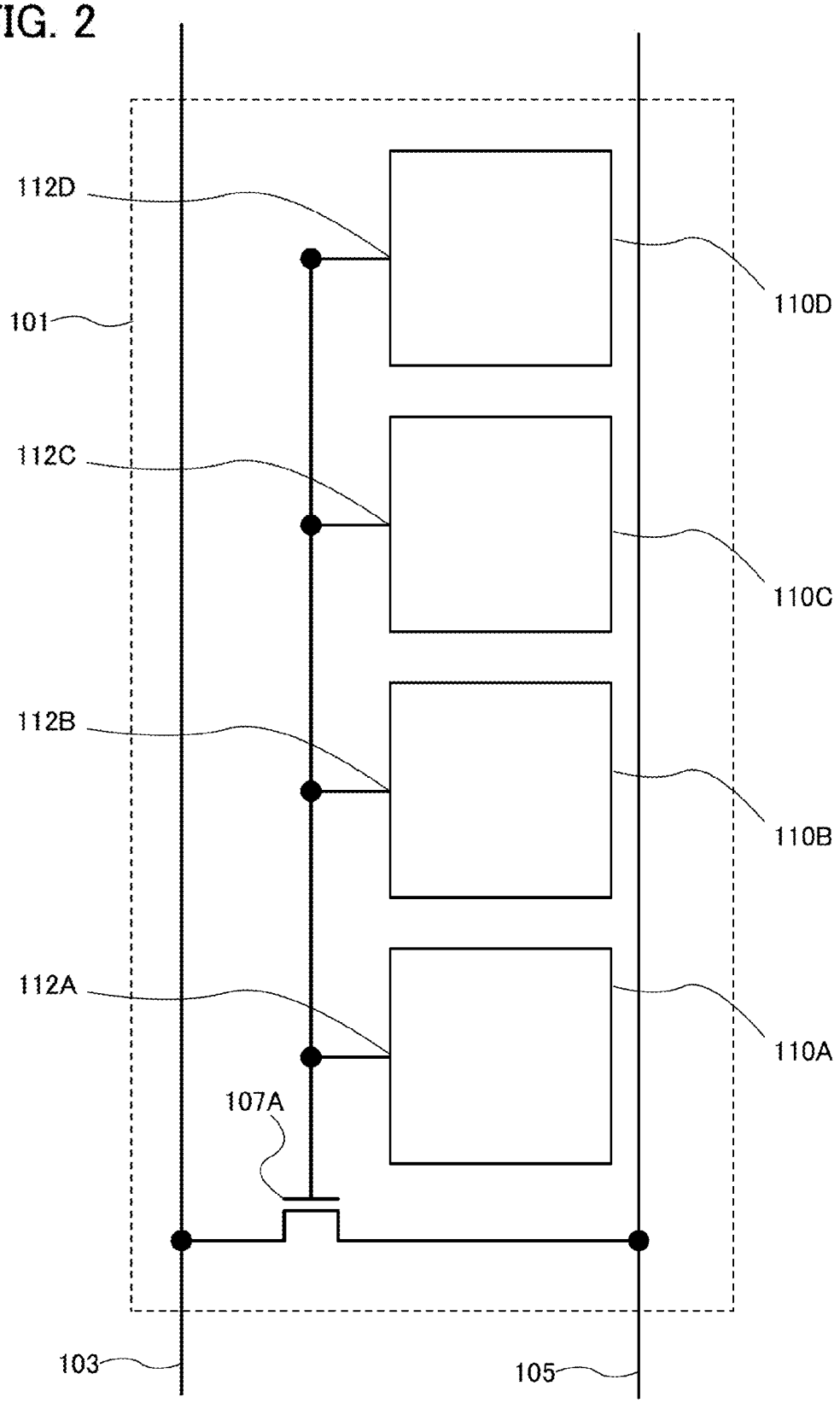
FIG. 2 is a circuit diagram of a semiconductor device according to one embodiment of the present invention.

Although the transistor 107 is a p-channel transistor in FIG. 1, one embodiment of the present invention is not limited to this example. FIG. 2 illustrates an example in which an n-channel transistor 107A is used. The transistor 107 can function as a switch, for example. Thus, the polarity of the transistor can be changed as appropriate. The voltage to the terminals may be adjusted in accordance with the polarity. Note that the polarity of transistors other than the transistor 107 can also be changed as appropriate.

Note that although the terminal 112 (e.g., the terminal 112A, the terminal 112B, the terminal 112C, and the terminal 112D) is connected to the gate of the transistor 107, another element may be further connected thereto. In the case of further connecting another element to the gate of the transistor 107, the potential of the gate of the transistor 107 can be controlled, for example.

Figure 3:
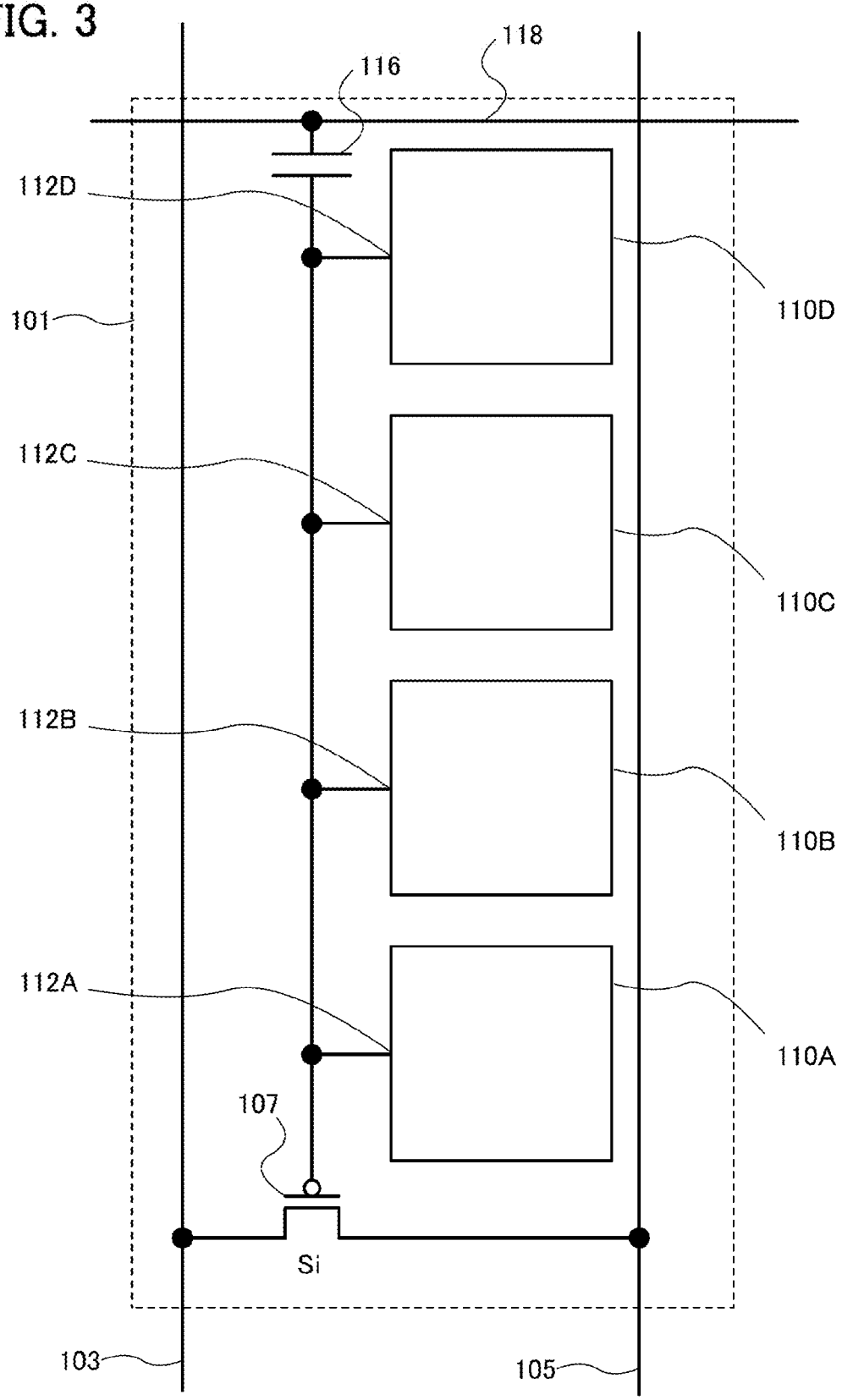
FIG. 3 is a circuit diagram of a semiconductor device according to one embodiment of the present invention.
Figure 4:
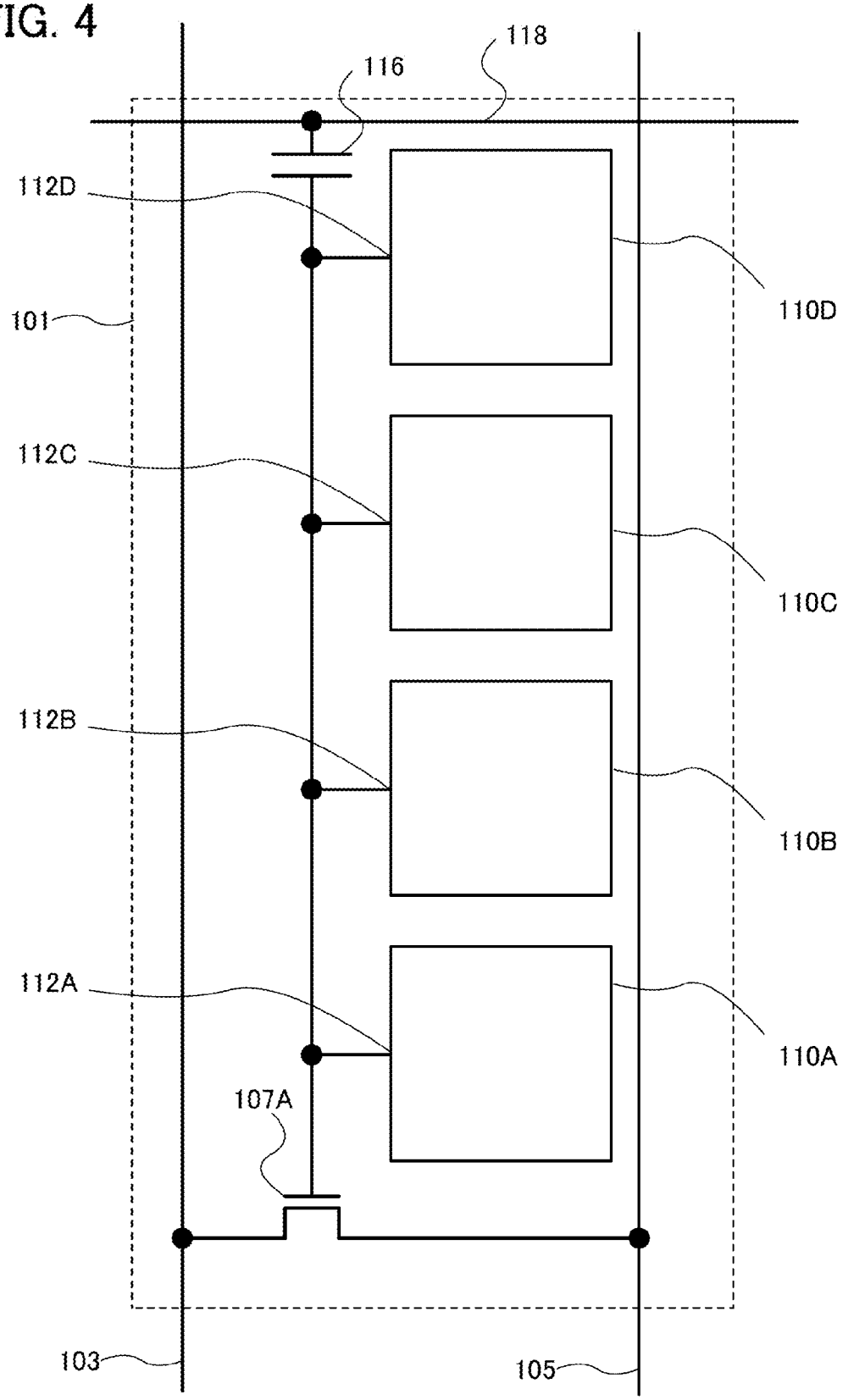
FIG. 4 is a circuit diagram of a semiconductor device according to one embodiment of the present invention.

FIG. 3 and FIG. 4 each illustrate an example in which a capacitor 116 is connected to the gate of the transistor 107. One terminal of the capacitor 116 is connected to the gate of the transistor 107, and the other terminal of the capacitor 116 is connected to a wiring 118.

The wiring 118 has a function of controlling the potential of the gate of the transistor 107 through the capacitor 116. That is, the wiring 118 has a function of controlling the potential of the gate of the transistor 107 by utilizing capacitive coupling of the capacitor 116. For example, in the case where the transistor 107 is of a p-channel type, increasing the potential of the wiring 118 increases the potential of the gate of the transistor 107 and can consequently turn off the transistor 107; decreasing the potential of the wiring 118 can turn on the transistor 107. In the case where the n-channel transistor 107A is used, the high/low relation of the potential of the wiring 118 is opposite. Upon detection of the ON state of the transistor 107, data stored in the circuit 101 can be output. Thus, the wiring 118 has a function of selecting the circuit 101. That is, the wiring 118 has a function of a word line. By controlling the potential of the wiring 118, a plurality of circuits 101 connected to the wiring 118, for example, the circuits 101 arranged in one row can be selected.

Note that not only in FIG. 1 and FIG. 2 but also in other diagrams, the capacitor 116 can be provided in a similar manner.

Figure 5:
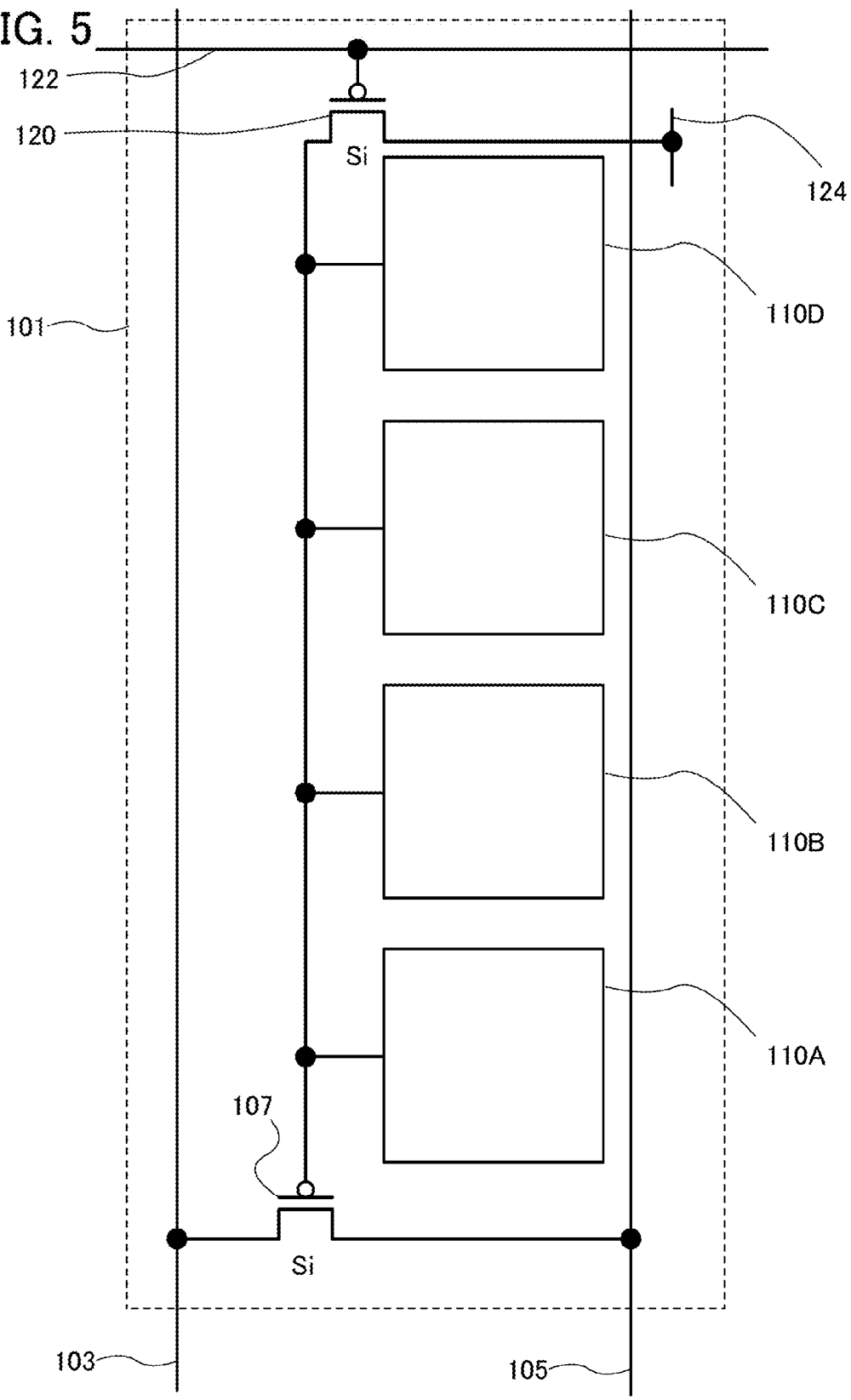
FIG. 5 is a circuit diagram of a semiconductor device according to one embodiment of the present invention.
Figure 6:
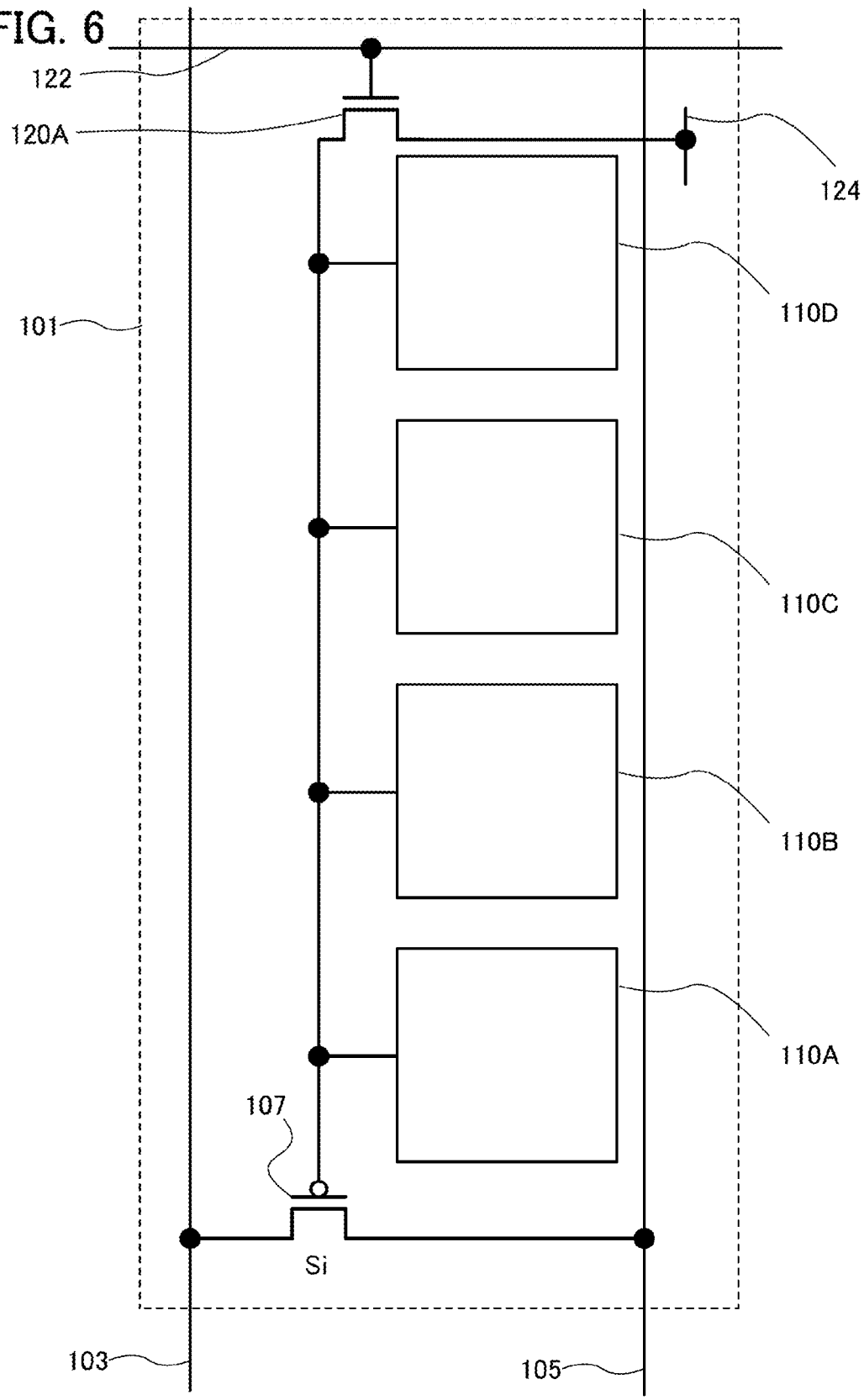
FIG. 6 is a circuit diagram of a semiconductor device according to one embodiment of the present invention.

Next, an example in which a transistor 120 is provided as an example of the element connected to the gate of the transistor 107 is illustrated in FIG. 5. The transistor 107 and the transistor 120 may have various polarities without being limited to p-channel polarity. FIG. 6 illustrates an example in which the transistor 120 is an n-channel transistor 120A. If the transistor 107 and the transistor 120 are both p-channel transistors, element isolation is not necessary in the case of using single crystal silicon, which allows a reduction in the layout area.

Figure 7:
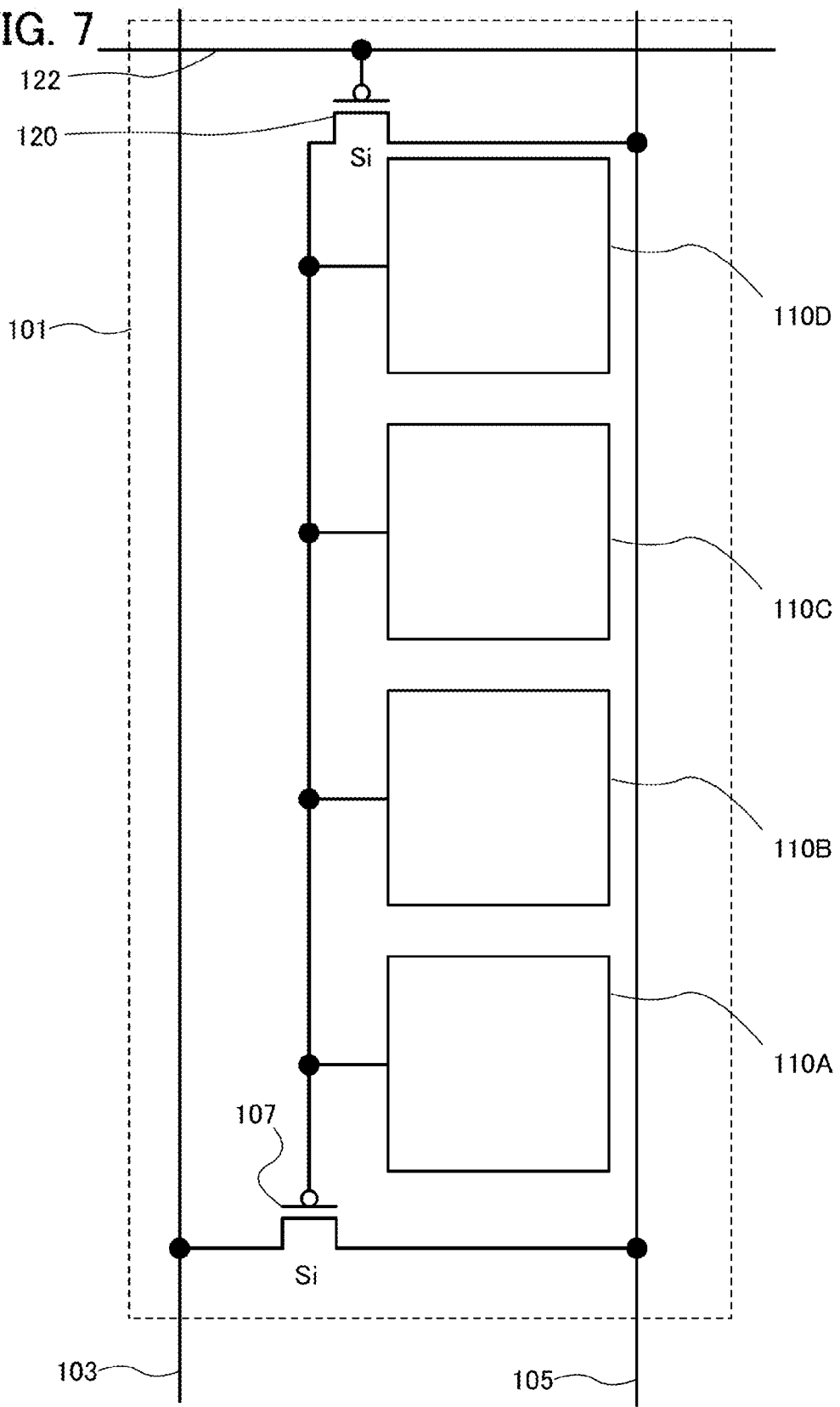
FIG. 7 is a circuit diagram of a semiconductor device according to one embodiment of the present invention.
Figure 8:
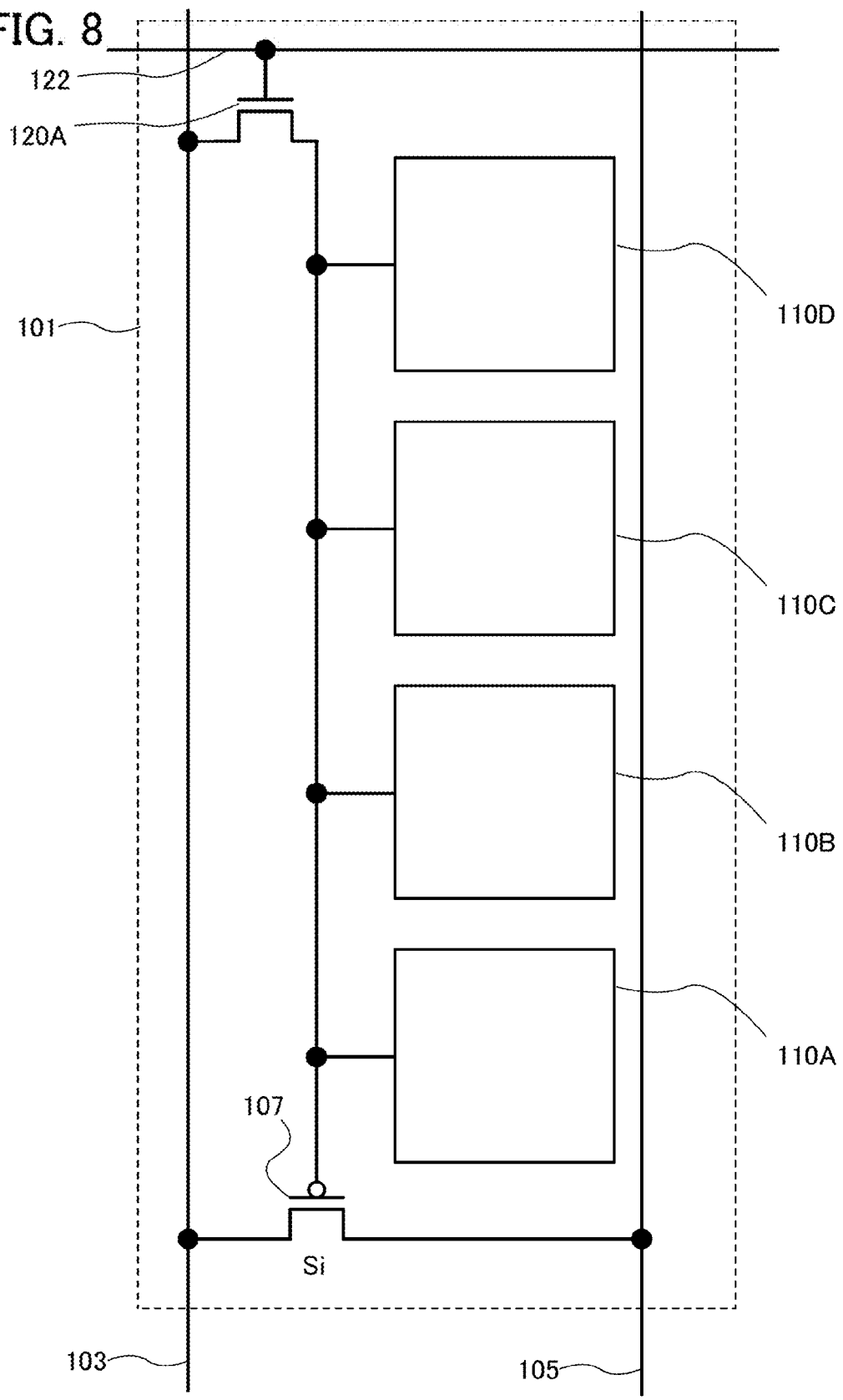
FIG. 8 is a circuit diagram of a semiconductor device according to one embodiment of the present invention.

One of a source and a drain of the transistor 120 is connected to the gate of the transistor 107. By controlling the potential of a wiring 122 connected to a gate of the transistor 120, a potential of the other of the source and the drain of the transistor 120 can be supplied to the gate of the transistor 107. That is, the transistor 120 can function as a switch. Note that the other of the source and the drain of the transistor 120 is connected to a wiring 124 in FIG. 5; however, one embodiment of the present invention is not limited to this example. The other of the source and the drain of the transistor 120 may be connected to a wiring other than the wiring 124, such as the wiring 105, the wiring 103, or the wiring 122, for example. Alternatively, the other of the source and the drain of the transistor 120 may be connected to a wiring included in the circuit 110 (e.g., the circuit 110A, the circuit 110B, the circuit 110C, and the circuit 110D). Examples of such cases are illustrated in FIG. 7 and FIG. 8. That is, as long as the potential of the gate of the transistor 107 can be adjusted to a predetermined potential when the transistor 120 is on, the wiring to which the other of the source and the drain of the transistor 120 is connected is not limited.

Here, the transistor 120 has a function of controlling the potential of the gate of the transistor 107. For example, with the transistor 120, the potential of the gate of the transistor 107 can be set to a predetermined potential, for example, a potential that makes the transistor 107 in an off state. Alternatively, in the case where a signal is output from the circuit 110 (e.g., the circuit 110A, the circuit 110B, the circuit 110C, or the circuit 110D) to the gate of the transistor 107, the transistor 120 can initialize the potential of the gate of the transistor 107 to a predetermined potential before the output of the signal. Thus, the transistor 120 has a function of initializing the potential of the gate of the transistor 107 or a function of making the circuit 101 in an unselected state.

Figure 9:
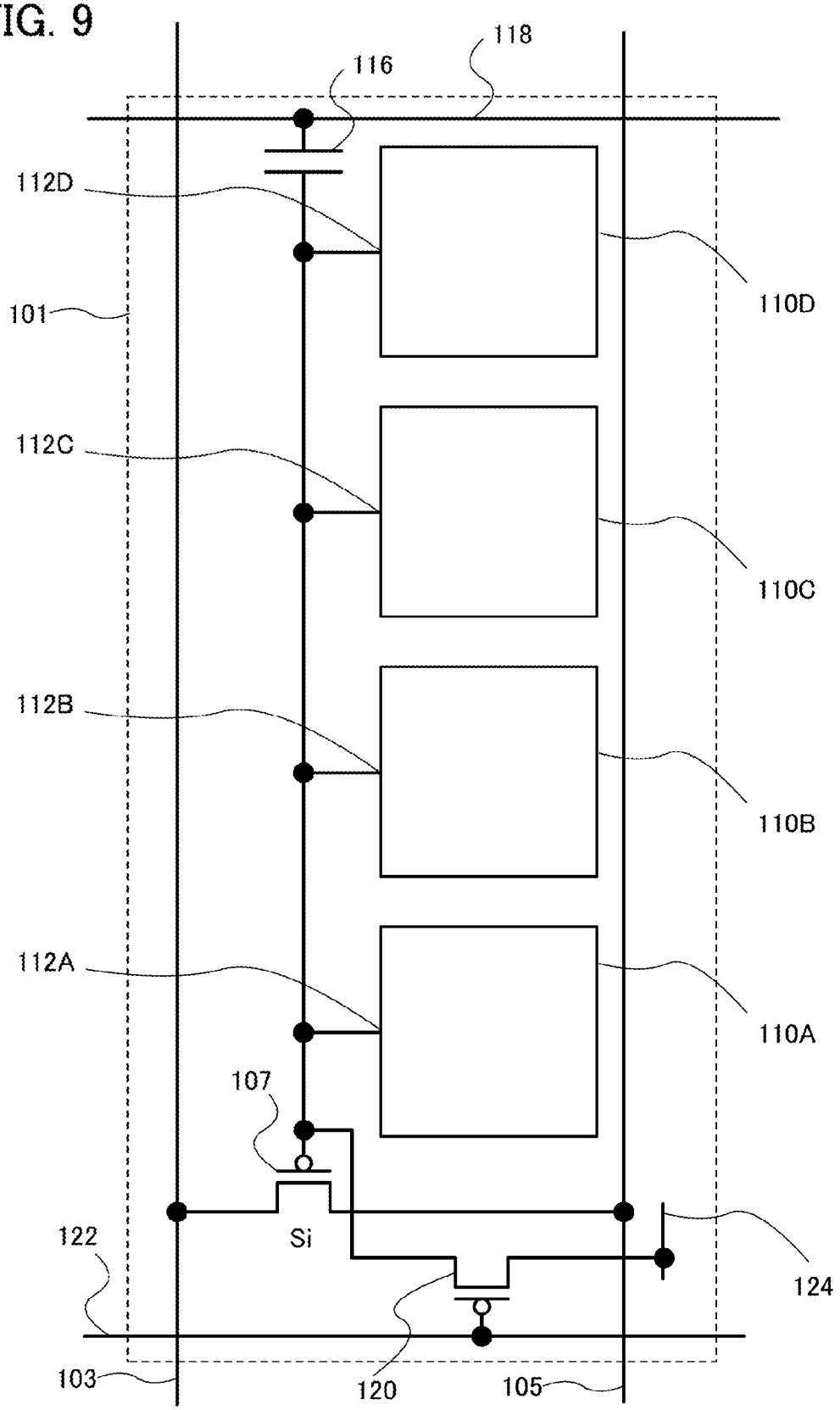
FIG. 9 is a circuit diagram of a semiconductor device according to one embodiment of the present invention.
Figure 10:
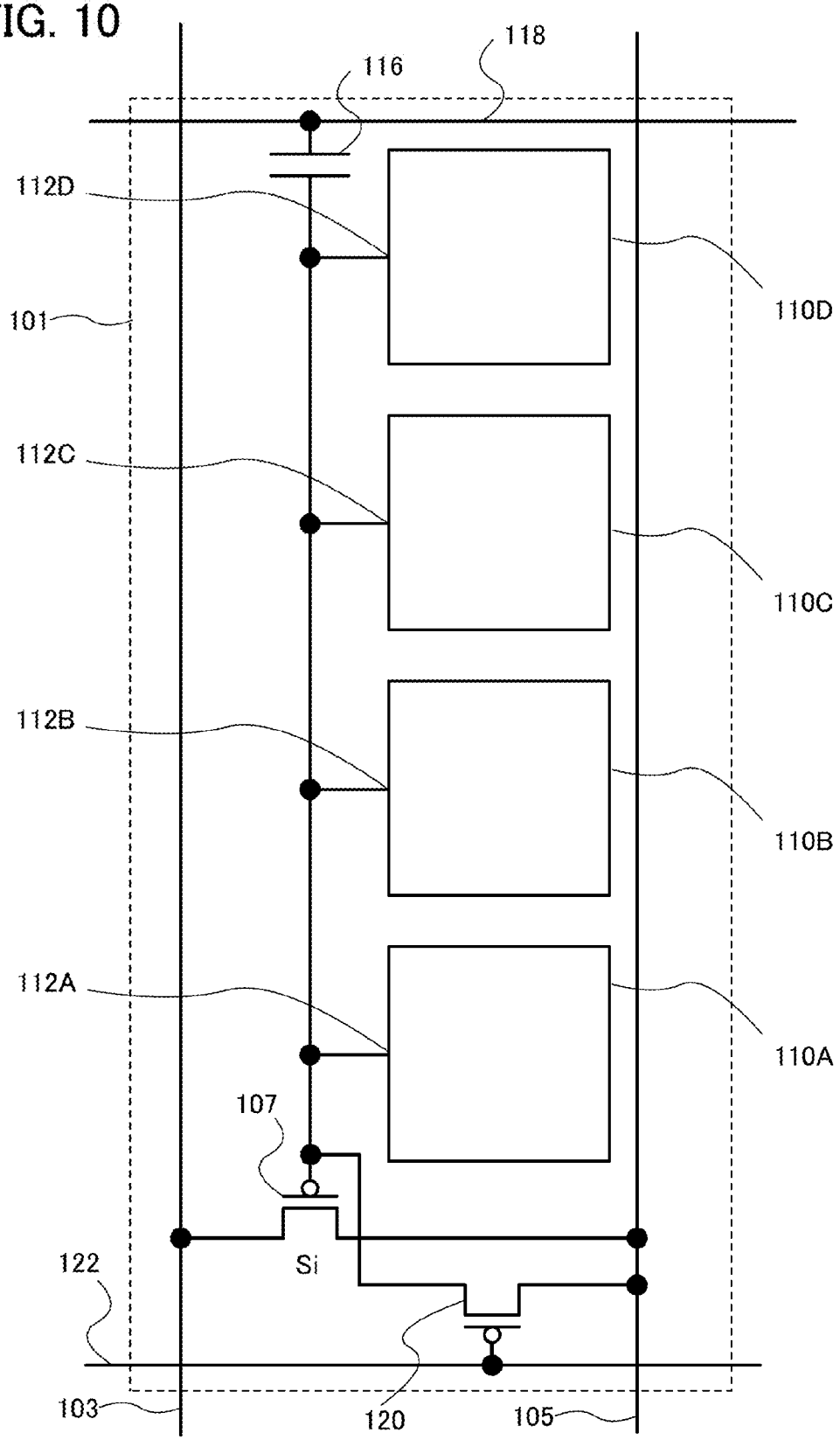
FIG. 10 is a circuit diagram of a semiconductor device according to one embodiment of the present invention.
Figure 11:
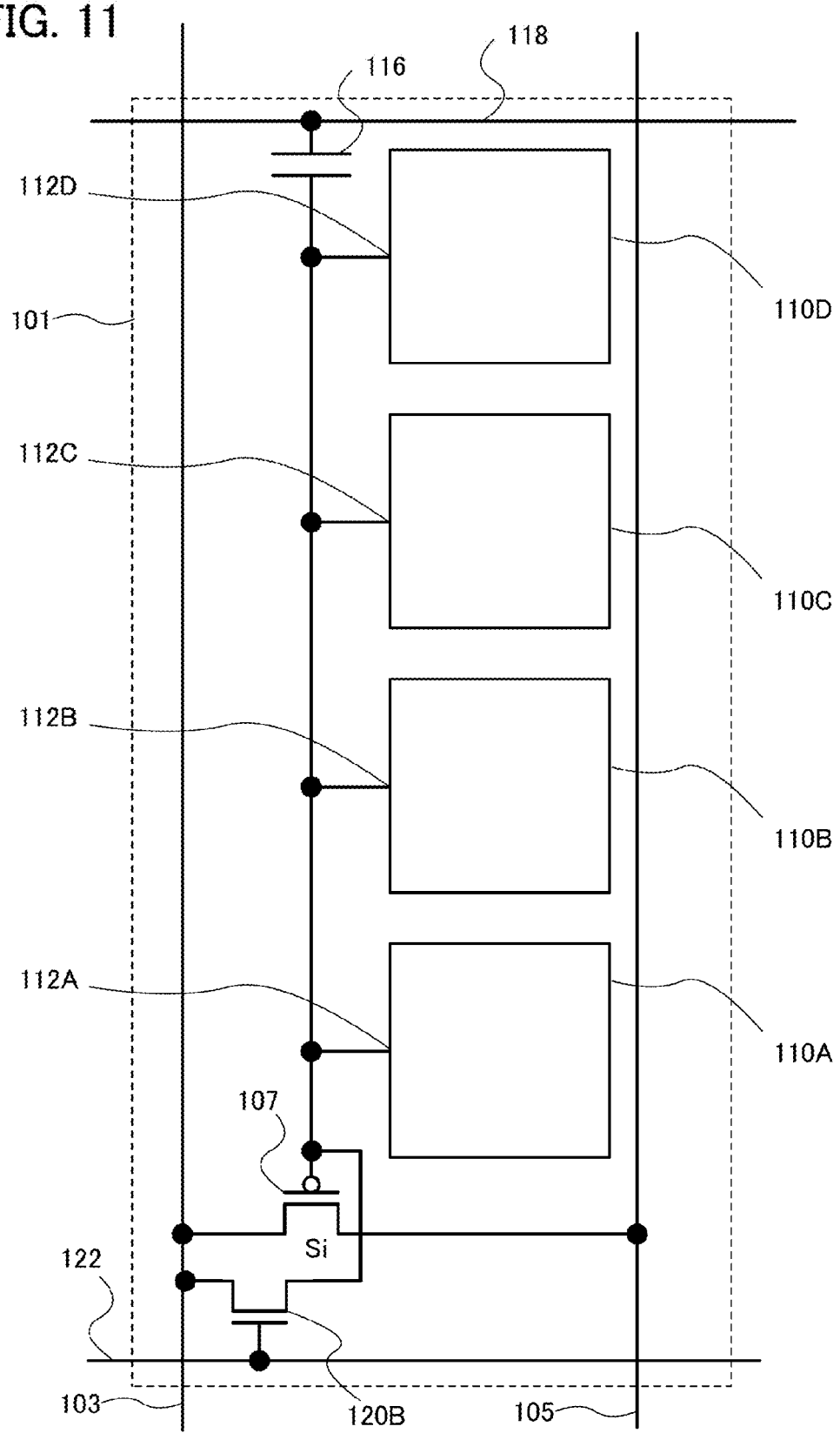
FIG. 11 is a circuit diagram of a semiconductor device according to one embodiment of the present invention.

Note that not only in FIG. 1 and FIG. 2 but also in other diagrams, the transistor 120 can be provided in a similar manner. For example, the transistor 120 can be provided in FIG. 3, FIG. 4, and the like. Examples of such cases are illustrated in FIG. 9, FIG. 10, and FIG. 11.

Note that in the case where the circuit 110 (e.g., the circuit 110A, the circuit 110B, the circuit 110C, and the circuit 110D) can store data of more than two levels (one bit), the data preferably has, for example, levels of the power of two, that is, the value that can be counted in bits, for the easiness of signal processing. However, one embodiment of the present invention is not limited to this example, and the data may have an arbitrary value.

Specifically, the circuit 110 can store (hold) 4-level (2-bit) data, 16-level (4-bit) data, 64-level (6-bit) data, 256-level (8-bit) data, or 1024-level (10-bit) data. For example, in the case where two circuits 110 (the circuit 110A and the circuit 110B) are provided in the circuit 101, when the circuit 110A and the circuit 110B each hold two states, the circuit 101 can store data of 4 levels (2 levels×2 levels; corresponding to 2 bits). For example, when the circuit 110A and the circuit 110B each hold 4 states, the circuit 101 can store data of 16 levels (4 levels×4 levels; corresponding to 4 bits). For example, when the circuit 110A and the circuit 110B each hold 8 states, the circuit 101 can store data of 64 levels (8 levels×8 levels; corresponding to 6 bits). For example, when the circuit 110A and the circuit 110B each hold 16 states, the circuit 101 can store data of 256 levels (16 levels×16 levels; corresponding to 8 bits). For example, when the circuit 110A and the circuit 110B each hold 32 states, the circuit 101 can store data of 1024 levels (32 levels×32 levels; corresponding to 10 bits). In this way, the number of levels of data the circuit 101 can store is the product of the numbers of levels the circuits 110 can hold; accordingly, the memory density can be improved.

The amount of stored data is not limited to the above numbers, and a variety of states can be stored (held). For example, in the case where four circuits 110 (the circuit 110A, the circuit 110B, the circuit 110C, and the circuit 110D) are provided in the circuit 101, when the circuit 110A, the circuit 110B, the circuit 110C, and the circuit 110D hold k1 states, k2 states, k3 states, and k4 states, respectively, k1×k2×k3×k4-level data can be stored. Furthermore, part of the states can be used for parity check or error correction. In such a case, the amount of data the circuit 101 can store is less than k1×k2×k3×k4 levels.

Note that a transistor included in the circuit 101 or a transistor included in the circuit 110 (e.g., the circuit 110A, the circuit 110B, the circuit 110C, and the circuit 110D) can function as a switch, for example.

In this specification and the like, any of a variety of switches can be used as a switch, for example. That is, the switch has a function of determining whether current flows or not by being turning on or off (being brought into an on state or an off state). Alternatively, the switch has a function of selecting and changing a current path. For example, the switch has a function of determining whether current can flow through a path 1 or a path 2 and switching the paths. For example, an electrical switch, a mechanical switch, or the like can be used as a switch. That is, any element can be used as a switch as long as it can control current, without limitation to a certain element. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), a logic circuit in which such elements are combined, or the like can be used as a switch. An example of a mechanical switch is a switch formed using a micro electro mechanical system (MEMS) technology, such as a digital micromirror device (DMD). Such a switch includes an electrode which can be moved mechanically, and operates by controlling conduction and non-conduction in accordance with movement of the electrode.

In the case where a transistor is used as a switch, the polarity (conductivity type) of the transistor is not particularly limited to a certain type because it operates just as a switch. However, a transistor of polarity with smaller off-current is preferably used when off-current is to be suppressed. Examples of a transistor with smaller off-state current are a transistor provided with an LDD region, a transistor with a multi-gate structure, and the like.

Note that in the case of using a transistor as a switch, an n-channel transistor is preferably used as the switch when the potential of a source of the transistor which operates as the switch is close to a potential of a low-potential-side power supply (e.g., Vss, GND, or 0 V). A p-channel transistor is preferably used as the switch when the potential of the source is close to a potential of a high-potential-side power supply (e.g., Vdd). This is because the absolute value of the gate-source voltage can be increased when the potential of a source of the n-channel transistor is close to the potential of a low-potential-side power supply or when the potential of a source of the p-channel transistor is close to the potential of a high-potential-side power supply, so that the transistor can more accurately operate as a switch. This is also because the transistor does not often perform source follower operation, so that the decrease in output voltage does not often occur.

Note that a CMOS switch including both n-channel and p-channel transistors may be employed as a switch. The use of a CMOS switch as a switch allows more accurate operation of the switch because a current can flow when either the p-channel transistor or the n-channel transistor is turned on. Thus, a voltage can be appropriately output regardless of whether the voltage of an input signal to the switch is high or low. Alternatively, the voltage amplitude of a signal for turning on or off the switch can be made small, so that power consumption can be reduced.

Note that when a transistor is used as a switch, the switch includes an input terminal (one of a source and a drain), an output terminal (the other of the source and the drain), and a terminal for controlling conduction (a gate) in some cases. When a diode is used as a switch, the switch does not have a terminal for controlling conduction in some cases. Therefore, when a diode is used as a switch, the number of wirings for controlling terminals can be small as compared with the case of using a transistor as a switch.

In this specification and the like, for example, transistors with a variety of structures can be used as a transistor, without limitation to a certain type. For example, a transistor including a single crystal silicon or a non-single-crystal semiconductor film typified by amorphous silicon, polycrystalline silicon, microcrystalline (also referred to as microcrystal, nanocrystal, or semi-amorphous) silicon, or the like can be used as a transistor. Alternatively, a thin film transistor (TFT) whose semiconductor film is thinned can be used. In the case of using the TFT, there are various advantages. For example, since the TFT can be formed at temperature lower than that of the case of using single crystal silicon, manufacturing cost can be reduced or a manufacturing apparatus can be made larger. Since the manufacturing apparatus can be made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Alternatively, transmission of light in a display element can be controlled by using the transistor formed using the light-transmitting substrate. Alternatively, part of a film included in the transistor can transmit light because of a small thickness of the transistor. Therefore, the aperture ratio can be improved.

Note that when a catalyst (e.g., nickel) is used in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and a signal processing circuit (e.g., a signal generation circuit, a gamma correction circuit, or a DA converter circuit) can be formed using the same substrate.

Note that when a catalyst (e.g., nickel) is used in the case of forming microcrystalline silicon, crystallinity can be further improved and a transistor having excellent electric characteristics can be formed. In that case, crystallinity can be improved by just performing heat treatment without performing laser irradiation. Accordingly, a gate driver circuit (e.g., a scan line driver circuit) and part of a source driver circuit (e.g., an analog switch) can be formed over the same substrate. Note that when laser irradiation for crystallization is not performed, unevenness in crystallinity of silicon can be suppressed. Therefore, high-quality images can be displayed. Note that it is possible to form polycrystalline silicon or microcrystalline silicon without a catalyst (e.g., nickel).

Note that although the crystallinity of silicon is preferably improved to polycrystal, microcrystal, or the like in the whole panel, the present invention is not limited to this. The crystallinity of silicon may be improved only in part of the panel. Selective increase in crystallinity can be achieved by selective laser irradiation or the like. For example, only a peripheral circuit region excluding pixels may be irradiated with laser light. Alternatively, only a region of a gate driver circuit, a source driver circuit, or the like may be irradiated with laser light. Alternatively, only part of a source driver circuit (e.g., an analog switch) may be irradiated with laser light. Accordingly, the crystallinity of silicon can be improved only in a region in which a circuit needs to be operated at high speed. Because a pixel region is not particularly needed to be operated at high speed, even if crystallinity is not improved, the pixel circuit can be operated without any problem. Thus, a region whose crystallinity is improved is small, so that manufacturing steps can be decreased. This can increase throughput and reduce manufacturing cost. Alternatively, since the number of necessary manufacturing apparatus is small, manufacturing cost can be reduced.

Examples of the transistor include a transistor including a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) and a thin film transistor including a thin film of such a compound semiconductor or an oxide semiconductor. Because manufacturing temperature can be lowered, such a transistor can be formed at room temperature, for example. The transistor can thus be formed directly on a substrate having low heat resistance, such as a plastic substrate or a film substrate. Note that such a compound semiconductor or an oxide semiconductor can be used not only for a channel portion of the transistor but also for other applications. For example, such a compound semiconductor or an oxide semiconductor can be used for a wiring, a resistor, a pixel electrode, a light-transmitting electrode, or the like. Such an element can be formed at the same time as the transistor; thus, cost can be reduced.

Note that for example, a transistor formed by an ink-jet method or a printing method can be used as a transistor. Accordingly, such a transistor can be formed at room temperature, can be formed at a low vacuum, or can be formed using a large substrate. Thus, the transistor can be formed without using a mask (reticle), which enables the layout of the transistor to be easily changed. Alternatively, the transistor can be formed without using a resist, leading to reductions in material cost and the number of steps. Further, a film can be formed only in a portion where the film is needed, a material is not wasted as compared with the case of employing a manufacturing method by which etching is performed after the film is formed over the entire surface, so that the cost can be reduced.

Note that for example, a transistor including an organic semiconductor or a carbon nanotube can be used as a transistor. Thus, such a transistor can be formed over a flexible substrate. A device including a transistor which includes an organic semiconductor or a carbon nanotube can resist a shock.

Note that transistors with a variety of different structures can be used for a transistor. For example, a MOS transistor, a junction transistor, a bipolar transistor, or the like can be used as a transistor. By using a MOS transistor as a transistor, the size of the transistor can be reduced. Thus, a plurality of transistors can be mounted. By using a bipolar transistor as a transistor, a large amount of current can flow. Thus, a circuit can be operated at high speed. Note that a MOS transistor and a bipolar transistor may be formed over one substrate, in which case reductions in power consumption and size, high-speed operation, and the like can be achieved.

Note that in this specification and the like, for example, a transistor with a multi-gate structure having two or more gate electrodes can be used as a transistor. With the multi-gate structure, a structure where a plurality of transistors are connected in series is provided because channel regions are connected in series. Thus, with the multi-gate structure, the amount of off-state current can be reduced and the withstand voltage of the transistor can be increased (reliability can be improved). Alternatively, with the multi-gate structure, the drain-source current does not change so much even if the drain-source voltage fluctuates when the transistor operates in a saturation region, so that a flat slope of the voltage-current characteristics can be obtained. By utilizing the flat slope of the voltage-current characteristics, an ideal current source circuit or an active load having extremely high resistance can be obtained. Accordingly, a differential circuit, a current mirror circuit, or the like having excellent properties can be obtained.

Note that a transistor with a structure where gate electrodes are formed above and below a channel can be used, for example. With the structure where gate electrodes are formed above and below a channel, a circuit structure where a plurality of transistors are connected in parallel is provided. Thus, a channel region is increased, so that the amount of current can be increased. Alternatively, by using the structure where gate electrodes are formed above and below a channel, a depletion layer can be easily formed, resulting in lower subthreshold swing.

Note that for example, a transistor with a structure where a gate electrode is formed above a channel region, a structure where a gate electrode is formed below a channel region, a staggered structure, an inverted staggered structure, a structure where a channel region is divided into a plurality of regions, a structure where channel regions are connected in parallel or in series, or the like can be used as a transistor. A transistor with any of a variety of structures such as a planar type, a FIN-type, a Tri-Gate type, a top-gate type, a bottom-gate type, and a double-gate type (with gates above and below a channel) can be used.

Note that for example, a transistor with a structure where a source electrode or a drain electrode overlaps with a channel region (or part of it) can be used as a transistor. By using the structure where a source electrode or a drain electrode overlaps with a channel region (or part of it), unstable operation due to accumulation of electric charge in part of the channel region can be prevented.

Note that for example, a transistor with a structure where an LDD region is provided can be used as a transistor. Provision of the LDD region enables a reduction in off-current or an increase in the withstand voltage of the transistor (an improvement in reliability). Alternatively, by providing the LDD region, the drain current does not change so much even when the drain-source voltage fluctuates when the transistor operates in a saturation region, so that a flat slope of the voltage-current characteristics can be obtained.

Note that in this specification and the like, a transistor can be formed using any of a variety of substrates, for example. The type of a substrate is not limited to a certain type. Examples of the substrate are a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate are a barium borosilicate glass substrate, an aluminoborosilicate glass substrate, and a soda lime glass substrate. Examples of the flexible substrate, the attachment film, and the base material film are plastics typified by polyethylene terephthalate (PET), polyethylene naphthalate (PEN), and polyether sulfone (PES), a synthetic resin of acrylic or the like, polypropylene, polyester, polyvinyl fluoride, polyvinyl chloride, polyamide, polyimide, aramid, epoxy, an inorganic vapor deposition film, paper, and the like. Specifically, when a transistor is formed using a semiconductor substrate, a single crystal substrate, an SOI substrate, or the like, the transistor can have few variations in characteristics, size, shape, or the like, high current supply capability, and a small size. By forming a circuit with the use of such a transistor, power consumption of the circuit can be reduced or the circuit can be highly integrated.

A flexible substrate may be used as the substrate, and the transistor may be provided directly on the flexible substrate. Moreover, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

That is, a transistor may be formed using a substrate, and then, the transistor may be transferred to another substrate. Example of a substrate to which a transistor is transferred are, in addition to the above substrate over which the transistor can be formed, a paper substrate, a cellophane substrate, an aramid substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. The use of such a substrate enables formation of a transistor with excellent properties, a transistor with low power consumption, or a device with high durability, high heat resistance, or a reduction in weight or thickness.

Note that all the circuits which are necessary to realize a predetermined function can be formed using one substrate (e.g., a glass substrate, a plastic substrate, a single crystal substrate, or an SOI substrate). In this manner, the cost can be reduced by a reduction in the number of components or reliability can be improved by a reduction in the number of connection points to circuit components.

Note that not all the circuits which are necessary to realize the predetermined function are needed to be formed using one substrate. That is, part of the circuits which are necessary to realize the predetermined function may be formed using a substrate and another part of the circuits which are necessary to realize the predetermined function may be formed using another substrate. For example, part of the circuits which are necessary to realize the predetermined function can be formed using a glass substrate and another part of the circuits which are necessary to realize the predetermined function can be formed using a single crystal substrate (or an SOI substrate). The single crystal substrate over which the another part of the circuits which are necessary to realize the predetermined function (such a substrate is also referred to as an IC chip) can be connected to the glass substrate by COG (chip on glass), and the IC chip can be provided over the glass substrate. Alternatively, the IC chip can be connected to the glass substrate by TAB (tape automated bonding), COF (chip on film), SMT (surface mount technology), a printed circuit board, or the like. When part of the circuits is formed over the same substrate as a pixel portion in this manner, the cost can be reduced by a reduction in the number of components or reliability can be improved by a reduction in the number of connection points between circuit components. In particular, a circuit in a portion where a driving voltage is high, a circuit in a portion where a driving frequency is high, or the like consumes much power in many cases. In view of the above, such a circuit is formed over a substrate (e.g., a single crystal substrate) different from a substrate over which a pixel portion is formed, whereby an IC chip is formed. The use of this IC chip allows prevention of increase in power consumption.

For example, in this specification and the like, a transistor is an element having at least three terminals: a gate, a drain, and a source. The transistor includes a channel region between the drain (a drain terminal, a drain region, or a drain electrode) and the source (a source terminal, a source region, or a source electrode), and a current can flow through the drain, the channel region, and the source. Here, since the source and the drain of the transistor change depending on the structure, the operating condition, or the like of the transistor, it is difficult to define which is a source or a drain. Therefore, a portion functioning as a source or a drain is not called a source or a drain in some cases. In that case, for example, one of the source and the drain is referred to as a first terminal, a first electrode, or a first region, and the other of the source and the drain is referred to as a second terminal, a second electrode, or a second region in some cases.

Note that a transistor may be an element having at least three terminals of a base, an emitter, and a collector. In that case also, one of the emitter and the collector is referred to as a first terminal, a first electrode, or a first region, and the other of the emitter and the collector is referred to as a second terminal, a second electrode, or a second region in some cases. Note that in the case where a bipolar transistor is used as a transistor, a gate can be rephrased as a base.

For example, in this specification and the like, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings or texts, without limiting to a predetermined connection relation, for example, the connection relation shown in the drawings or the texts.

Here, X and Y each denote an object (e.g., a device, an element, a circuit, a wiring, an electrode, a terminal, a conductive film, a layer, or the like).

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be turned on or off. That is, a switch is conducting or not conducting (is turned on or off) to determine whether current flows therethrough or not. Alternatively, the switch has a function of selecting and changing a current path.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit, and a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. When a signal output from X is transmitted to Y, it can be said that X and Y are functionally connected even if another circuit is provided between X and Y.

Note that an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, the explicit description "X and Y are electrically connected" is the same as the description "X and Y are connected".

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, each of X, Y, Z1, and Z2 denotes an object (e.g., a device, an element, a circuit, a wiring, an electrode, a terminal, a conductive film, a layer, or the like).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

An example of a basic principle has been described in this embodiment. Thus, part or the whole of this embodiment can be freely combined with, applied to, or replaced with part or the whole of another embodiment.

(Embodiment 2)

In this embodiment, an example of a method for driving the circuits 101 in Embodiment 1 will be described.

First, an example of a driving method in FIG. 1 will be described. The circuits 101 in other drawings can be driven in a similar manner.

Figure 12A:
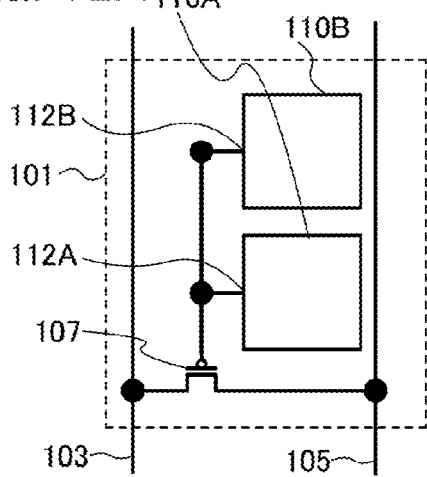
FIGS. 12A to 12F illustrate an operation of a semiconductor device according to one embodiment of the present invention.

FIG. 12A illustrates an example in which two circuits 110 (the circuit 110A and the circuit 110B) are provided in the circuit 101. Even if the number of circuits 110 is changed, a similar operation is possible.

First, an example of a driving method in FIG. 12A in the case of outputting a signal from the circuit 101 to the outside by utilizing the wiring 103 and the wiring 105, that is, in the case of reading data of the circuit 101, is illustrated in FIGS. 12B to 12F, FIGS. 13A and 13B, and the like. Note that in the drawings, "x" is put on the transistor in an off state, as an example. Furthermore, arrows in the drawings show the path of current, the place where the potential is changed, or the like, as an example.

Figure 12B:
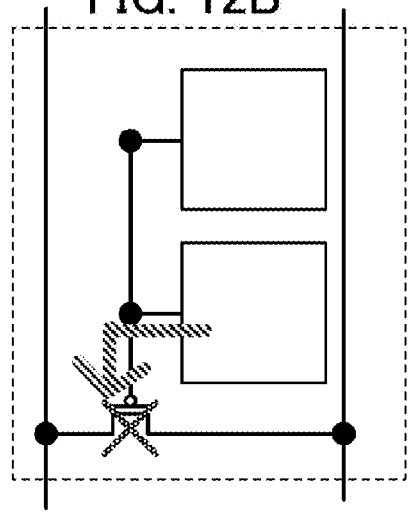

First, initialization is performed. As illustrated in FIG. 12B, a potential that turns off the transistor 107 is output from the circuit 110A, so that the potential of the gate of the transistor 107 is initialized. In the case where the transistor 107 is of a p-channel type, a high-potential power supply voltage (VDD) is output, for example. In the case where the transistor 107 is of an n-channel type, a low-potential power supply voltage is output.

Note that in the initialization, in the case where the transistor 107 is a transistor including single crystal silicon in its channel region, the high-potential power supply voltage (VDD) is, for example, 5 V or lower, preferably 3 V or lower, and further preferably 1.5 V or lower. With the value in this range, problems are unlikely to occur in the transistor 107. Note that one embodiment of the present invention is not limited to this example.

Alternatively, another circuit such as the circuit 110B may output a potential to initialize the potential of the gate of the transistor 107. Alternatively, the potential of the gate of the transistor 107 may be initialized by utilizing another circuit or another element.

In the case where the transistor 107 is already off, initialization is not necessarily performed.

Figure 12C:
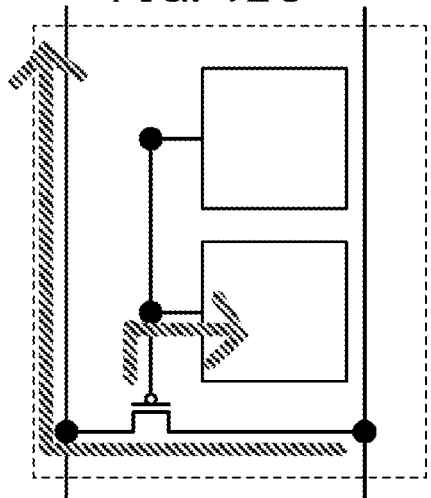
Figure 12D:
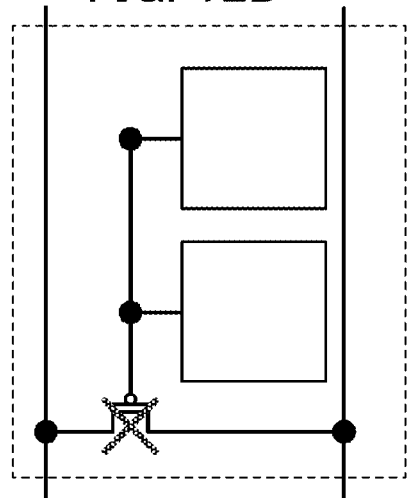

Next, an output operation of a signal from the circuit 110A to the gate of the transistor 107 and an output operation of the signal from the circuit 101 (reading of the signal stored in the circuit 101) are performed. For example, as illustrated in FIGS. 12C and 12D, the signal is output from the circuit 110A to the gate of the transistor 107. FIGS. 12C and 12D illustrate examples in which different signals are output. The signal output from the circuit 110A is a signal corresponding to the data stored in the circuit 110A. Thus, not outputting the signal to the gate of the transistor 107 in FIG. 12D can be regarded as outputting the data stored in the circuit 110A to the transistor 107.

Then, in the case where the signal output from the circuit 110A to the gate of the transistor 107 is an L signal (e.g., a low-potential power supply voltage (VSS) or a ground voltage (VGND)), the transistor 107 is turned on as illustrated in FIG. 12C; as a result, electrical continuity between the wiring 105 and the wiring 103 is established. For example, if a high-potential power supply voltage (VDD) is supplied to the wiring 105, current is supplied from the wiring 105 through the transistor 107 to the wiring 103, so that the potential of the wiring 103 is increased. A circuit having a function of reading a signal, for example, a sense amplifier circuit or the like, is connected to the wiring 103, and the sense amplifier circuit or the like can read the potential of the wiring 103, that is, the signal output from the circuit 101.

In contrast, in the case where an H signal (e.g., a high-potential power supply voltage (VDD)) is output from the circuit 110A or in the case where a signal is not output from the circuit 110A, the transistor 107 remains off as illustrated in FIG. 12D; as a result, electrical discontinuity between the wiring 105 and the wiring 103 is kept. Then, the potential of the wiring 103, that is, the signal from the circuit 101 is read by a sense amplifier circuit or the like.

By the above-described operation, the data stored in the circuit 110A can be read. In other words, data stored in the circuit 101 can be output therefrom.

Note that in the case where data of more than two levels (one bit) is stored in the circuit 110A, that is, in the case where multilevel data is stored, the operation of FIG. 12B and FIG. 12C or the operation of FIG. 12B and FIG. 12D may be repeated a plurality of times in accordance with the value, to read in which case the transistor 107 is on and in which case the transistor 107 is off. In this manner, multi-level data can be output from the circuit 101.

Alternatively, multilevel data may be output from the circuit 101 in the following manner: a ramp-wave signal, a sawtooth-wave signal, or the like is supplied to the circuit 110A, in which case the transistor 107 remains off until a certain state comes and it is read that the transistor 107 turns on when the certain state comes. That is, multilevel data can be read by reading which value is stored in the circuit 110A from the potential of the ramp-wave signal or the sawtooth-wave signal or the like supplied to the circuit 110A. In this case also, the potential of the gate of the transistor 107 may be initialized as in FIG. 12B in the middle of the process of changing the ramp-wave signal, the sawtooth-wave signal, or the like.

In the above-described manner, the operation for the circuit 110A is finished. Then, an operation similar to that for the circuit 110A is performed on a different circuit 110 (e.g., the circuit 110B). By way of caution, the operation is briefly described below.

Figure 12E:
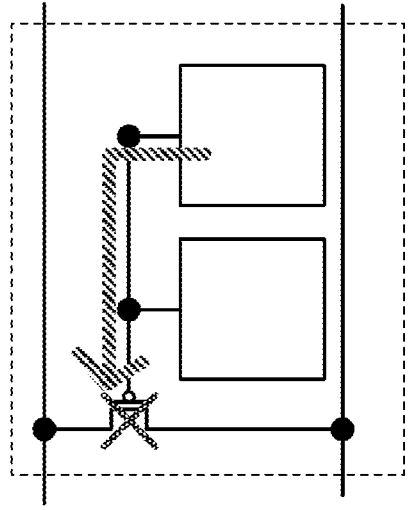

First, the transistor 107 is initialized as illustrated in FIG. 12E. FIG. 12E corresponds to FIG. 12B.

Figure 12F:
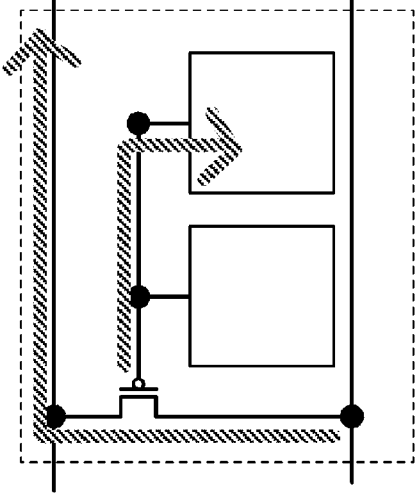
Figure 13A:
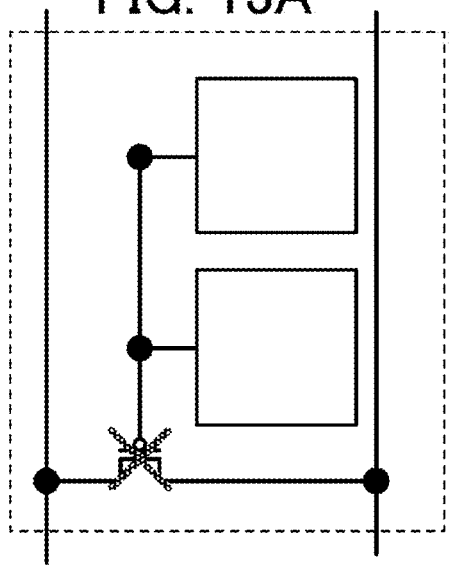
FIGS. 13A to 13C illustrate an operation of a semiconductor device according to one embodiment of the present invention.

Then, as illustrated in FIG. 12F or FIG. 13A, a signal is output from the circuit 110B to the gate of the transistor 107. FIG. 12F corresponds to FIG. 12C, and FIG. 13A corresponds to FIG. 12D. Then, the signal is output from the circuit 101. Thus, the operation for the circuit 110B is finished.

In the case where another circuit 110 is further provided, a similar operation is repeated.

Finally, the potential of the gate of the transistor 107 is initialized to turn off the transistor 107. The initialization may be performed by a method similar to that in FIG. 12B or FIG. 12E.

Figure 13B:
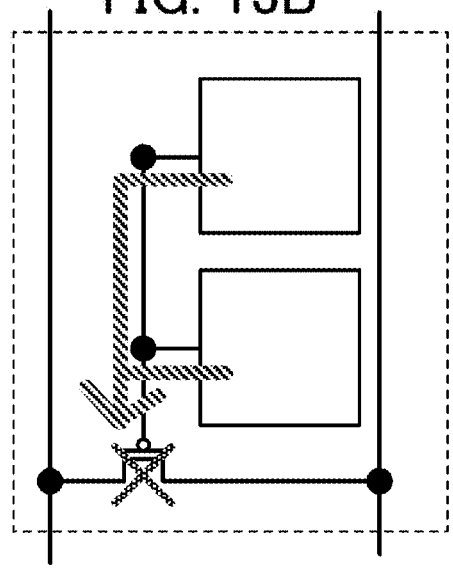

In the case of initializing the potential of the gate of the transistor 107, signals may be output from a plurality of circuits 110 as illustrated in FIG. 13B.

Figure 13C:
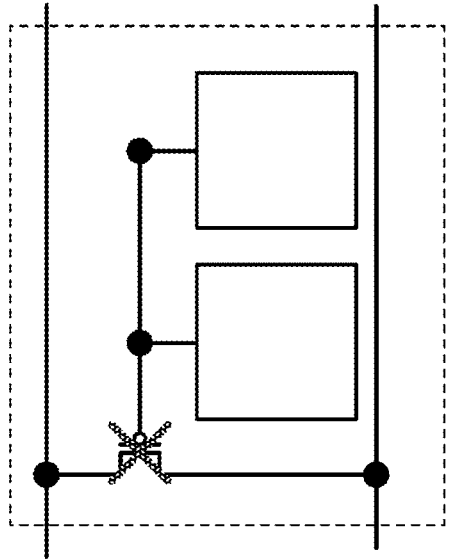

By the above-described operation, reading of the signal from the circuit 101 is finished. Then, as illustrated in FIG. 13C, the transistor 107 keeps an off state. In other words, this operation makes the circuit 101 in an unselected state. Next, if the circuit 101 is provided in a different row, reading of a signal or the like is performed there similarly.

Although an example of a driving method in the case of FIG. 1 is illustrated in FIGS. 12A to 12F and FIGS. 13A to 13C, driving is possible similarly in other drawings.

Figure 14A:
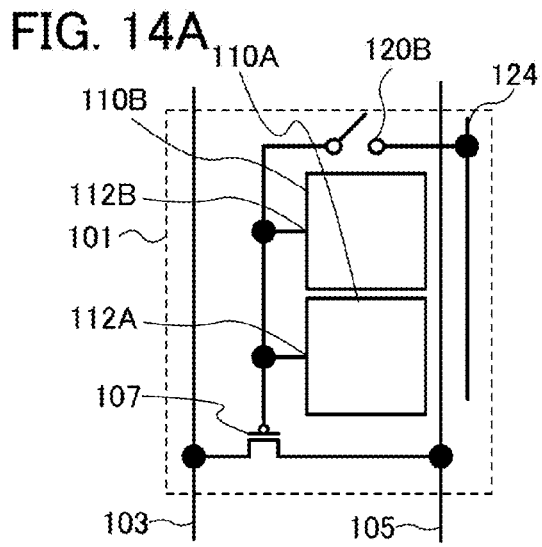
FIGS. 14A to 14F illustrate an operation of a semiconductor device according to one embodiment of the present invention.

For example, an example of a driving method in the case of FIG. 5 or FIG. 6 will be described below using the configuration illustrated in FIG. 14A. In FIG. 14A, a switch 120B is used as the transistor 120 or the transistor 120A. The on/off of the switch 120B can be controlled by controlling the potential of the wiring 122, for example.

First, FIG. 14A corresponds to the structure of FIG. 12A to which the switch 120B is added. Accordingly, in FIG. 14A, the potential of the gate of the transistor 107 can be initialized by controlling the conduction state of the switch 120B. The other operation is mostly similar to that in the case of FIG. 12A.

Figure 14B:
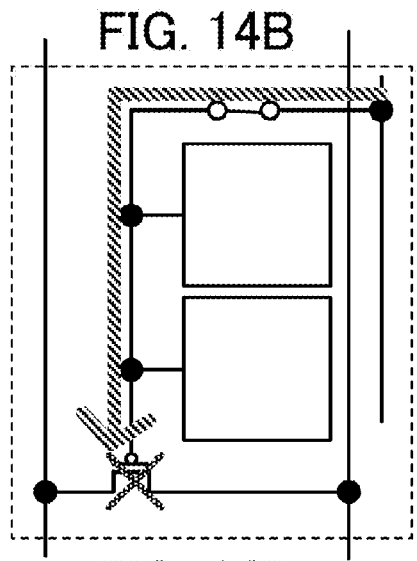

FIG. 14B corresponds to FIG. 12B. In FIG. 14B, the potential of the gate of the transistor 107 can be initialized through the switch 120B. In the case where the transistor 107 is of a p-channel type, a high-potential power supply voltage (VDD) can be supplied from the wiring 124, for example. In the case where the transistor 107 is of an n-channel type, a low-potential power supply voltage can be supplied.

Figure 14C:
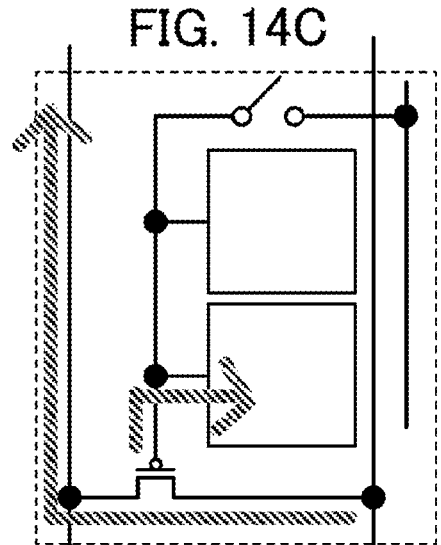
Figure 14D:
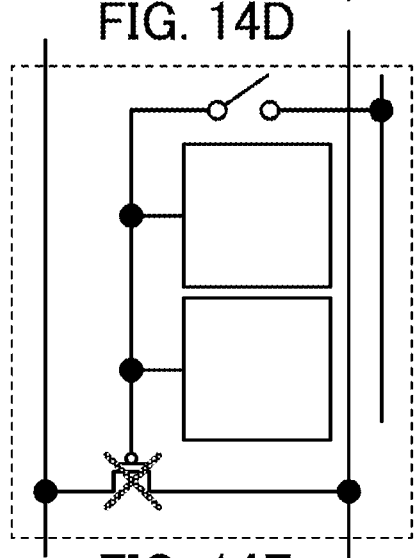
Figure 14E:
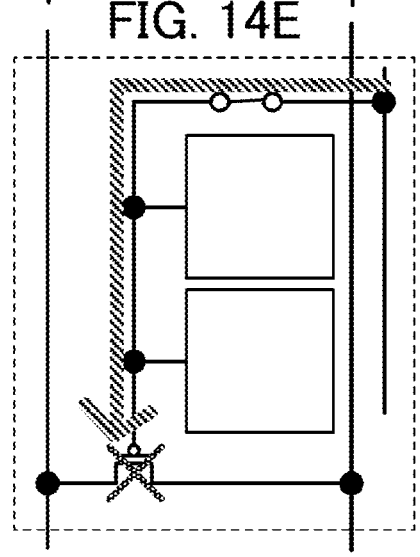
Figure 14F:
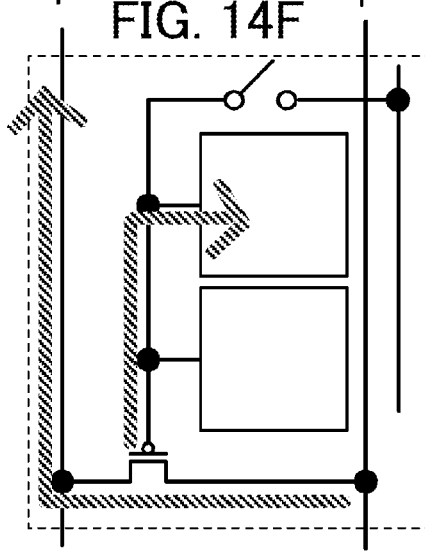
Figure 15A:
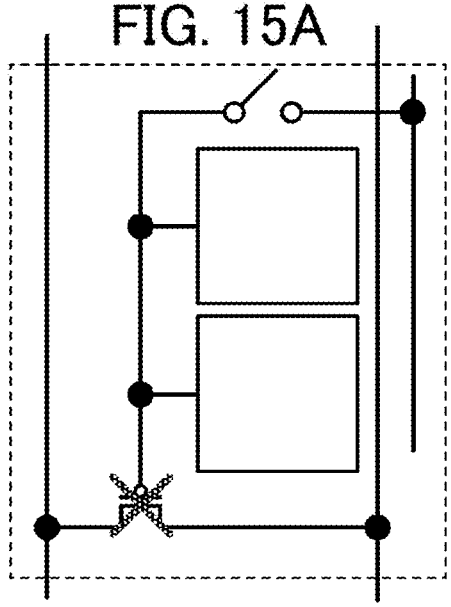
FIGS. 15A to 15C illustrate an operation of a semiconductor device according to one embodiment of the present invention.
Figure 15B:
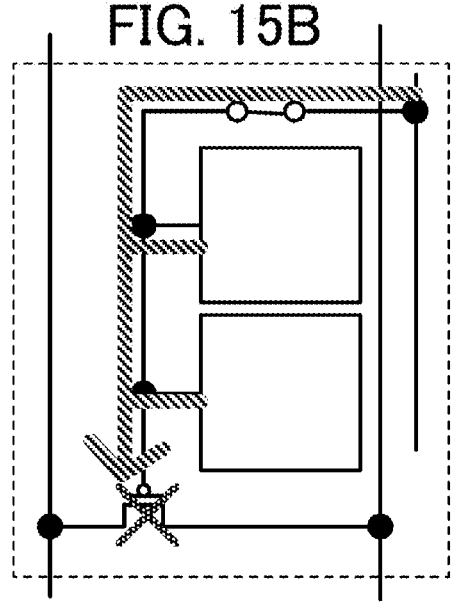
Figure 15C:
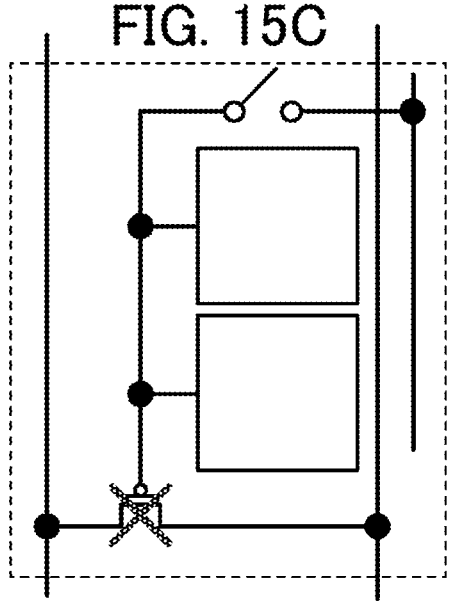

Moreover, FIG. 14C corresponds to FIG. 12C. FIG. 14D corresponds to FIG. 12D. FIG. 14E corresponds to FIG. 12E. FIG. 14F corresponds to FIG. 12F. FIG. 15A corresponds to FIG. 13A. FIG. 15B corresponds to FIG. 13B. FIG. 15C corresponds to FIG. 13C.

Driving can be similarly performed in not only FIG. 5 and FIG. 6 but also FIG. 7, FIG. 8, and the like.

Next, as another example, an example of a driving method in the case of FIG. 3 will be described below using the configuration illustrated in FIG. 16A.

First, initialization is performed. As illustrated in FIG. 16B, a potential that turns off the transistor 107 is output from the circuit 110A, so that the potential of the gate of the transistor 107 is initialized. In the case where the transistor 107 is of a p-channel type, a high-potential power supply voltage (VDD) is output, for example. In the case where the transistor 107 is of an n-channel type, a low-potential power supply voltage is output.

At this time, the wiring 118 is set at a potential that turns off the transistor 107, that is, a potential that makes the circuit 101 in an unselected state. In the case where the transistor 107 is of a p-channel type, the potential of the wiring 118 is set at a high-potential power supply voltage (VDD), for example. In the case where the transistor 107 is of an n-channel type, the potential of the wiring 118 is set at a low-potential power supply voltage.

Note that in the initialization, in the case where the transistor 107 is a transistor including single crystal silicon in its channel region, the high-potential power supply voltage (VDD) is, for example, 5 V or lower, preferably 3 V or lower, and further preferably 1.5 V or lower. With the value in this range, problems are unlikely to occur in the transistor 107. Note that one embodiment of the present invention is not limited to this example.

Alternatively, another circuit such as the circuit 110B may output a potential to initialize the potential of the gate of the transistor 107. Alternatively, the potential of the gate of the transistor 107 may be initialized by utilizing another circuit or another element.

In the case where the transistor 107 is already off, initialization is not necessarily performed.

Note that the description for FIG. 16B corresponds to the description for FIG. 12B.

Next, an output operation of a signal from the circuit 110A to the gate of the transistor 107 is performed. For example, as illustrated in FIGS. 16C and 16D, the signal is output from the circuit 110A to the gate of the transistor 107. FIGS. 16C and 16D illustrate examples in which different signals are output. The signal output from the circuit 110A is a signal corresponding to the data stored in the circuit 110A. Thus, not outputting the signal to the gate of the transistor 107 in FIG. 16D can be regarded as outputting the data stored in the circuit 110A to the transistor 107.

Next, an output operation of the signal from the circuit 101 (reading of the signal) is performed. The potential of the wiring 118 is controlled so as to make the transistor 107 in an on state depending on the signal output from the circuit 101 by utilizing capacitive coupling of the capacitor 116. In other words, the circuit 101 is selected by this operation. For example, in the case where the transistor 107 is of a p-channel type, the potential of the wiring 118 is set at a low-potential power supply voltage (VSS) or a ground voltage (VGND), for example.

Figure 16A:
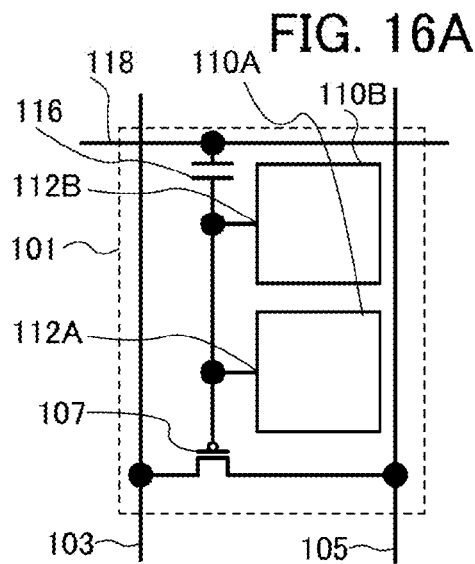
FIGS. 16A to 16F illustrate an operation of a semiconductor device according to one embodiment of the present invention.
Figure 16B:
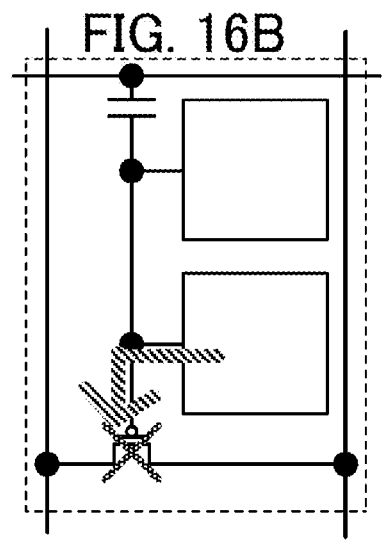
Figure 16C:
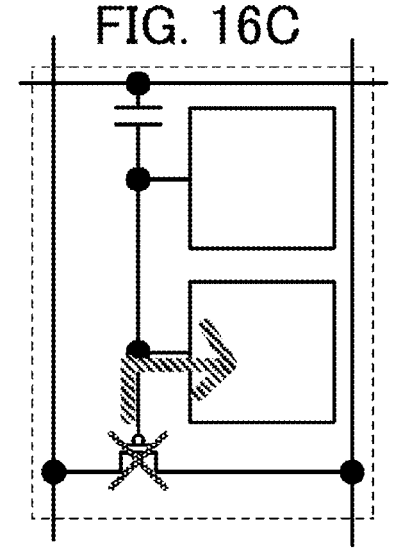
Figure 16D:
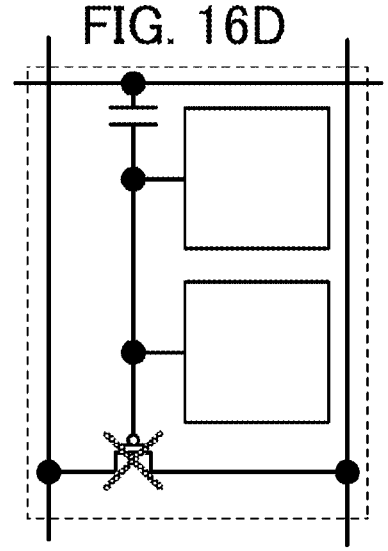
Figure 16E:
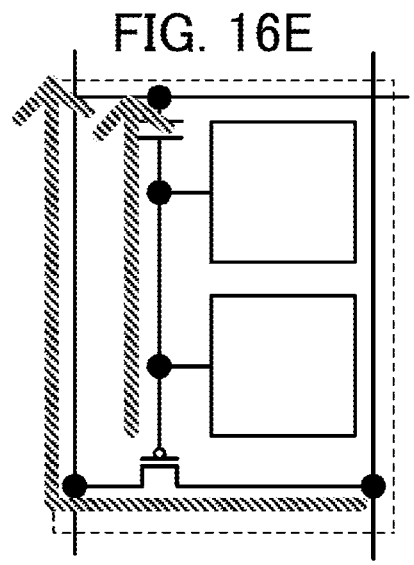

Then, in the case where the signal output from the circuit 110A to the gate of the transistor 107 is an H signal (e.g., a high-potential power supply voltage (VDD)), the transistor 107 is turned on as illustrated in FIG. 16E owing to the potential of the wiring 118; as a result, electrical continuity between the wiring 105 and the wiring 103 is established. For example, if a high-potential power supply voltage (VDD) is supplied to the wiring 105, current is supplied from the wiring 105 through the transistor 107 to the wiring 103, so that the potential of the wiring 103 is increased. A circuit having a function of reading a signal, for example, a sense amplifier circuit or the like, is connected to the wiring 103, and the sense amplifier circuit or the like can read the potential of the wiring 103, that is, the signal output from the circuit 101.

Figure 16F:
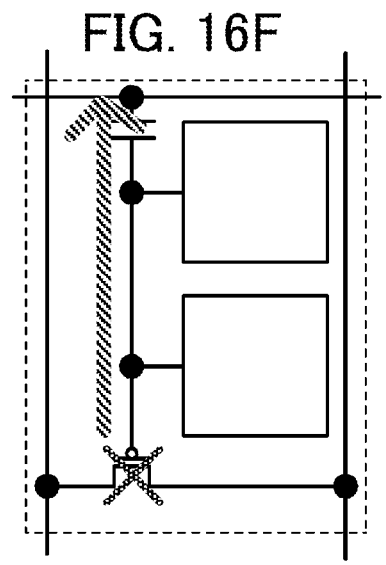

In contrast, in the case where an HH signal (e.g., a potential higher than a high-potential power supply voltage (VDD); referred to as VDDH, for example) is output from the circuit 110A or in the case where a signal is not output from the circuit 110A, the transistor 107 remains off as illustrated in FIG. 16F; as a result, electrical discontinuity between the wiring 105 and the wiring 103 is kept. Then, the potential of the wiring 103, that is, the signal from the circuit 101 is read by a sense amplifier circuit or the like.

By the above-described operation, the data stored in the circuit 110A can be read. In other words, data stored in the circuit 101 can be output therefrom.

Note that in the case where data of more than two levels (one bit) is stored in the circuit 110A, that is, in the case where multilevel data is stored, the operation of FIG. 16B, FIG. 16C, and FIG. 16E or the operation of FIG. 16B, FIG. 16D, and FIG. 16F may be repeated a plurality of times in accordance with the value, to read in which case the transistor 107 is on and in which case the transistor 107 is off. In this manner, multilevel data can be output from the circuit 101.

Alternatively, multilevel data may be output from the circuit 101 in the following manner: a ramp-wave signal, a sawtooth-wave signal, or the like is supplied to the circuit 110A, in which case the transistor 107 remains off until a certain state comes and it is read that the transistor 107 turns on when the certain state comes. That is, multilevel data can be read by reading which value is stored in the circuit 110A from the potential of the ramp-wave signal or the sawtooth-wave signal or the like supplied to the circuit 110A. In this case also, the potential of the gate of the transistor 107 may be initialized in a manner similar to that of the operation illustrated in FIG. 12B in the middle of the process of changing the ramp-wave signal, the sawtooth-wave signal, or the like.

Figure 17A:
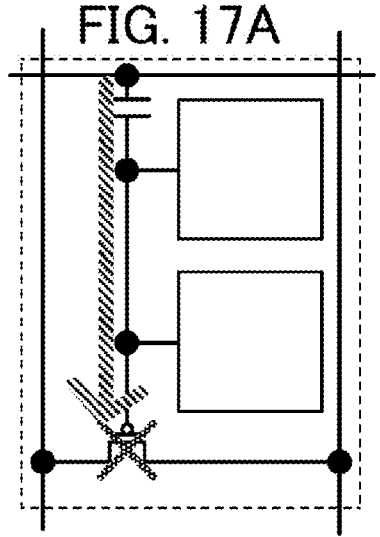
FIGS. 17A to 17F illustrate an operation of a semiconductor device according to one embodiment of the present invention.

Finally, the potential of the wiring 118 is set back to a potential that turns off the transistor 107 as illustrated in FIG. 17A, so that the transistor 107 is turned off.

In the above-described manner, the operation for the circuit 110A is finished. Then, an operation similar to that for the circuit 110A is performed on a different circuit 110 (e.g., the circuit 110B). By way of caution, the operation is briefly described below.

Figure 17B:
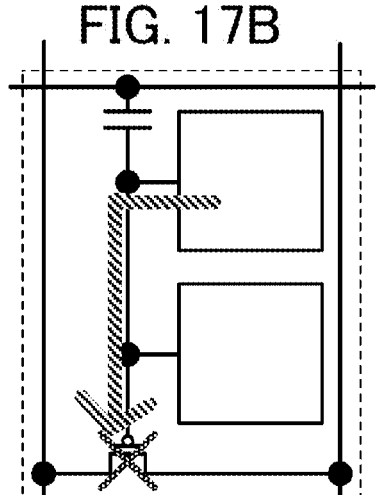

First, the transistor 107 is initialized as illustrated in FIG. 17B. FIG. 17B corresponds to FIG. 16B.

Figure 17C:
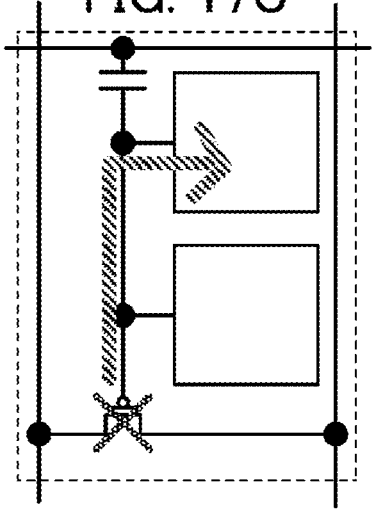
Figure 17D:
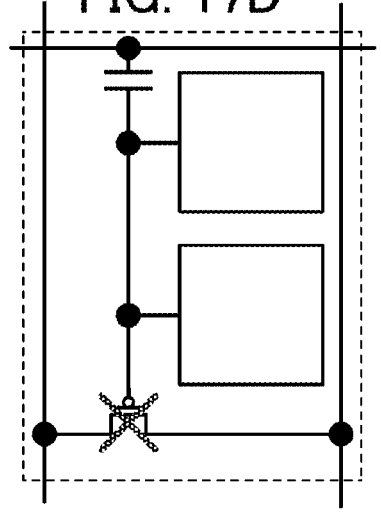

Then, as illustrated in FIG. 17C or FIG. 17D, a signal is output from the circuit 110B to the gate of the transistor 107. FIG. 17C corresponds to FIG. 16C, and FIG. 17D corresponds to FIG. 16D.

Figure 17E:
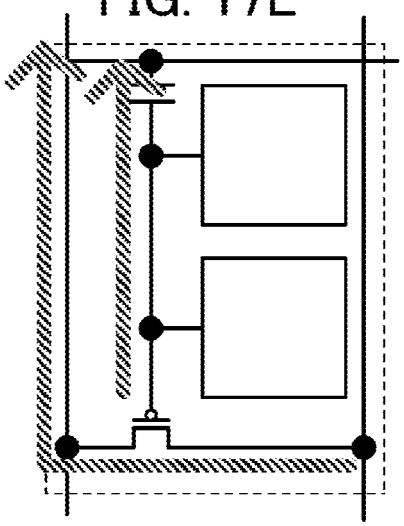
Figure 17F:
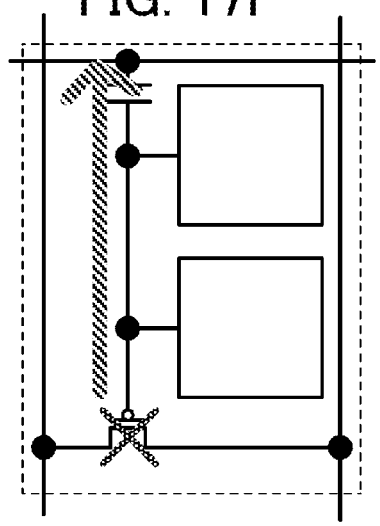

Then, as illustrated in FIG. 17E or FIG. 17F, the potential of the wiring 118 is controlled to output a signal from the circuit 101. FIG. 17E corresponds to FIG. 16E, and FIG. 17F corresponds to FIG. 16F.

Finally, the potential of the wiring 118 is set back to a potential that turns off the transistor 107 as illustrated in FIG. 18A, so that the transistor 107 is turned off. FIG. 18A corresponds to FIG. 17A.

Thus, the operation for the circuit 110B is finished.

In the case where another circuit 110 is further provided, a similar operation is repeated.

Finally, the potential of the gate of the transistor 107 is initialized to turn off the transistor 107. The initialization may be performed by a method similar to that in FIG. 16B or FIG. 17B.

In the case of initializing the potential of the gate of the transistor 107, signals may be output from a plurality of circuits 110 as illustrated in FIG. 18B.

Since the transistor 107 is in an off state by the control of the potential of the wiring 118, initialization is not necessarily performed.

By the above-described operation, reading of the signal from the circuit 101 is finished. Then, as illustrated in FIG. 18C, the transistor 107 keeps an off state. Next, if the circuit 101 is provided in a different row, reading of a signal or the like is performed there similarly.

Although an example of a driving method in the case of FIG. 3 is illustrated in FIGS. 16A to 16F, FIGS. 17A to 17F, and FIGS. 18A to 18C, driving is possible similarly in other drawings.

For example, an example of a driving method in the case of FIG. 9 will be described below using the configuration illustrated in FIG. 19A. In FIG. 19A, the switch 120B is used as the transistor 120. The on/off of the switch 120B can be controlled by controlling the potential of the wiring 122, for example.

First, FIG. 19A corresponds to the structure of FIG. 16A to which the switch 120B is added. Accordingly, in FIG. 19A, the potential of the gate of the transistor 107 can be initialized by controlling the conduction state of the switch 120B. The other operation is mostly similar to that in the case of FIG. 16A.

FIG. 19B corresponds to FIG. 16B. In FIG. 19B, the potential of the gate of the transistor 107 can be initialized through the switch 120B. In the case where the transistor 107 is of a p-channel type, a high-potential power supply voltage (VDD) can be supplied from the wiring 124, for example. In the case where the transistor 107 is of an n-channel type, a low-potential power supply voltage can be supplied.

Figure 20A:
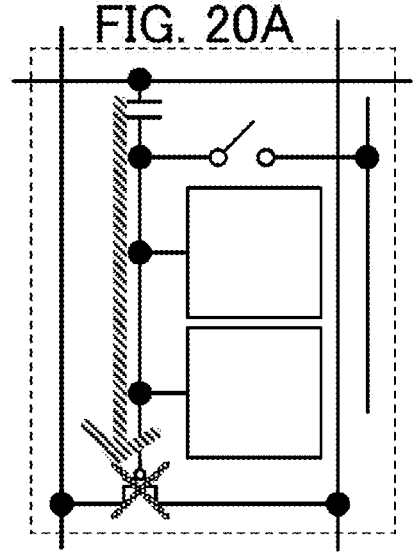
FIGS. 20A to 20F illustrate an operation of a semiconductor device according to one embodiment of the present invention.
Figure 20B:
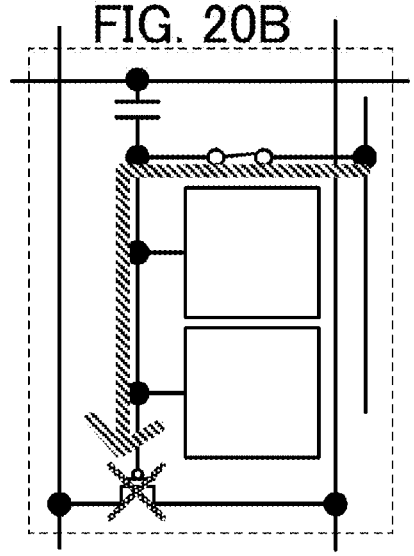
Figure 20C:
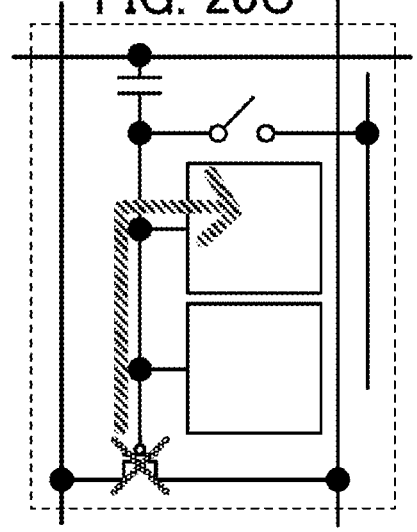
Figure 20D:
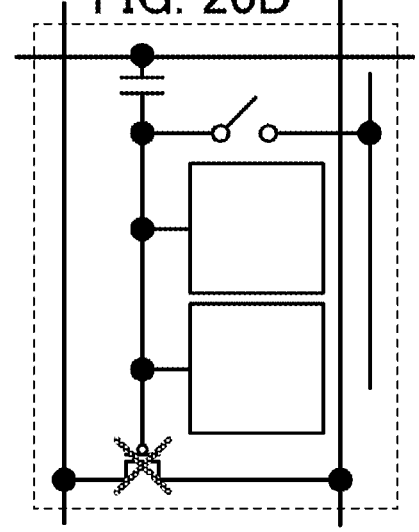
Figure 20E:
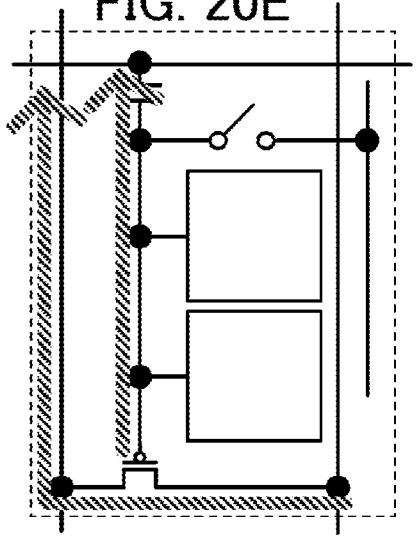
Figure 20F:
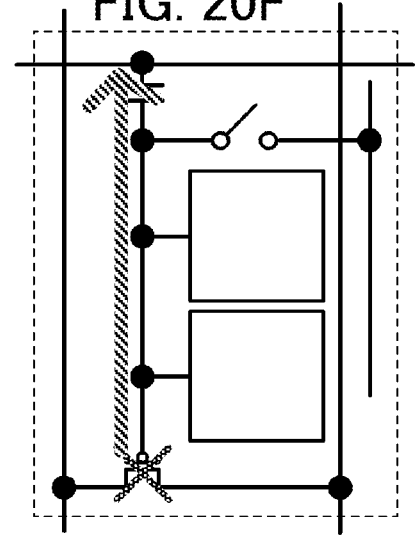

Moreover, FIG. 19C corresponds to FIG. 16C. FIG. 19D corresponds to FIG. 16D. FIG. 19E corresponds to FIG. 16E. FIG. 19F corresponds to FIG. 16F. FIG. 20A corresponds to FIG. 17A. FIG. 20B corresponds to FIG. 17B. FIG. 20C corresponds to FIG. 17C. FIG. 20D corresponds to FIG. 17D. FIG. 20E corresponds to FIG. 17E. FIG. 20F corresponds to FIG. 17F. FIG. 21A corresponds to FIG. 18A. FIG. 21B corresponds to FIG. 18B. FIG. 21C corresponds to FIG. 18C.

Driving can be similarly performed in not only FIG. 9 but also FIG. 10, FIG. 11, and the like.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 3)

In this embodiment, an example of the basic structure of a variation of the circuit that is one embodiment of the present invention described in Embodiment 1 will be described. As for the other structures except for the structures described below, the structures in Embodiment 1 can be referred to.

Figure 22:
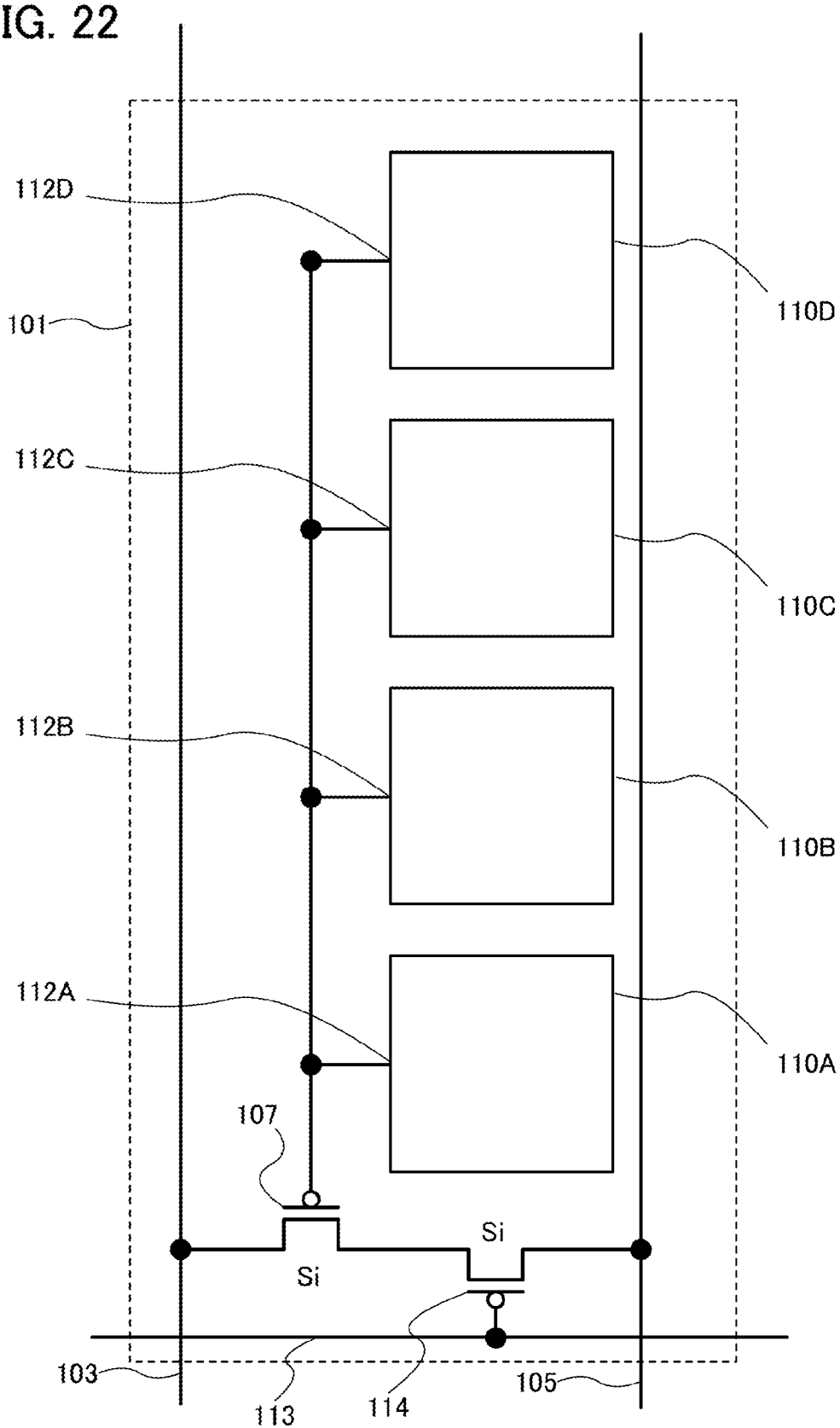
FIG. 22 is a circuit diagram of a semiconductor device according to one embodiment of the present invention.

An example of the circuit 101 is illustrated in FIG. 22. The circuit 101 includes the transistor 107 and a transistor 114, for example. The circuit 101 includes a circuit 110, for example. Note that a plurality of circuits 110 may be provided in the circuit 101, or only one circuit 110 may be provided in the circuit 101. As an example, FIG. 22 illustrates an example of providing four circuits 110. Thus, the circuit 101 includes the circuit 110A, the circuit 110B, the circuit 110C, and the circuit 110D. The circuits 110 each include the terminal 112 connected to the gate of the transistor 107. That is, the circuit 110A includes the terminal 112A, the circuit 110B includes the terminal 112B, the circuit 110C includes the terminal 112C, and the circuit 110D includes the terminal 112D. The terminal 112A, the terminal 112B, the terminal 112C, and the terminal 112D are connected to the gate of the transistor 107. One of a source and a drain of the transistor 107 is connected to the wiring 103. The other of the source and the drain of the transistor 107 is connected to one of a source and a drain of the transistor 114. The other of the source and the drain of the transistor 114 is connected to the wiring 105.

An example of a function of the circuit 101 is similar to that of Embodiment 1. The circuit 110 (e.g., the circuit 110A, the circuit 110B, the circuit 110C, and the circuit 110D) can output data to the transistor 107 through the terminal 112 (e.g., the terminal 112A, the terminal 112B, the terminal 112C, and the terminal 112D). The transistor 107 can output data through the wiring 103, the wiring 105, and the transistor 114. That is, data can be read from the circuit 101 through the wiring 103, the wiring 105, and the transistor 114. In other words, the wiring 103 and/or the wiring 105 have a function of a bit line.

A wiring 113 is connected to a gate of the transistor 114. By controlling the potential of the wiring 113, the conduction state (on/off) of the transistor 114 can be controlled. When the transistor 114 is on, data can be output from the transistor 107 through the wiring 103, the wiring 105, and the transistor 114. Thus, the wiring 113 has a function of selecting the circuit 101. That is, the wiring 113 has a function of a word line. By controlling the potential of the wiring 113, a plurality of circuits 101 connected to the wiring 113, for example, the circuits 101 arranged in one row can be selected.

Note that another configuration in which the transistor 107 and the transistor 114 are serially connected between the wiring 103 and the wiring 105 may be employed. An example of such a case is illustrated in FIG. 23.

In the case where a plurality of circuits 110 are provided, for example, in the case where the circuit 110A, the circuit 110B, the circuit 110C, and the circuit 110D are provided, data can be sequentially output from the circuits 110A to 110D to the transistor 107. Note that in the case where the circuit 110A, the circuit 110B, the circuit 110C, and the circuit 110D each store data of more than two levels (one bit), after all the data of more than two levels (one bit) in one of the circuits 110 (e.g., the circuit 110A) is output to the transistor 107, all the data of more than two levels (one bit) in the next circuit 110 (e.g., the circuit 110B) may be output to the transistor 107. Alternatively, after part of the data of more than two levels (one bit) in one of the circuits 110 (e.g., the circuit 110A) is output to the transistor 107, part of the data of more than two levels (one bit) in the next circuit 110 (e.g., the circuit 110B) may be output to the transistor 107; then another part of the data of more than two levels (one bit) in one of the circuits 110 (e.g., the circuit 110A) may be output to the transistor 107, and then another part of the data of more than two levels (one bit) in the next circuit 110 (e.g., the circuit 110B) may be output to the transistor 107. Alternatively, the data stored across the plurality of circuits 101 may be partly read from each of the plurality of circuits 101.

Figure 23:
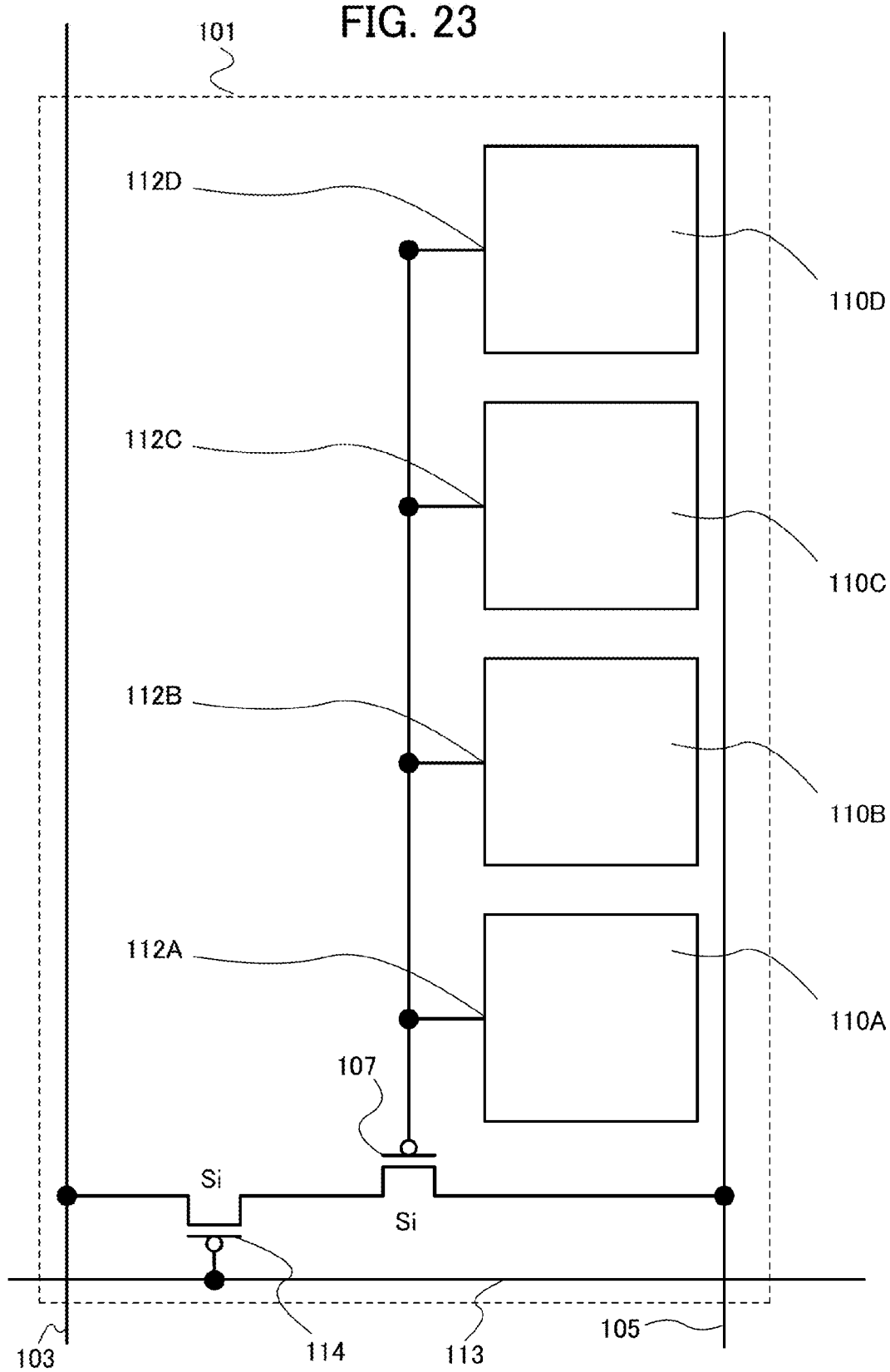
FIG. 23 is a circuit diagram of a semiconductor device according to one embodiment of the present invention.
Figure 24:
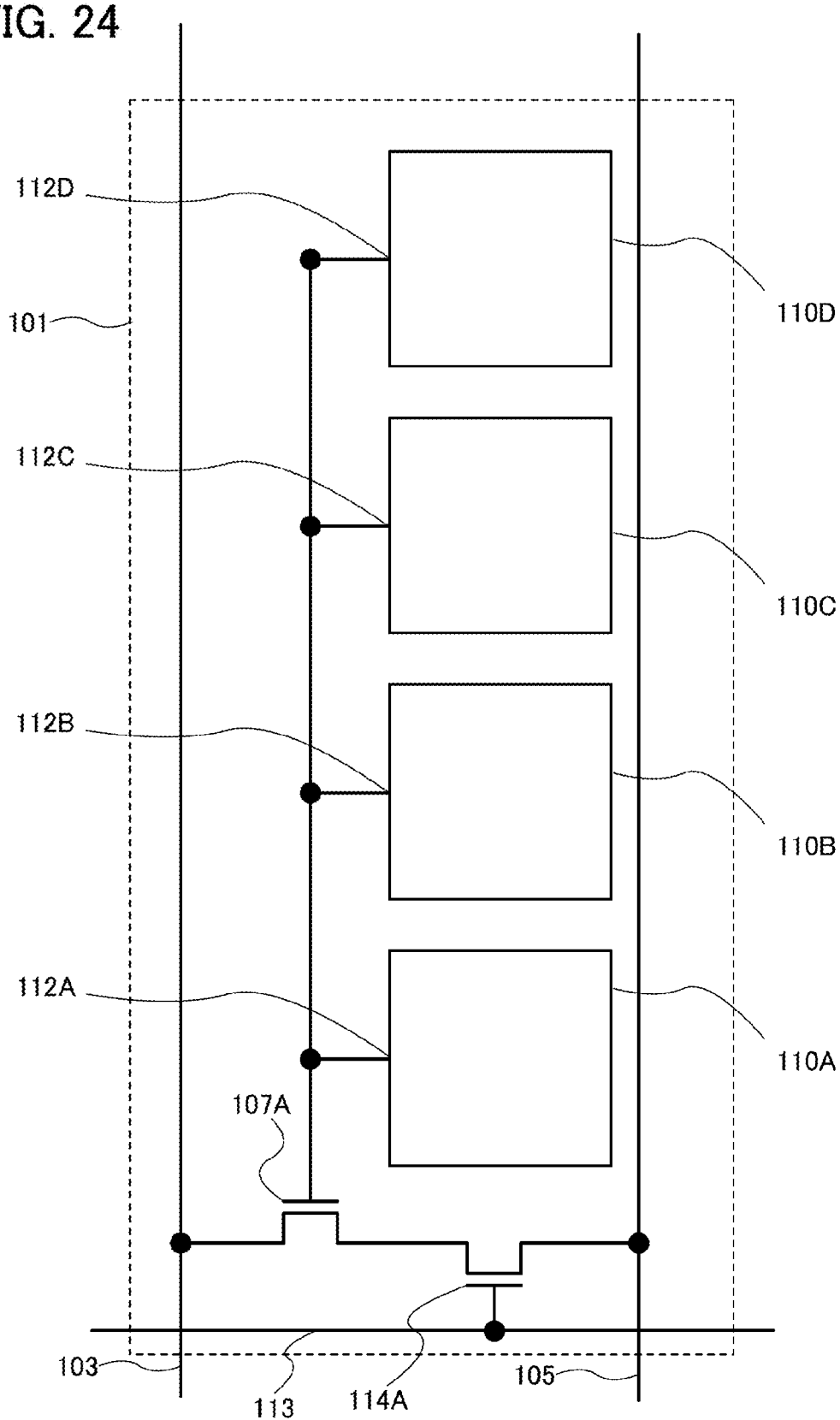
FIG. 24 is a circuit diagram of a semiconductor device according to one embodiment of the present invention.
Figure 25:
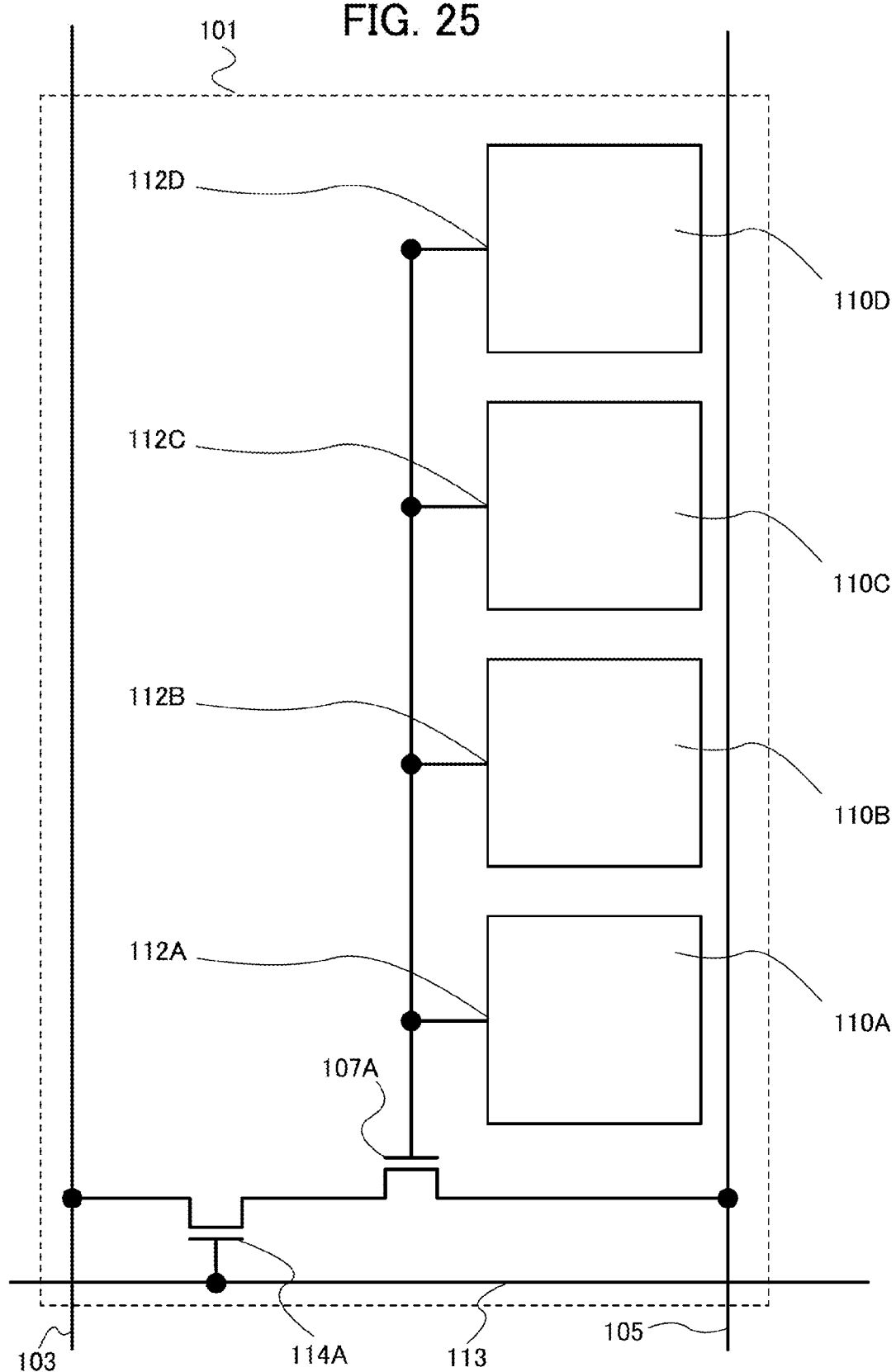
FIG. 25 is a circuit diagram of a semiconductor device according to one embodiment of the present invention.

Although the transistor 107 and the transistor 114 are p-channel transistors in FIG. 22 and FIG. 23, one embodiment of the present invention is not limited to this example. FIG. 24 and FIG. 25 illustrate examples in which the n-channel transistor 107A and an n-channel transistor 114A are used. The transistor 107 and the transistor 114 may have different polarities from each other; however, it is preferable that the transistor 107 and the transistor 114 have the same polarity because element isolation is not necessary and an impurity region can be shared, and thereby the layout area can be reduced. The transistor 107 and/or the transistor 114 can function as a switch, for example. Thus, the polarity of the transistors can be changed as appropriate. The voltage to the terminals may be adjusted in accordance with the polarity. Note that the polarity of transistors other than the transistor 107 and the transistor 114 can also be changed as appropriate.

Figure 26:
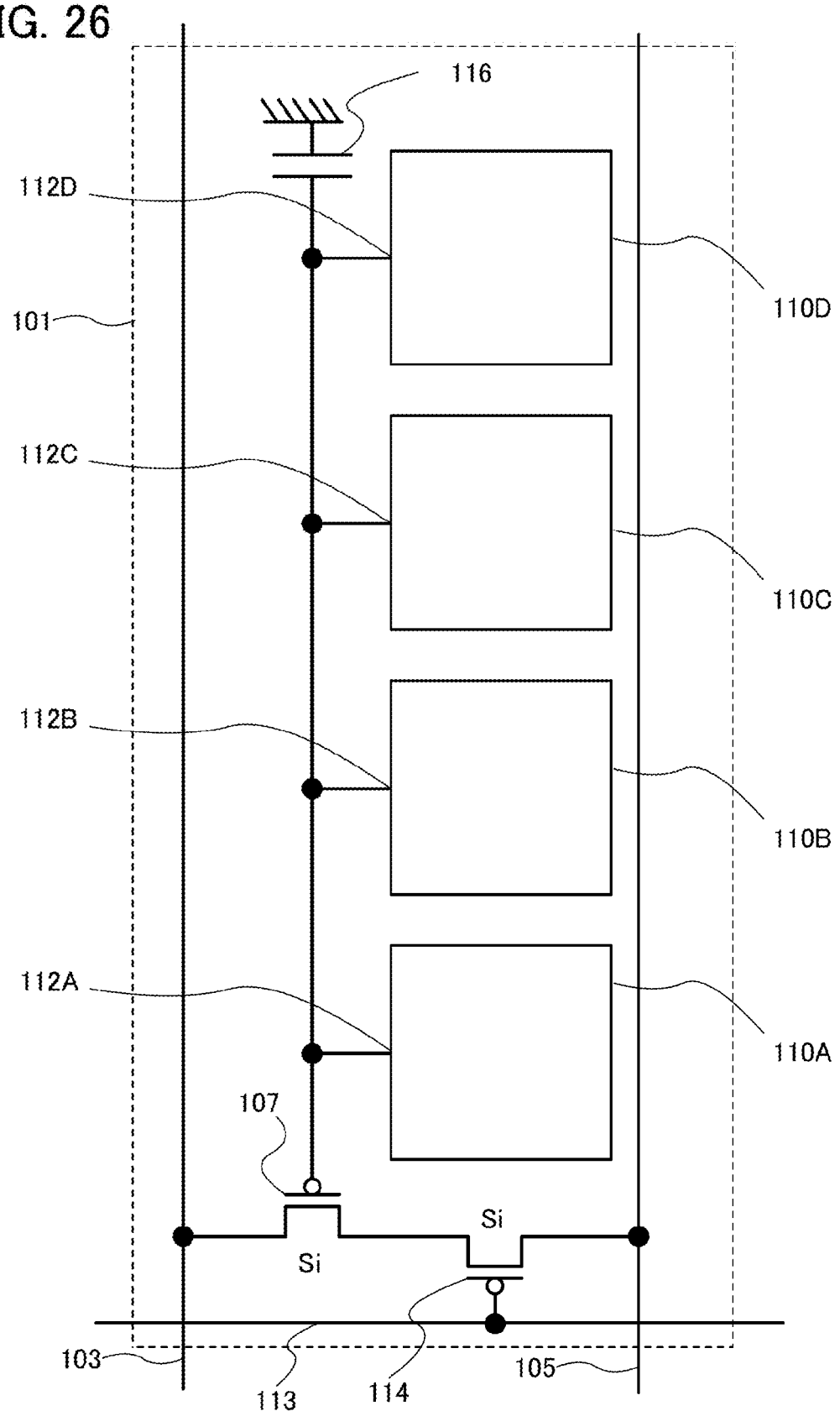
FIG. 26 is a circuit diagram of a semiconductor device according to one embodiment of the present invention.

Furthermore, the capacitor 116 may be connected to the gate of the transistor 107. When the capacitor 116 is provided, the potential of the gate of the transistor 107 can be easily held. Note that even when the capacitor 116 is not provided, the signal can be held by parasitic capacitance (gate capacitance) of the transistor 107. As an example, an example in which one terminal of the capacitor 116 is connected to the gate of the transistor 107 in FIG. 22 is illustrated in FIG. 26. Similarly, the capacitor 116 can be provided in other drawings. In FIG. 26, the other terminal of the capacitor 116 is grounded. However, one embodiment of the present invention is not limited to this example as long as a constant potential is supplied to the other terminal of the capacitor 116. Accordingly, any of various potentials such as VDD, VSS, and VGND may be supplied.

Note that although the terminal 112 (e.g., the terminal 112A, the terminal 112B, the terminal 112C, and the terminal 112D) is connected to the gate of the transistor 107, another element may be further connected thereto. In the case of further connecting another element to the gate of the transistor 107, the potential of the gate of the transistor 107 can be controlled, for example.

Figure 27:
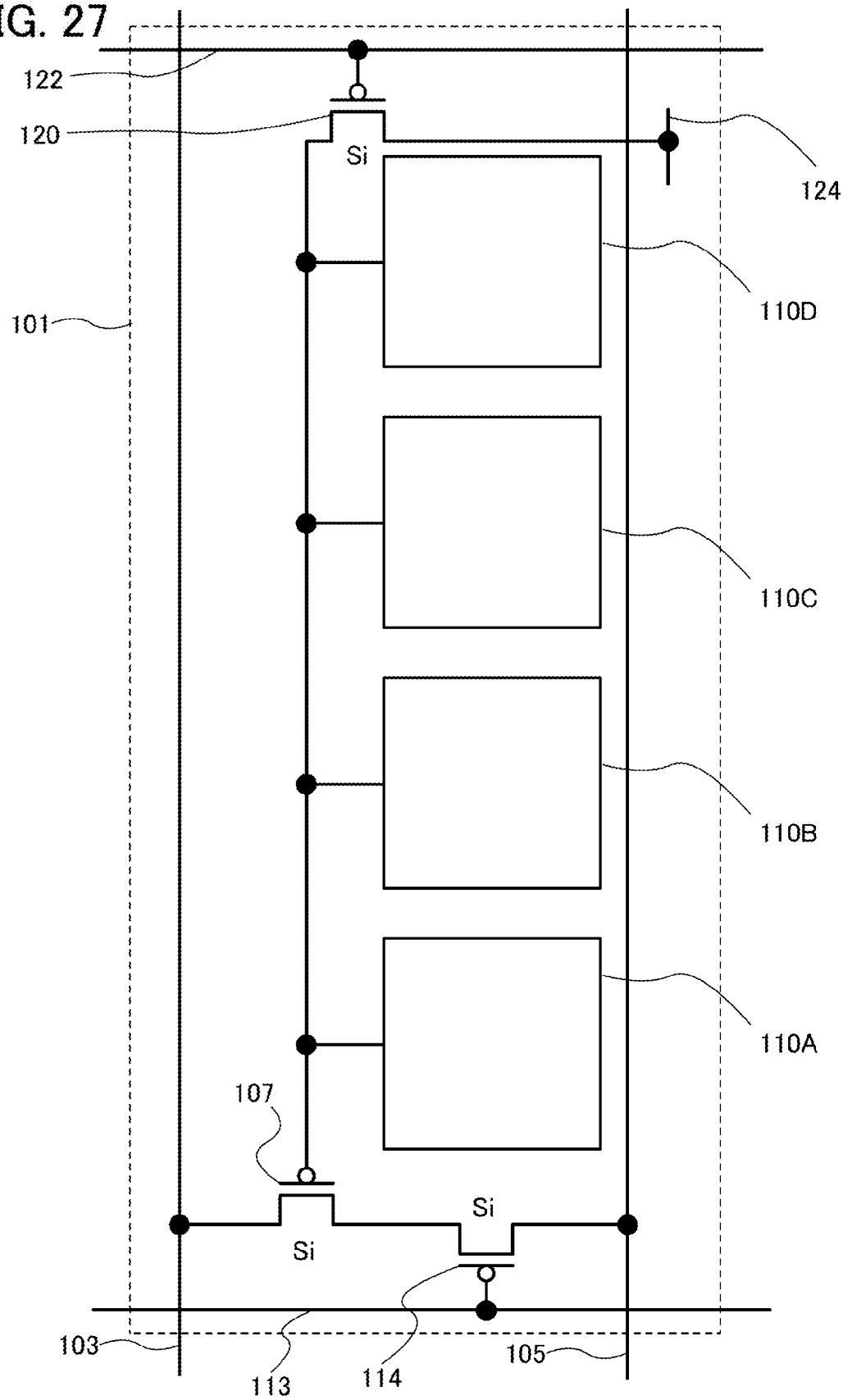
FIG. 27 is a circuit diagram of a semiconductor device according to one embodiment of the present invention.
Figure 28:
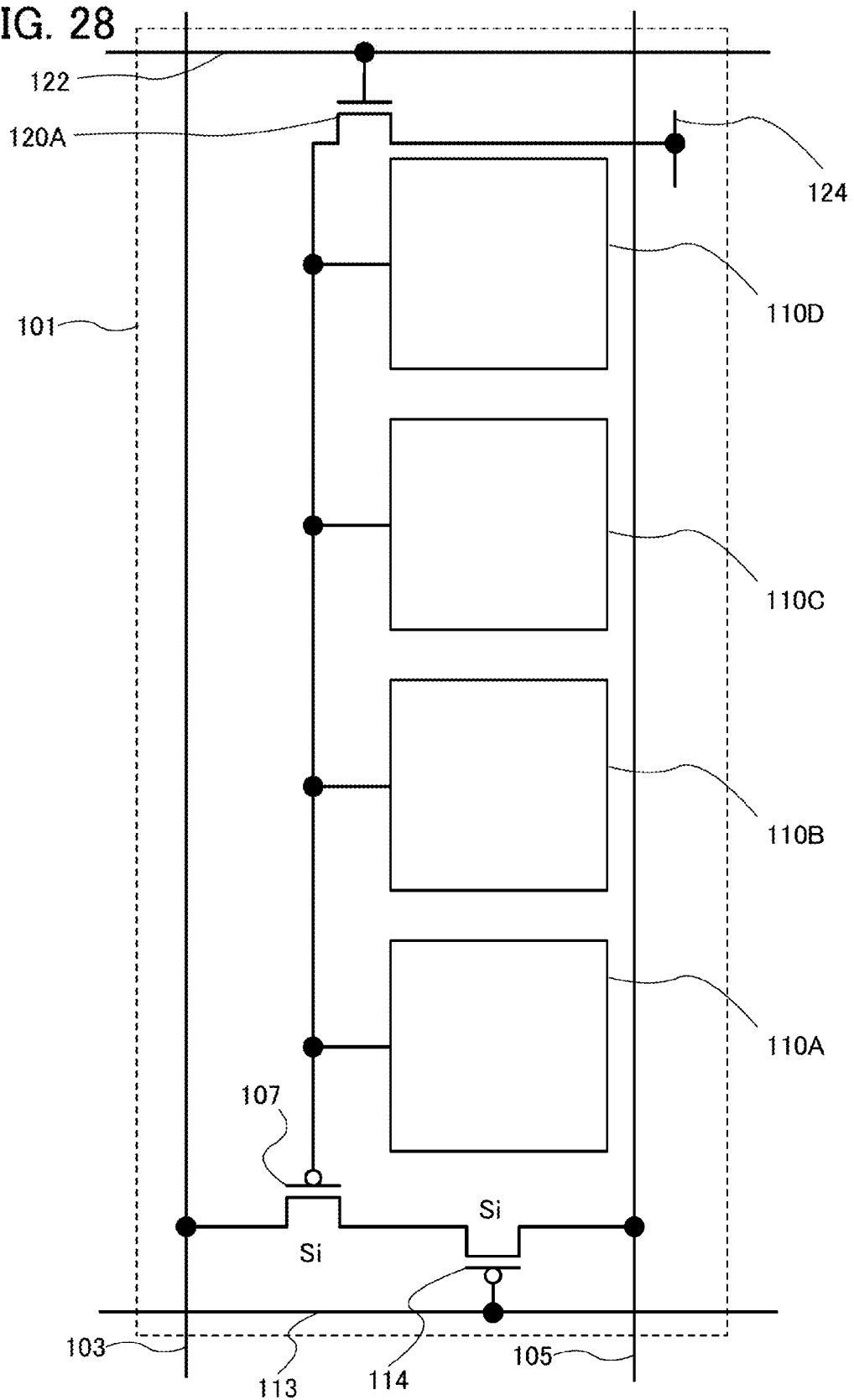
FIG. 28 is a circuit diagram of a semiconductor device according to one embodiment of the present invention.

An example in which the transistor 120 is provided as an example of the element connected to the gate of the transistor 107 is illustrated in FIG. 27. The transistor 107 and the transistor 120 may have various polarities without being limited to p-channel polarity. FIG. 28 illustrates an example in which the transistor 120 is the n-channel transistor 120A. If the transistor 107, the transistor 114, and the transistor 120 are all p-channel transistors, element isolation is not necessary in the case of using single crystal silicon, which allows a reduction in the layout area.

Figure 29:
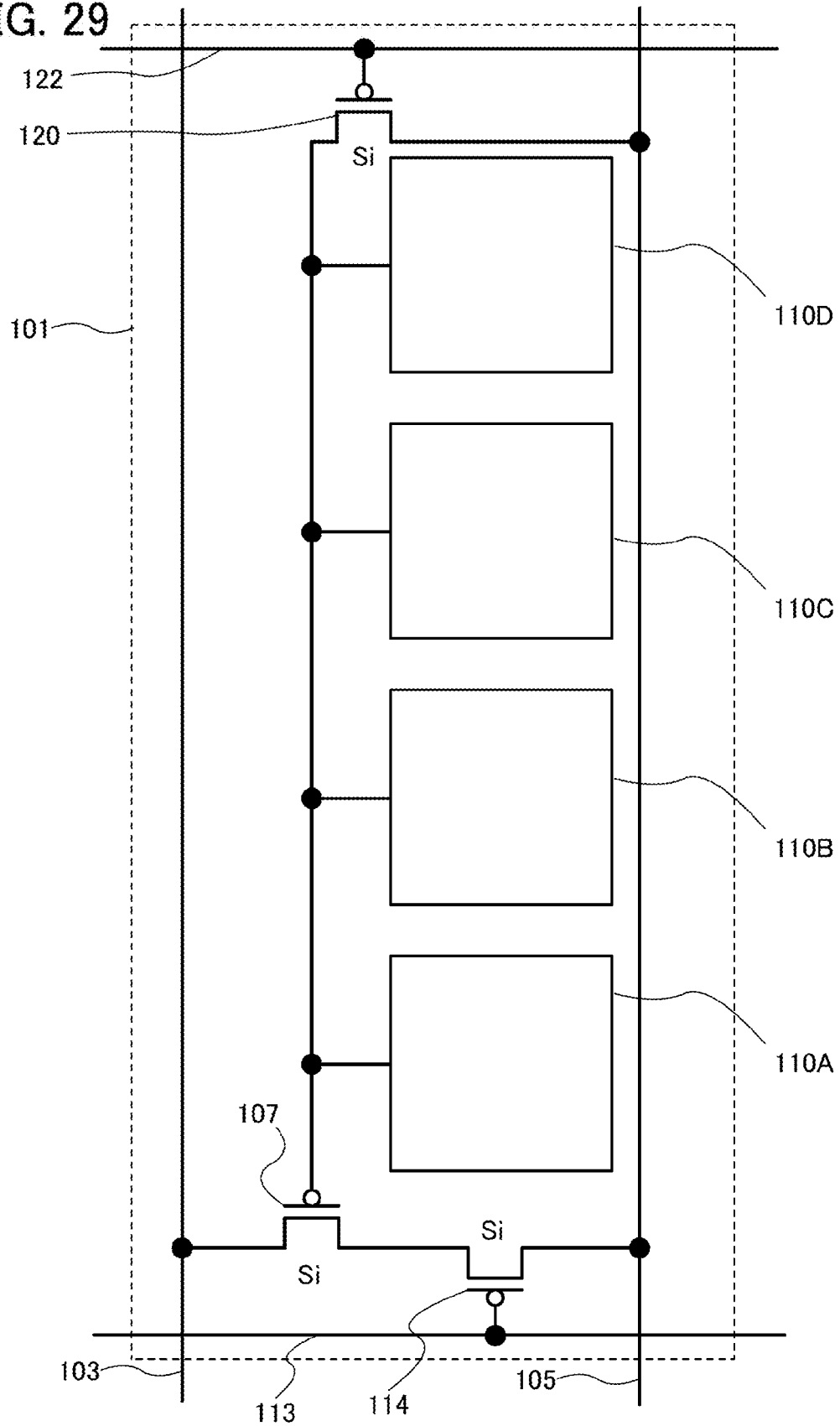
FIG. 29 is a circuit diagram of a semiconductor device according to one embodiment of the present invention.
Figure 30:
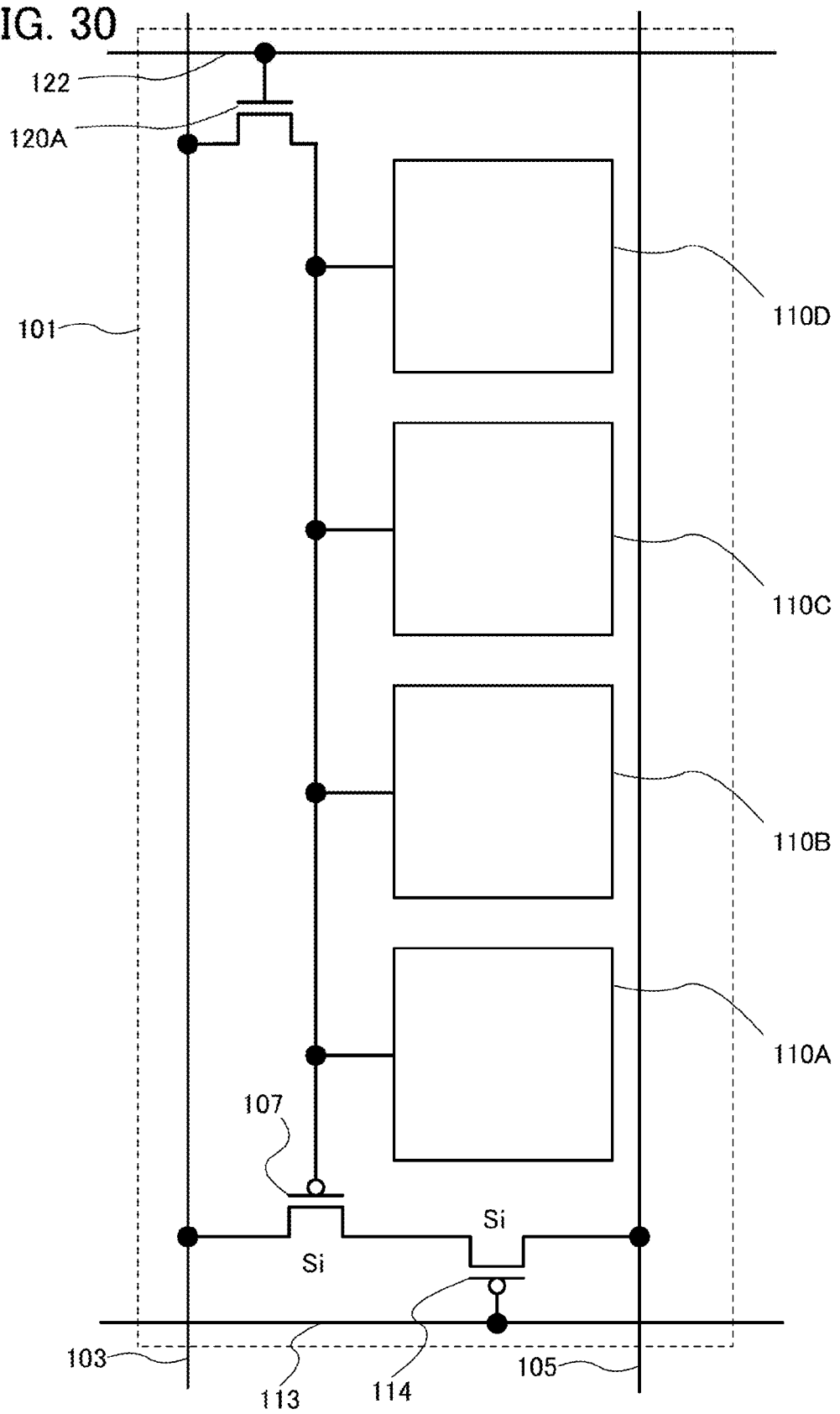
FIG. 30 is a circuit diagram of a semiconductor device according to one embodiment of the present invention.

One of a source and a drain of the transistor 120 is connected to the gate of the transistor 107. By controlling the potential of a wiring 122 connected to a gate of the transistor 120, a potential of the other of the source and the drain of the transistor 120 can be supplied to the gate of the transistor 107. That is, the transistor 120 can function as a switch. Note that the other of the source and the drain of the transistor 120 is connected to a wiring 124 in FIG. 27; however, one embodiment of the present invention is not limited to this example. The other of the source and the drain of the transistor 120 may be connected to a wiring other than the wiring 124, such as the wiring 105, the wiring 103, or the wiring 122, for example. Alternatively, the other of the source and the drain of the transistor 120 may be connected to a wiring included in the circuit 110 (e.g., the circuit 110A, the circuit 110B, the circuit 110C, and the circuit 110D). Examples of such cases are illustrated in FIG. 29 and FIG. 30. That is, as long as the potential of the gate of the transistor 107 can be adjusted to a predetermined potential when the transistor 120 is on, the wiring to which the other of the source and the drain of the transistor 120 is connected is not limited.

Here, the transistor 120 has a function of controlling the potential of the gate of the transistor 107. For example, with the transistor 120, the potential of the gate of the transistor 107 can be set to a predetermined potential, for example, a potential that makes the transistor 107 in an off state. Alternatively, in the case where a signal is output from the circuit 110 (e.g., the circuit 110A, the circuit 110B, the circuit 110C, or the circuit 110D) to the gate of the transistor 107, the transistor 120 can initialize the potential of the gate of the transistor 107 to a predetermined potential before the output of the signal. Thus, the transistor 120 has a function of initializing the potential of the gate of the transistor 107.

Note that not only in FIG. 22 and FIG. 24 but also in other diagrams, the transistor 120 can be provided in a similar manner.

Note that in the case where the circuit 110 (e.g., the circuit 110A, the circuit 110B, the circuit 110C, and the circuit 110D) can store data of more than two levels (one bit), the data preferably has, for example, levels of the power of two, that is, the value that can be counted in bits, for the easiness of signal processing. However, one embodiment of the present invention is not limited to this example, and the data may have an arbitrary value. For specific examples of data that can be stored in the circuit 110, Embodiment 1 can be referred to.

Note that a transistor included in the circuit 101 or a transistor included in the circuit 110 (e.g., the circuit 110A, the circuit 110B, the circuit 110C, and the circuit 110D) can function as a switch, for example. As these transistors or switches, any of the transistors and switches described in Embodiment 1 can be used.

An example of a basic principle has been described in this embodiment. Thus, part or the whole of this embodiment can be freely combined with, applied to, or replaced with part or the whole of another embodiment.

(Embodiment 4)

In this embodiment, an example of a method for driving the circuits 101 in Embodiment 3 will be described. As for the structures and driving methods except for those described below, Embodiment 2 can be referred to.

First, an example of a driving method in FIG. 22 will be described. The circuits 101 in other drawings can be driven in a similar manner.

Figure 31A:
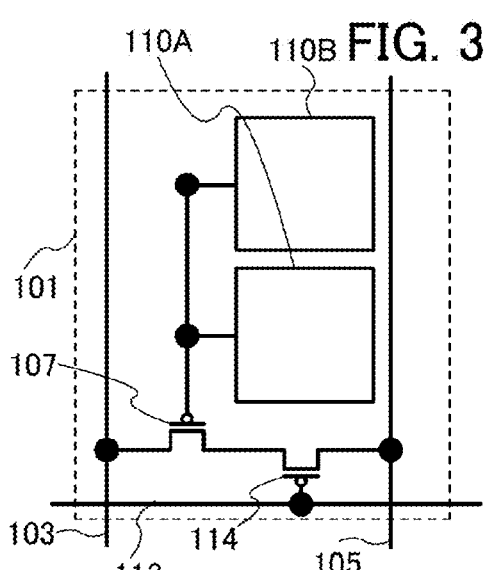
FIGS. 31A to 31F illustrate an operation of a semiconductor device according to one embodiment of the present invention.

FIG. 31A illustrates an example in which two circuits 110 (the circuit 110A and the circuit 110B) are provided in the circuit 101. Even if the number of circuits 110 is changed, a similar operation is possible.

First, an example of a driving method in FIG. 31A in the case of outputting a signal from the circuit 101 to the outside by utilizing the wiring 103 and the wiring 105, that is, in the case of reading data of the circuit 101 is illustrated in FIGS. 31B to 31F, FIGS. 32A to 32F, FIGS. 33A to 33C, and the like. Note that in the drawings, "x" is put on the transistor in an off state, as an example. Furthermore, arrows in the drawings show the path of current, the place where the potential is changed, or the like, as an example.

Figure 31B:
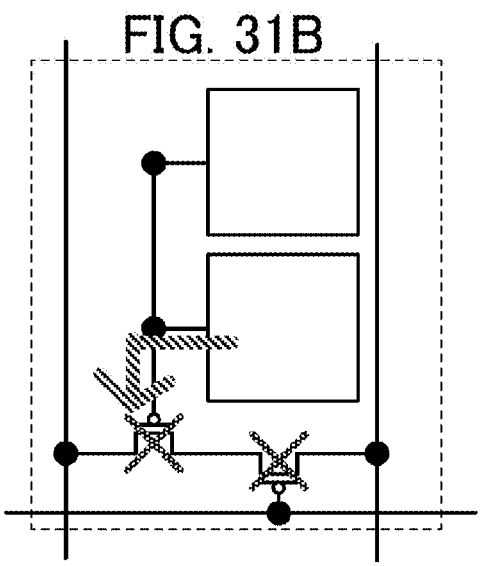

First, initialization is performed. As illustrated in FIG. 31B, a potential that turns off the transistor 107 is output from the circuit 110A, so that the potential of the gate of the transistor 107 is initialized. In the case where the transistor 107 is of a p-channel type, a high-potential power supply voltage (VDD) is output, for example. In the case where the transistor 107 is of an n-channel type, a low-potential power supply voltage is output.

At this time, the wiring 113 is set at a potential that turns off the transistor 114, that is, a potential that makes the circuit 101 in an unselected state. In the case where the transistor 114 is of a p-channel type, the potential of the wiring 113 is set at a high-potential power supply voltage (VDD), for example. In the case where the transistor 114 is of an n-channel type, the potential of the wiring 113 is set at a low-potential power supply voltage.

Note that in the initialization, in the case where the transistor 107 is a transistor including single crystal silicon in its channel region, the high-potential power supply voltage (VDD) is, for example, 5 V or lower, preferably 3 V or lower, and further preferably 1.5 V or lower. With the value in this range, problems are unlikely to occur in the transistor 107. Note that one embodiment of the present invention is not limited to this example.

Alternatively, another circuit such as the circuit 110B may output a potential to initialize the potential of the gate of the transistor 107. Alternatively, the potential of the gate of the transistor 107 may be initialized by utilizing another circuit or another element.

In the case where the transistor 107 is already off, initialization is not necessarily performed.

Figure 31C:
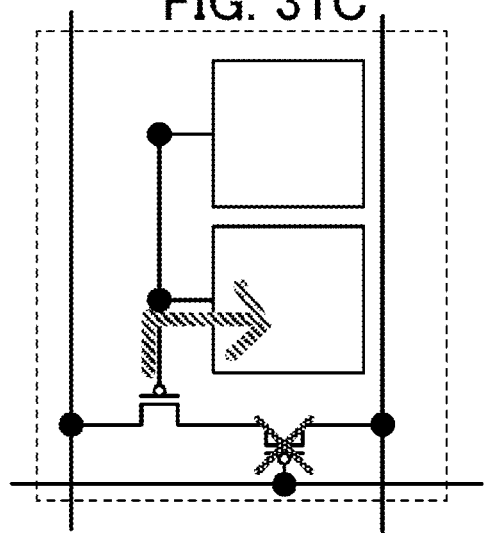
Figure 31D:
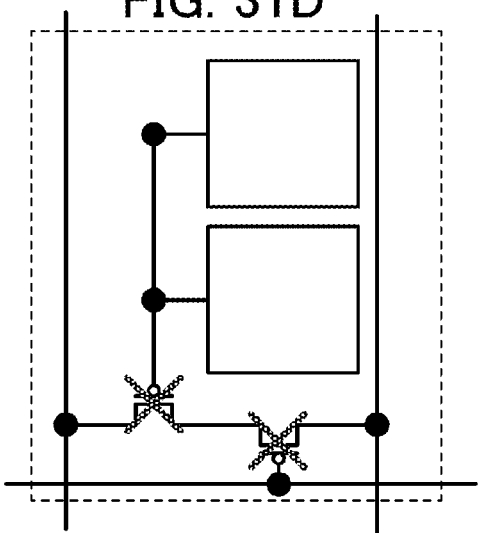

Next, an output operation of a signal from the circuit 110A to the gate of the transistor 107 is performed. For example, as illustrated in FIGS. 31C and 31D, the signal is output from the circuit 110A to the gate of the transistor 107. FIGS. 31C and 31D illustrate examples in which different signals are output. The signal output from the circuit 110A is a signal corresponding to the data stored in the circuit 110A. For example, in the case of FIG. 31C, the potential of the signal is set to an L signal (e.g., a low-potential power supply voltage (VSS) or a ground voltage (VGND)). For example, in the case of FIG. 31D, the potential of the signal is set to an H signal (e.g., a high-potential power supply voltage (VDD)). Thus, not outputting the signal to the gate of the transistor 107 in FIG. 31D can be regarded as outputting the data stored in the circuit 110A to the transistor 107.

Next, an output operation of the signal from the circuit 101 (reading of the signal) is performed. The potential of the wiring 113 is controlled so as to make the transistor 114 in an on state. In other words, the circuit 101 is selected by this operation. For example, in the case where the transistor 114 is of a p-channel type, the potential of the wiring 113 is set at a low-potential power supply voltage (VSS) or a ground voltage (VGND), for example.

Figure 31E:
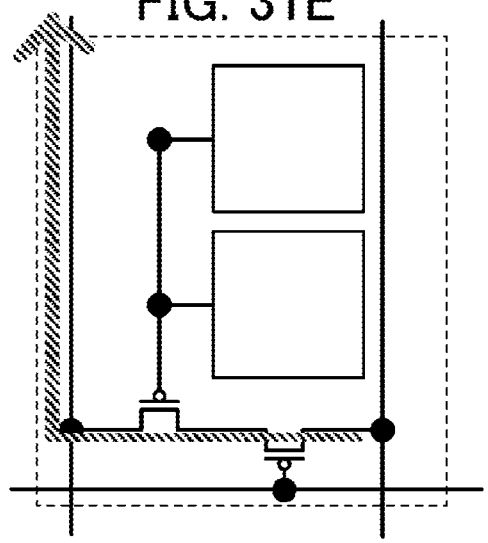

Then, in the case where the signal output from the circuit 110A to the gate of the transistor 107 is an L signal (e.g., a low-potential power supply voltage (VSS) or a ground voltage (VGND)), the transistor 107 is turned on owing to the potential of the wiring 113 as illustrated in FIG. 31E; as a result, electrical continuity between the wiring 105 and the wiring 103 is established. For example, if a high-potential power supply voltage (VDD) is supplied to the wiring 105, current is supplied from the wiring 105 through the transistor 114 and the transistor 107 to the wiring 103, so that the potential of the wiring 103 is increased. A circuit having a function of reading a signal, for example, a sense amplifier circuit or the like, is connected to the wiring 103, and the sense amplifier circuit or the like can read the potential of the wiring 103, that is, the signal output from the circuit 101.

Figure 31F:
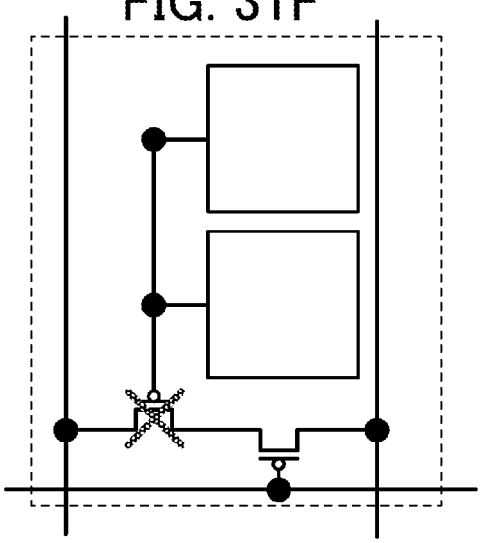

In contrast, in the case where an H signal (e.g., a high-potential power supply voltage (VDD)) is output from the circuit 110A or in the case where a signal is not output from the circuit 110A, the transistor 107 remains off as illustrated in FIG. 31F; as a result, electrical discontinuity between the wiring 105 and the wiring 103 is kept. Then, the potential of the wiring 103, that is, the signal from the circuit 101 is read by a sense amplifier circuit or the like.

By the above-described operation, the data stored in the circuit 110A can be read. In other words, data stored in the circuit 101 can be output therefrom.

Note that in the case where data of more than two levels (one bit) is stored in the circuit 110A, that is, in the case where multilevel data is stored, the operation of FIG. 31B, FIG. 31C, and FIG. 31E or the operation of FIG. 31B, FIG. 31D, and FIG. 31F may be repeated a plurality of times in accordance with the value, to read in which case the transistor 107 is on and in which case the transistor 107 is off. In this manner, multilevel data can be output from the circuit 101.

Alternatively, multilevel data may be output from the circuit 101 in the following manner: a ramp-wave signal, a sawtooth-wave signal, or the like is supplied to the circuit 110A, in which case the transistor 107 remains off until a certain state comes and it is read that the transistor 107 turns on when the certain state comes. That is, multilevel data can be read by reading which value is stored in the circuit 110A from the potential of the ramp-wave signal or the sawtooth-wave signal or the like supplied to the circuit 110A. In this case also, the potential of the gate of the transistor 107 may be initialized as in FIG. 31B in the middle of the process of changing the ramp-wave signal, the sawtooth-wave signal, or the like.

Figure 32A:
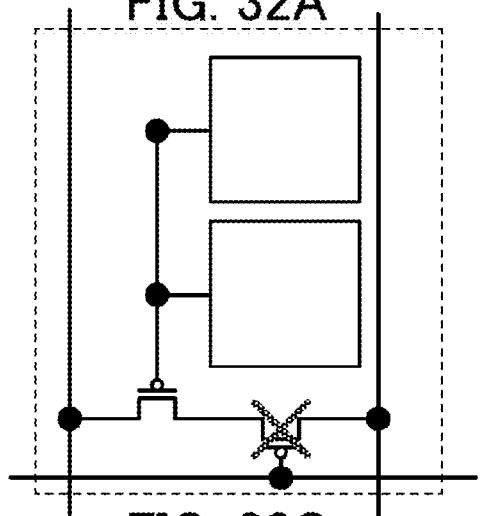
FIGS. 32A to 32F illustrate an operation of a semiconductor device according to one embodiment of the present invention.

Finally, the potential of the wiring 113 is set back to a potential that turns off the transistor 114 as illustrated in FIG. 32A, so that the transistor 114 is turned off.

In the above-described manner, the operation for the circuit 110A is finished. Then, an operation similar to that for the circuit 110A is performed on a different circuit 110 (e.g., the circuit 110B). By way of caution, the operation is briefly described below.

Figure 32B:
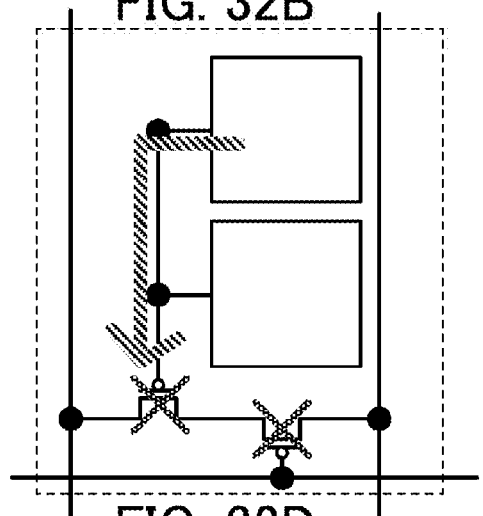

First, the transistor 107 is initialized as illustrated in FIG. 32B. FIG. 32B corresponds to FIG. 31B.

Figure 32C:
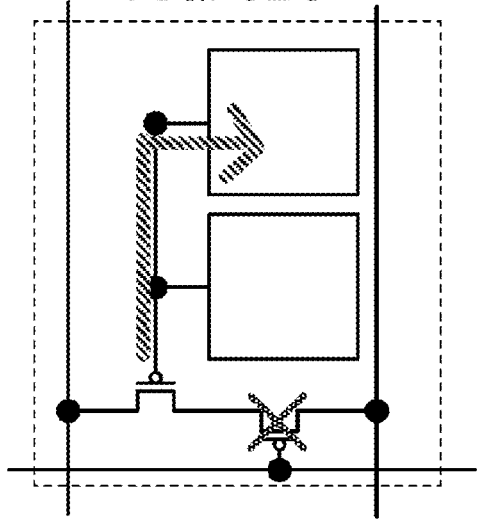
Figure 32D:
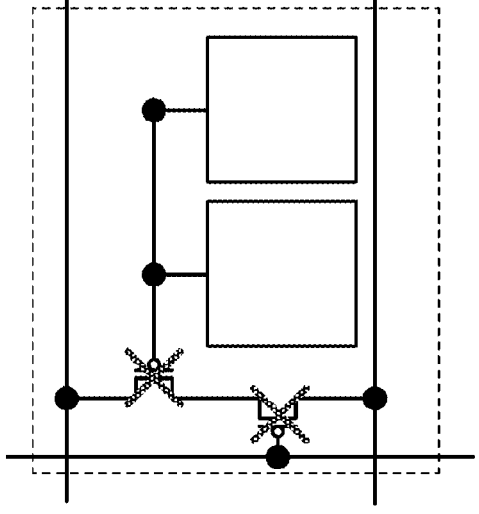

Then, as illustrated in FIG. 32C or FIG. 32D, a signal is output from the circuit 110B to the gate of the transistor 107. FIG. 32C corresponds to FIG. 31C, and FIG. 32D corresponds to FIG. 31D.

Figure 32E:
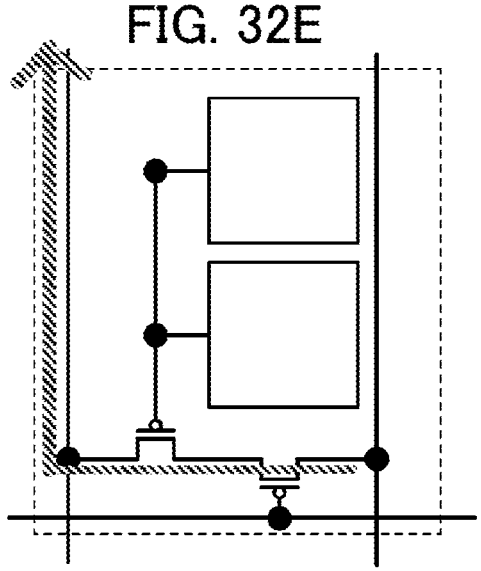
Figure 32F:
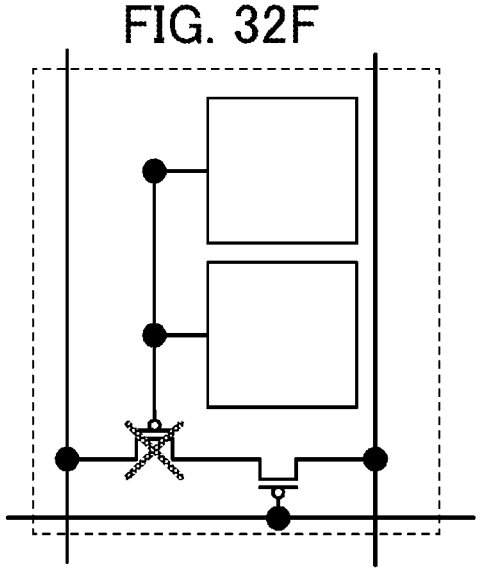

Then, as illustrated in FIG. 32E or FIG. 32F, the potential of the wiring 113 is controlled to output a signal from the circuit 101. FIG. 32E corresponds to FIG. 31E, and FIG. 32F corresponds to FIG. 31F.

Figure 33A:
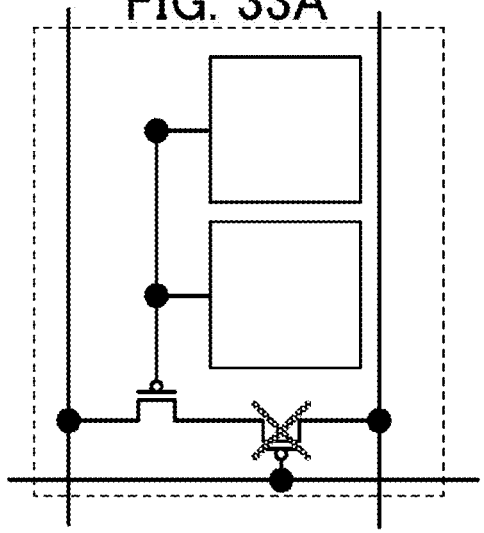
FIGS. 33A to 33C illustrate an operation of a semiconductor device according to one embodiment of the present invention.

Finally, the potential of the wiring 113 is set back to a potential that turns off the transistor 114 as illustrated in FIG. 33A, so that the transistor 114 is turned off. FIG. 33A corresponds to FIG. 32A.

Thus, the operation for the circuit 110B is finished.

In the case where another circuit 110 is further provided, a similar operation is repeated.

Finally, the potential of the gate of the transistor 107 is initialized to turn off the transistor 107. The initialization may be performed by a method similar to that in FIG. 31B or FIG. 32B.

Figure 33B:
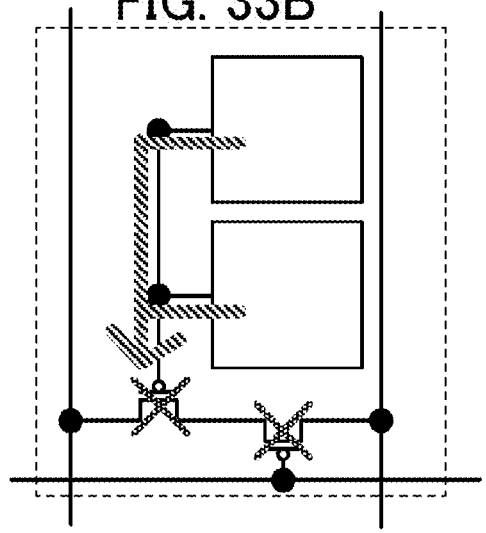

In the case of initializing the potential of the gate of the transistor 107, signals may be output from a plurality of circuits 110 as illustrated in FIG. 33B.

Since the transistor 114 is in an off state by the control of the potential of the wiring 113, initialization is not necessarily performed.

Figure 33C:
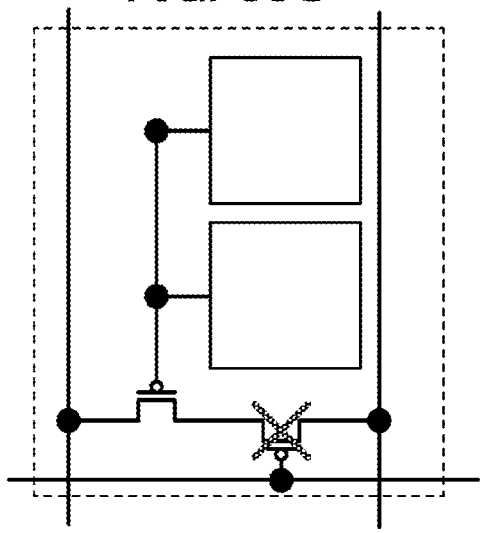

By the above-described operation, reading of the signal from the circuit 101 is finished. Then, as illustrated in FIG. 33C, the transistor 114 keeps an off state. Next, if the circuit 101 is provided in a different row, reading of a signal or the like is performed there similarly.

Although an example of a driving method in the case of FIG. 22 is illustrated in FIGS. 31A to 31F, FIGS. 32A to 32F, and FIGS. 33A to 33C, driving is possible similarly in other drawings.

For example, an example of a driving method in the case of FIG. 27 will be described below using the configuration illustrated in FIG. 34A. In FIG. 34A, the switch 120B is used as the transistor 120. The on/off of the switch 120B can be controlled by controlling the potential of the wiring 122, for example.

First, FIG. 34A corresponds to the structure of FIG. 31A to which the switch 120B is added. Accordingly, in FIG. 34A, the potential of the gate of the transistor 107 can be initialized by controlling the conduction state of the switch 120B. The other operation is mostly similar to that in the case of FIG. 31A.

FIG. 34B corresponds to FIG. 31B. In FIG. 34B, the potential of the gate of the transistor 107 can be initialized through the switch 120B. In the case where the transistor 107 is of a p-channel type, a high-potential power supply voltage (VDD) can be supplied from the wiring 124, for example. In the case where the transistor 107 is of an n-channel type, a low-potential power supply voltage can be supplied.

Figure 35A:
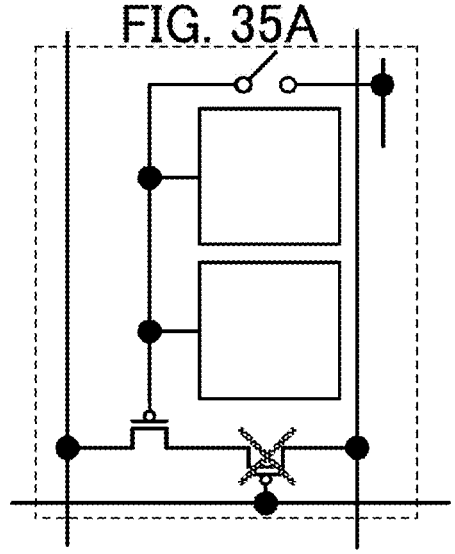
FIGS. 35A to 35F illustrate an operation of a semiconductor device according to one embodiment of the present invention.
Figure 35B:
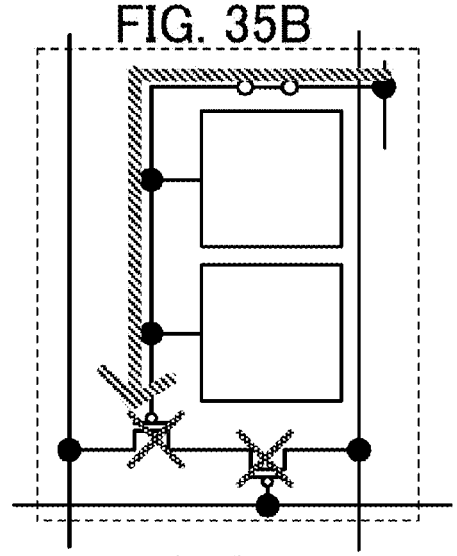
Figure 35C:
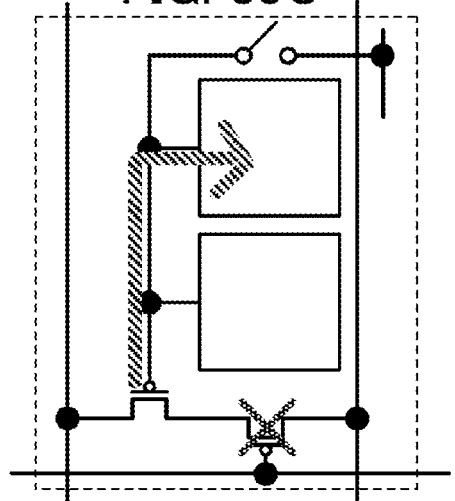
Figure 35D:
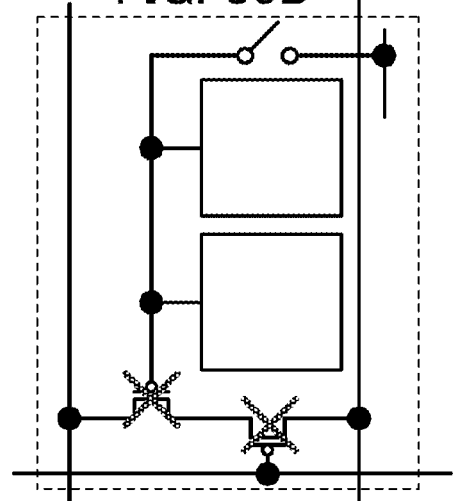
Figure 35E:
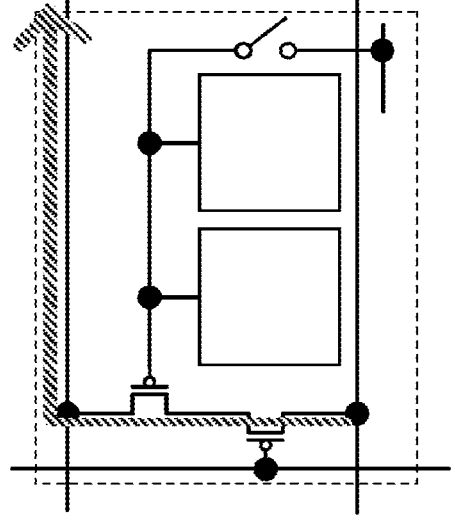
Figure 35F:
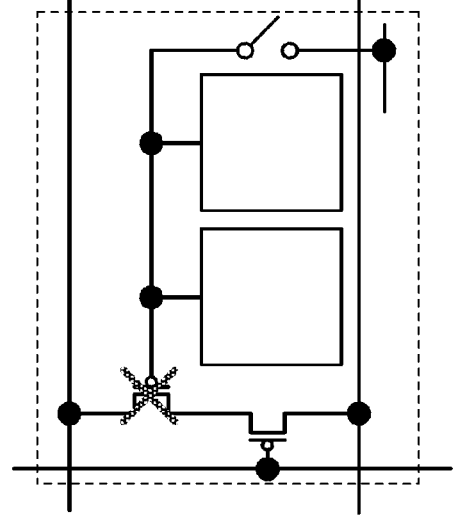
Figure 36A:
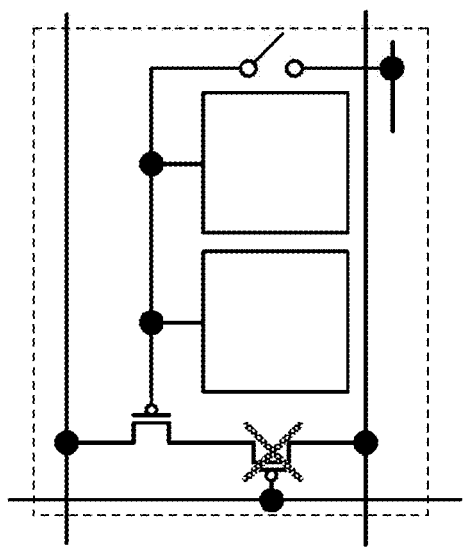
FIGS. 36A and 36B illustrate an operation of a semiconductor device according to one embodiment of the present invention.
Figure 36B:
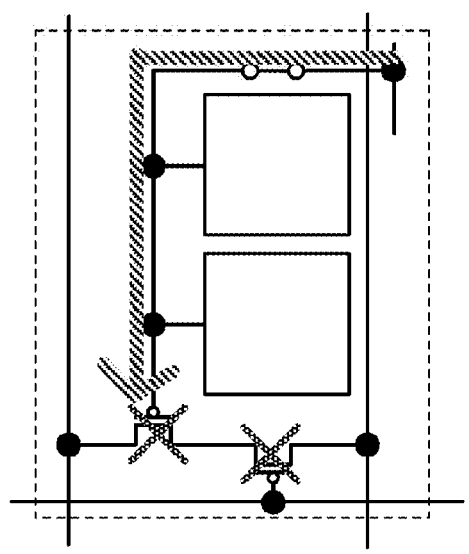

Moreover, FIG. 34C corresponds to FIG. 31C. FIG. 34D corresponds to FIG. 31D. FIG. 34E corresponds to FIG. 31E. FIG. 34F corresponds to FIG. 31F. FIG. 35A corresponds to FIG. 32A. FIG. 35B corresponds to FIG. 32B. FIG. 35C corresponds to FIG. 32C. FIG. 35D corresponds to FIG. 32D. FIG. 35E corresponds to FIG. 32E. FIG. 35F corresponds to FIG. 32F. FIG. 36A corresponds to FIG. 33A. FIG. 36B corresponds to FIG. 33B.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 5)

In this embodiment, examples of a specific circuit configuration of the circuit 110 described in Embodiments 1 to 4 will be described.

For example, one or more circuits 110 are provided in the circuit 101. Accordingly, the circuit 110 described as an example in this embodiment can be used as, for example, the circuit 110A, the circuit 110B, the circuit 110C, the circuit 110D, or the like. Note that the circuit 110A, the circuit 110B, the circuit 110C, the circuit 110D, and the like included in one circuit 101 may have different circuit configurations from one another, for example. That is, in the case where a variety of circuit configurations can be employed for the circuit 110, the circuit 110A, the circuit 110B, the circuit 110C, the circuit 110D, and the like included in one circuit 101 may have different circuit configurations from one another, or may at least partly or all have the same circuit configuration.

Figure 37:
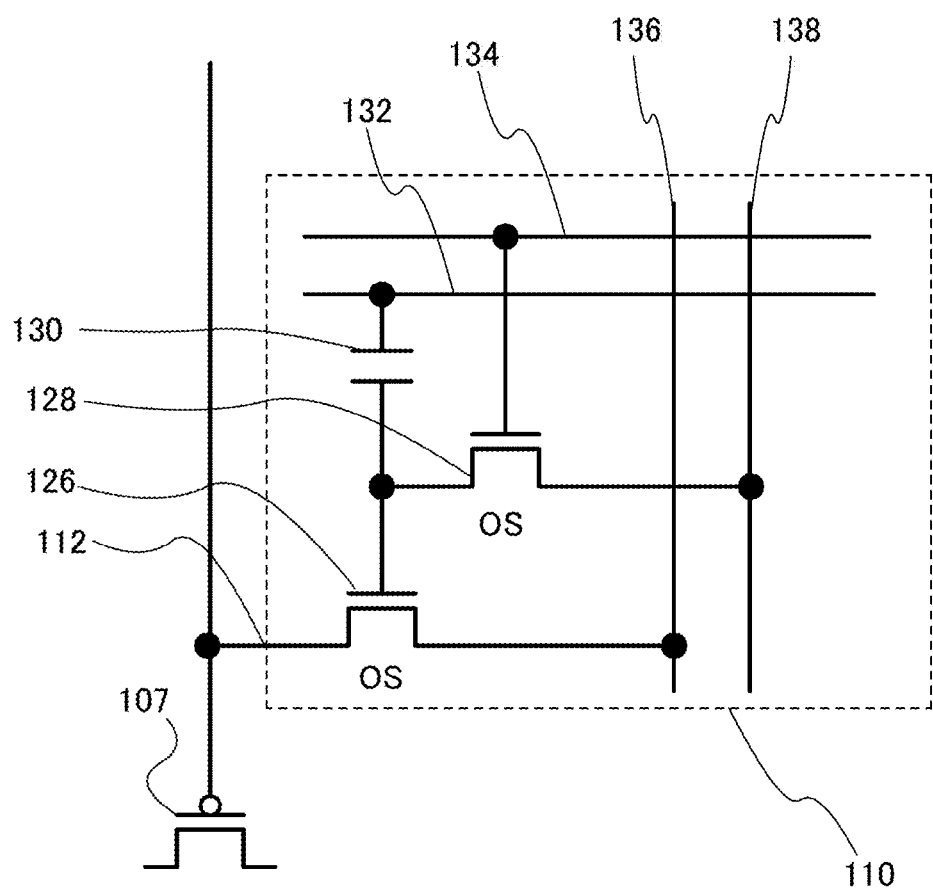
FIG. 37 is a circuit diagram illustrating a semiconductor device according to one embodiment of the present invention.

First, one example of the circuit 110 is illustrated in FIG. 37. The circuit 110 includes a transistor 126, a transistor 128, and a capacitor 130, for example. The transistor 126, the transistor 128, and the capacitor 130 are connected to a wiring 132, a wiring 134, a wiring 136, a wiring 138, and the like as illustrated in FIG. 37. Here, the terminal 112 is connected to one of a source and a drain of the transistor 126.

Figure 38:
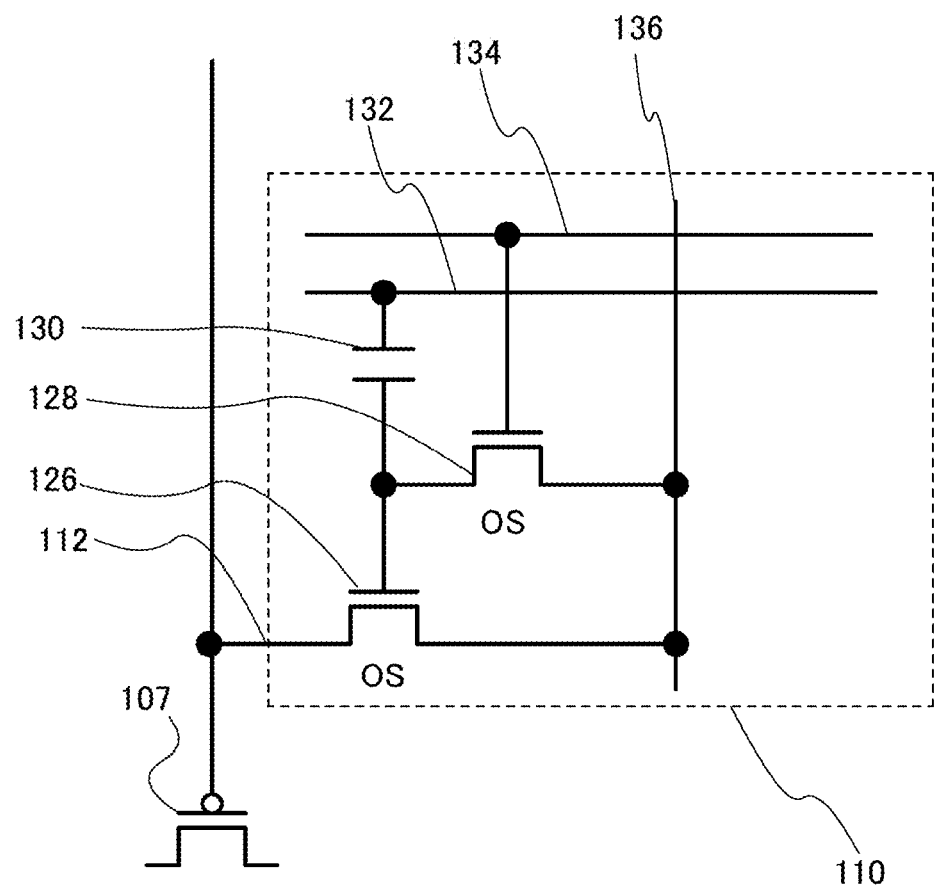
FIG. 38 is a circuit diagram illustrating a semiconductor device according to one embodiment of the present invention.

Although the wiring 136 and the wiring 138 are provided as different wirings here, one embodiment of the present invention is not limited to this example. One wiring can be provided as the wirings 136 and 138, in which case the potential of the wiring is controlled in accordance with the operation state. An example of such a case is illustrated in FIG. 38.

Next, an example of a method for operating the circuit 110 illustrated in FIG. 37, that is, the circuit 110 illustrated in FIG. 39A will be described below.

First, the circuit 110 has operation states described below, for example. However, depending on the circuit configuration of the circuit 101, the operation states may vary. Furthermore, the circuit 110 may have another operation state. Moreover, part of the operation states may be omitted. Note that the steps described below are not necessarily performed in the order described below.

The first step is a step of initializing the circuit 110. This is a step of bringing the circuit 110 to an initial state before inputting a signal to the circuit 110. This step is unnecessary depending on the conditions or the circuit configuration of the circuit 101.

The second step is a step of inputting a signal to the circuit 110. The circuit 110 has a function of holding the input signal.

The third step is a step of initializing the potential of the gate of the transistor 107. This step is unnecessary depending on the circuit configuration of the circuit 101.

The fourth step is a step of outputting a signal from the circuit 110 to the gate of the transistor 107. The transistor 107 has a function of outputting a signal in accordance with the signal output from the circuit 110, that is, the signal stored in the circuit 110.

Next, operation of each step will be described with reference to drawings.

The first step is a step of initializing the circuit 110. As illustrated in FIG. 39B, the transistor 126 is turned off by controlling the potential of the wiring 132. However, this operation might not be necessary if the similar condition is already made.

At this time, in the case where the transistor 126 is of an n-channel type, the potential of the wiring 132 is set low. The potential depends on how many bits of data are to be held in the circuit 110. Conversely, when the potential of the wiring 132 can be widely varied, more data can be held in the circuit 110.

For example, in the case where the transistor 126 includes an oxide semiconductor in its channel portion, the amplitude of the potential of the wiring 132 is 5 V or more, preferably 10 V or more, and further preferably 50 V or more. That is, since the withstand voltage of the transistor 126 is high in the case where the transistor 126 includes an oxide semiconductor in its channel portion, the potential of the wiring 132 can have a large amplitude. Thus, in this operation step, the potential of the wiring 132 is set to the lowest potential of the amplitude. For example, the potential of the wiring 132 is lower than the potential of the gate of the transistor 126 at the time when the transistor 126 is turned on by more than 5 V, preferably more than 10 V, further preferably more than 50 V. For example, when the potential of the wiring 132 is lower than the potential of the gate of the transistor 126 at the time when the transistor 126 is turned on by more than 16 V, by setting the potential of the wiring 132 at 1 V intervals, the circuit 110 can store data of 16 levels (4 bits).

In the circuit diagrams, "OS" is written below a symbol of a transistor that includes an oxide semiconductor in its channel portion. As the transistor illustrated with such a symbol, a transistor including an oxide semiconductor in its channel portion is desirably used; however, a transistor not including an oxide semiconductor in its channel portion may be used as well. Similarly, in the circuit diagrams, "Si" is written below a symbol of a transistor that includes single crystal silicon in its channel portion. As the transistor illustrated with such a symbol, a transistor including single crystal silicon in its channel portion is desirably used; however, a transistor not including single crystal silicon in its channel portion may be used as well.

In channel formation regions of the transistors, an oxide semiconductor can be used, for example; however, one embodiment of the present invention is not limited to this example. For example, depending on cases or conditions, a channel formation region, the vicinity of the channel formation region, a source region, a drain region, or the like may be formed using a material containing Si (silicon), Ge (germanium), SiGe (silicon germanium), GaAs (gallium arsenide), or the like.

Note that a transistor including an oxide semiconductor in its channel portion can have low drain current in an off state (such a current is referred to as leakage current). Thus, data stored in a capacitor can be held for a longer time. For example, the off-state current is $1\times10^{-18}$ A or lower, preferably $1\times10^{-21}$ A or lower, further preferably $1\times10^{-24}$ A or lower at room temperature (approximately 25° C.), or $1\times10^{-15}$ A or lower, preferably $1\times10^{-18}$ A or lower, further preferably $1\times10^{-21}$ A or lower at 85° C.

To further increase the withstand voltage of the transistor including an oxide semiconductor in its channel portion, a thick gate insulator with a thickness of 5 nm or more, preferably 7 nm or more, further preferably 10 nm or more may be used, for example. Furthermore, a semiconductor with an energy gap of greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV may be used in a channel formation region.

As the oxide semiconductor in the transistor including an oxide semiconductor in its channel portion, a c-axis-aligned crystalline oxide semiconductor (CAAC-OS) described later may be used. A CAAC-OS is an oxide semiconductor having a plurality of c-axis aligned crystal parts. It is particularly preferable that the proportion of CAAC, which is described below, be increased. The proportion of CAAC is the proportion of a region where a diffraction pattern of CAAC-OS is observed in a predetermined area. By increasing the proportion of CAAC, defects can be reduced, for example. Furthermore, carrier scattering can be reduced, for example. Moreover, a CAAC-OS with few impurities can be achieved, so that an extremely small off current characteristics can be achieved, for example. For example, a high-quality CAAC-OS has a proportion of CAAC of higher than or equal to 50%, preferably higher than or equal to 80%, further preferably higher than or equal to 90%, still further preferably higher than or equal to 95%.

Note that it is effective to reduce the concentration of impurities in the oxide semiconductor to make the oxide semiconductor intrinsic or substantially intrinsic. The term "substantially intrinsic" refers to the state where an oxide semiconductor has a carrier density lower than $1\times10^{17}/cm^3$, preferably lower than $1\times10^{15}/cm^3$, further preferably lower than $1\times10^{13}/cm^3$. In the oxide semiconductor, hydrogen, nitrogen, carbon, silicon, and a metal element other than main components are impurities. For example, hydrogen and nitrogen form donor levels to increase the carrier density.

A transistor including a substantially intrinsic oxide semiconductor has a low carrier density and thus rarely has negative threshold voltage. In addition, because of few carrier traps in the oxide semiconductor, the transistor including the oxide semiconductor has small variation in electrical characteristics and high reliability. Moreover, a transistor including the oxide semiconductor enables an extremely low off-state current.

For example, the drain current at the time when the transistor including an oxide semiconductor is in an off state can be $1\times10^{-18}$ A or lower, preferably $1\times10^{-21}$ A or lower, further preferably $1\times10^{-24}$ A or lower at room temperature (approximately 25° C.), or $1\times10^{-15}$ A or lower, preferably $1\times10^{-18}$ A or lower, further preferably $1\times10^{-21}$ A or lower at 85° C. Note that an off state of an n-channel transistor refers to a state where the gate voltage is lower than the threshold voltage. Specifically, the transistor is in an off state when the gate voltage is lower than the threshold voltage by 1V or more, 2V or more, or 3V or more.

Next, the second step is a step of inputting a signal to the circuit 110. First, as illustrated in FIG. 39C, the transistor 128 is turned on by controlling the potential of the wiring 134. Then, a signal is input to a gate of the transistor 126 via the wiring 138. The circuit 110 stores the signal input at this time.

The potential of the wiring 138 at this time is controlled in accordance with the amplitude of the potential of the wiring 132. The potential of the wiring 138 corresponds to the data stored in the circuit 110. That is, the potential of the wiring 138 is the potential that makes the transistor 126 in an on state when the potential of the wiring 132 is changed to a predetermined potential. That is, the value stored in the circuit 110 depends on the state in which the transistor 126 is turned on. Thus, in the case where the amplitude of the potential of the wiring 132 is large, the amplitude of the potential of the wiring 138 becomes large accordingly.

Assuming that the threshold voltage of the transistor 126 is 0 V, when the amplitude of the potential of the wiring 132 is 16 V for example, the amplitude of the potential of the wiring 138 is also 16 V. In addition, the lowest potential of the wiring 138 is, for example, close to or a little higher than the lowest potential of the wiring 132.

Figure 39A:
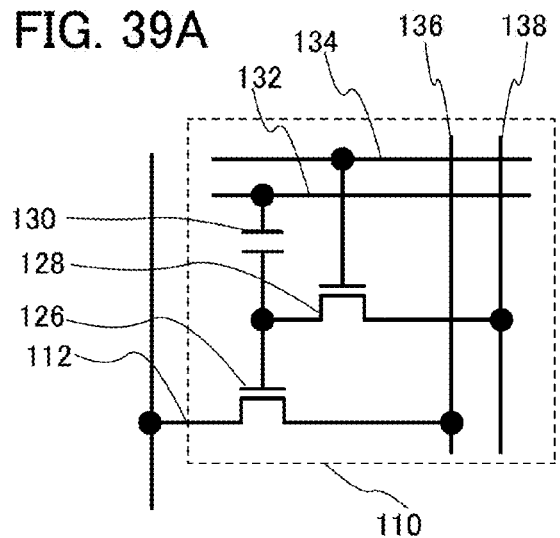
FIGS. 39A to 39D illustrate an operation of a semiconductor device according to one embodiment of the present invention.
Figure 39B:
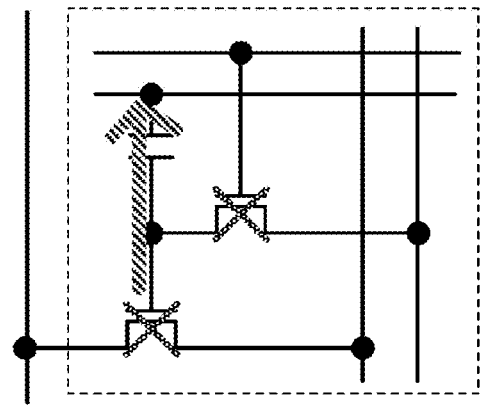
Figure 39C:
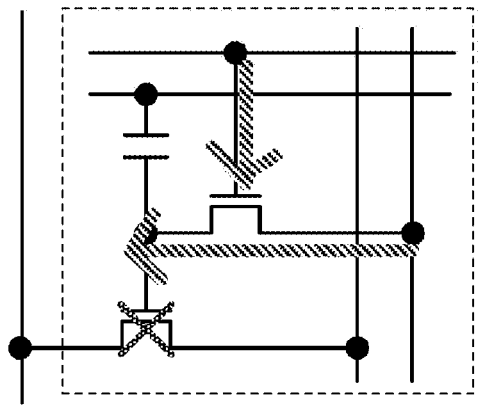
Figure 39D:
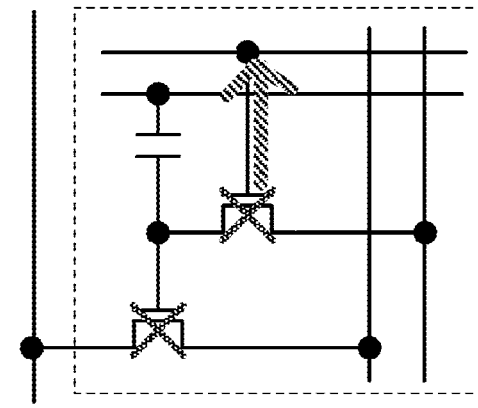

Then, as illustrated in FIG. 39D, the transistor 128 is turned off.

Next, the third step is a step of initializing the potential of the gate of the transistor 107. This corresponds to the operation of the circuit 110 in FIG. 12B, FIG. 12E, FIG. 13B, FIG. 15B, FIG. 16B, FIG. 17B, FIG. 18B, FIG. 31B, FIG. 31E, FIG. 32B, FIG. 33B, or the like. Thus, this step might not be performed depending on the configuration of the circuit 101.

Figure 40A:
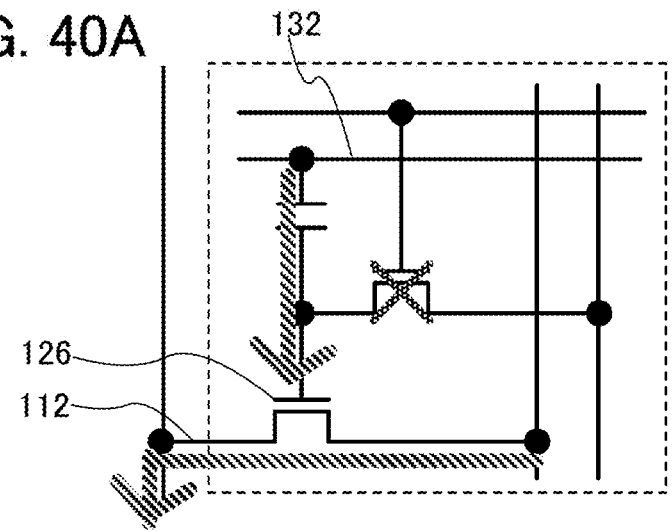
FIGS. 40A and 40B illustrate an operation of a semiconductor device according to one embodiment of the present invention.
Figure 40B:
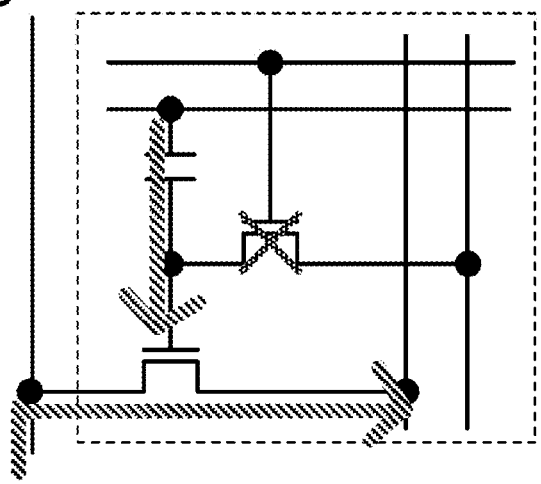

First, as illustrated in FIG. 40A, the transistor 126 is turned on by controlling the potential of the wiring 132. Data is stored in the gate of the transistor 126, in some cases. In accordance with the data, the potential of the gate of the transistor 126 varies, in some cases. Irrespective of the potential of the gate of the transistor 126, the transistor 126 is turned on by controlling the potential of the wiring 132. Consequently, a potential of the wiring 136 is supplied to the terminal 112. At this time, depending on the polarity of the transistor 107 or the like, current flows from the wiring 136 toward the terminal 112 as illustrated in FIG. 40A or from the terminal 112 toward the wiring 136 as illustrated in FIG. 40B.

Next, the fourth step is a step of outputting the signal from the circuit 110 to the gate of the transistor 107. This corresponds to the operation of the circuit 110 in FIG. 12C, FIG. 12D, FIG. 12F, FIG. 13A, FIG. 14C, FIG. 14D, FIG. 14F, FIG. 15A, FIG. 16C, FIG. 16D, FIG. 17C, FIG. 17D, FIG. 19C, FIG. 19D, FIG. 20C, FIG. 20D, FIG. 31C, FIG. 31D, FIG. 32C, FIG. 32D, FIG. 34C, FIG. 34D, FIG. 35C, FIG. 35D, or the like.

Figure 41A:
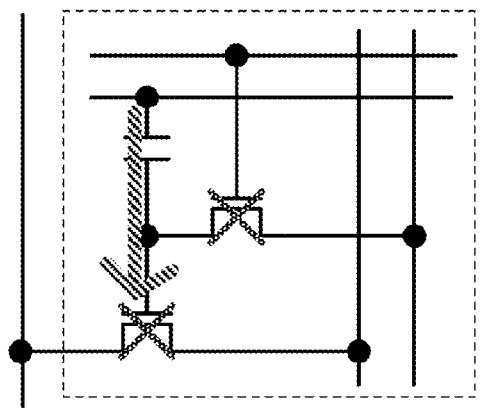
FIGS. 41A to 41D illustrate an operation of a semiconductor device according to one embodiment of the present invention.
Figure 41B:
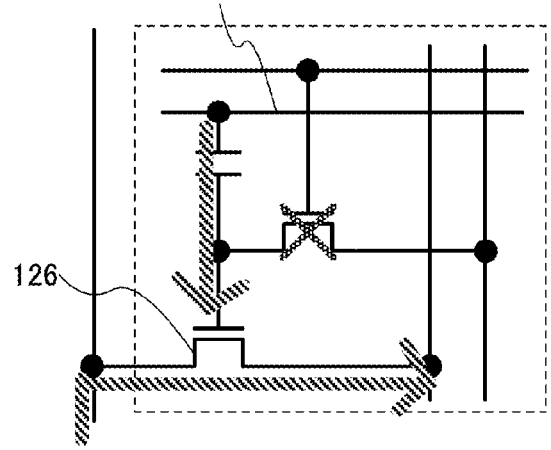
Figure 41C:
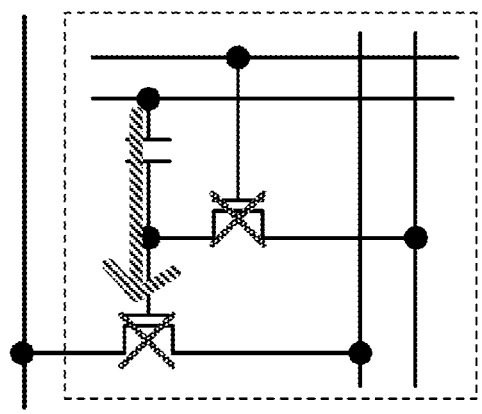
Figure 41D:
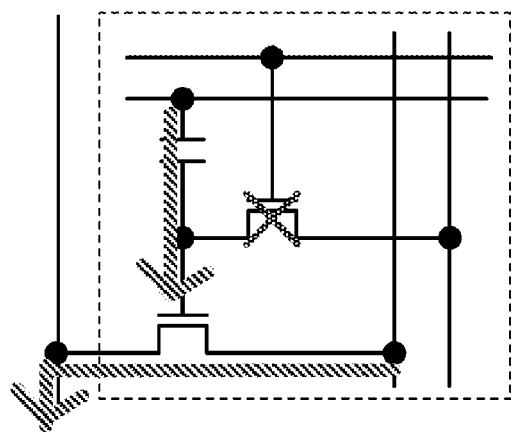

First, as illustrated in FIG. 41A or FIG. 41B, the potential of the wiring 132 is controlled. Consequently, depending on the data stored in the circuit 110, the transistor 126 is turned on or off. If the transistor 126 is on, the potential of the wiring 138 can be supplied to the terminal 112. For example, in the case where the transistor 107 is of a p-channel type, a current flows from the terminal 112 toward the wiring 136, lowering the potential of the terminal 112. As a result, the transistor 107 is turned on. In the case where the transistor 107 is of an n-channel type, a current flows from the wiring 136 toward the terminal 112 as illustrated in FIG. 41C or FIG. 41D.

That is, in some cases, the wiring 132 has a function as a word line depending on the configuration of the circuit 101. By controlling the potential of the wiring 132, a plurality of circuits 101 (or one of a plurality of circuits 110 included in the circuits 101) connected to the wiring 132, for example, the circuits 101 arranged in one row (or one of a plurality of circuits 110 included in the circuits 101) can be selected.

Figure 42A:
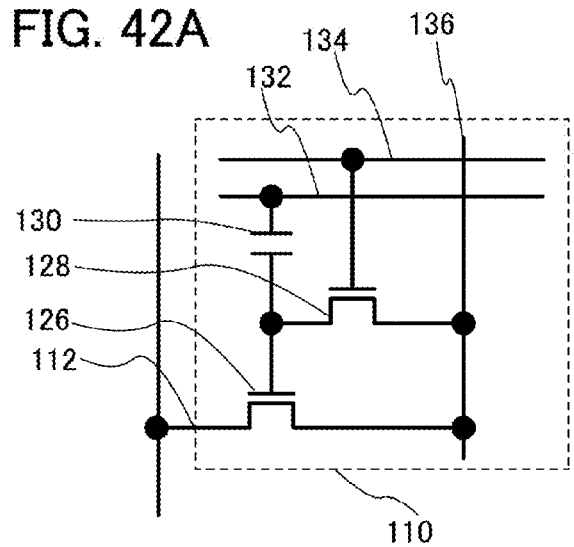
FIGS. 42A to 42D illustrate an operation of a semiconductor device according to one embodiment of the present invention.
Figure 42B:
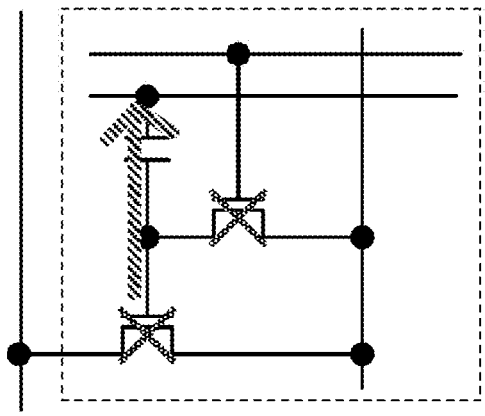
Figure 42C:
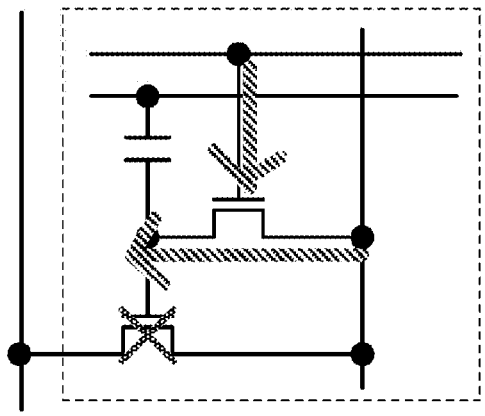
Figure 42D:
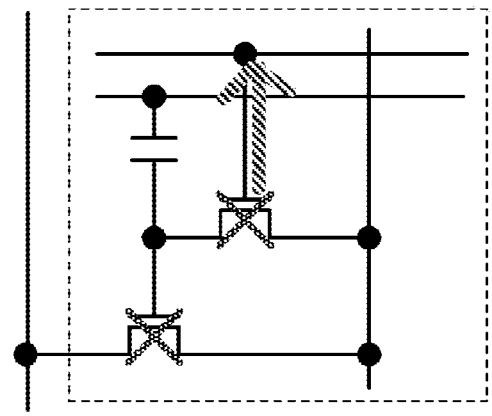
Figure 43A:
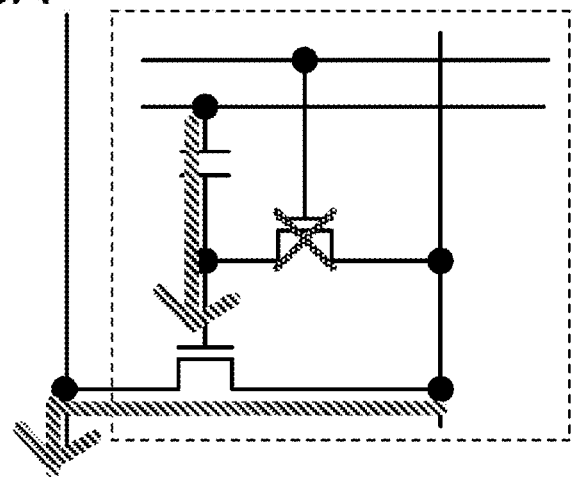
FIGS. 43A and 43B illustrate an operation of a semiconductor device according to one embodiment of the present invention.
Figure 43B:
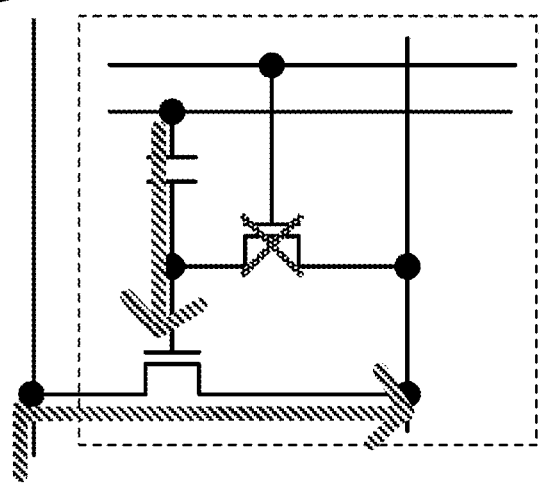
Figure 44A:
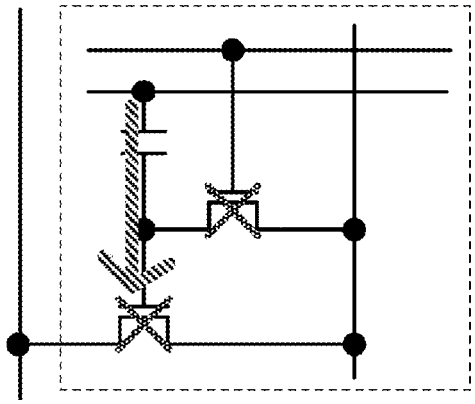
FIGS. 44A to 44D illustrate an operation of a semiconductor device according to one embodiment of the present invention.
Figure 44B:
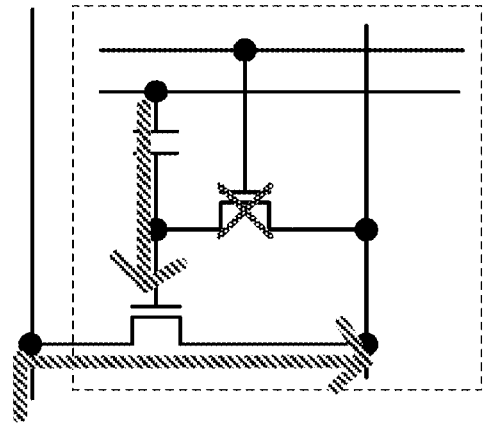
Figure 44C:
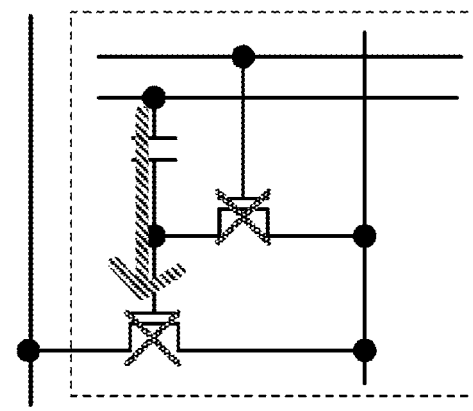
Figure 44D:
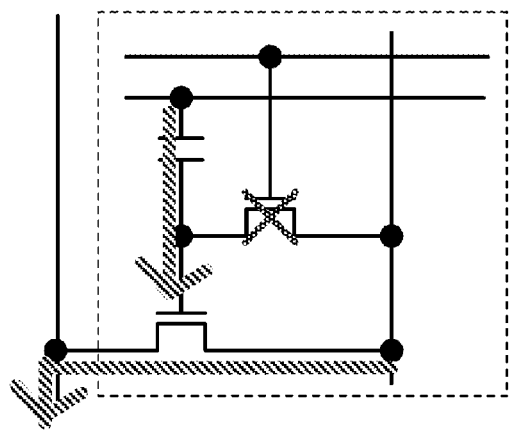

Although the method for operating the circuit 110 in FIG. 37, that is, in FIG. 39A has been described so far, the circuit 110 in FIG. 38, that is, in FIG. 42A can be similarly operated. The drawings corresponding to FIGS. 39A to 39D are illustrated in FIGS. 42A to 42D, the drawings corresponding to FIGS. 40A and 40B are illustrated in FIGS. 43A and 43B, and the drawings corresponding to FIGS. 41A to 41D are illustrated in FIGS. 44A to 44D. In FIGS. 42A to 42D, FIGS. 43A and 43B, and FIGS. 44A to 44D, the wiring 136 also functions as the wiring 138. Accordingly, the potential of the wiring 136 is changed between when the transistor 128 is on and when the transistor 126 is on.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 6)

In this embodiment, an example of a memory device in which a plurality of circuits 110 are arranged will be described.

Figure 45:
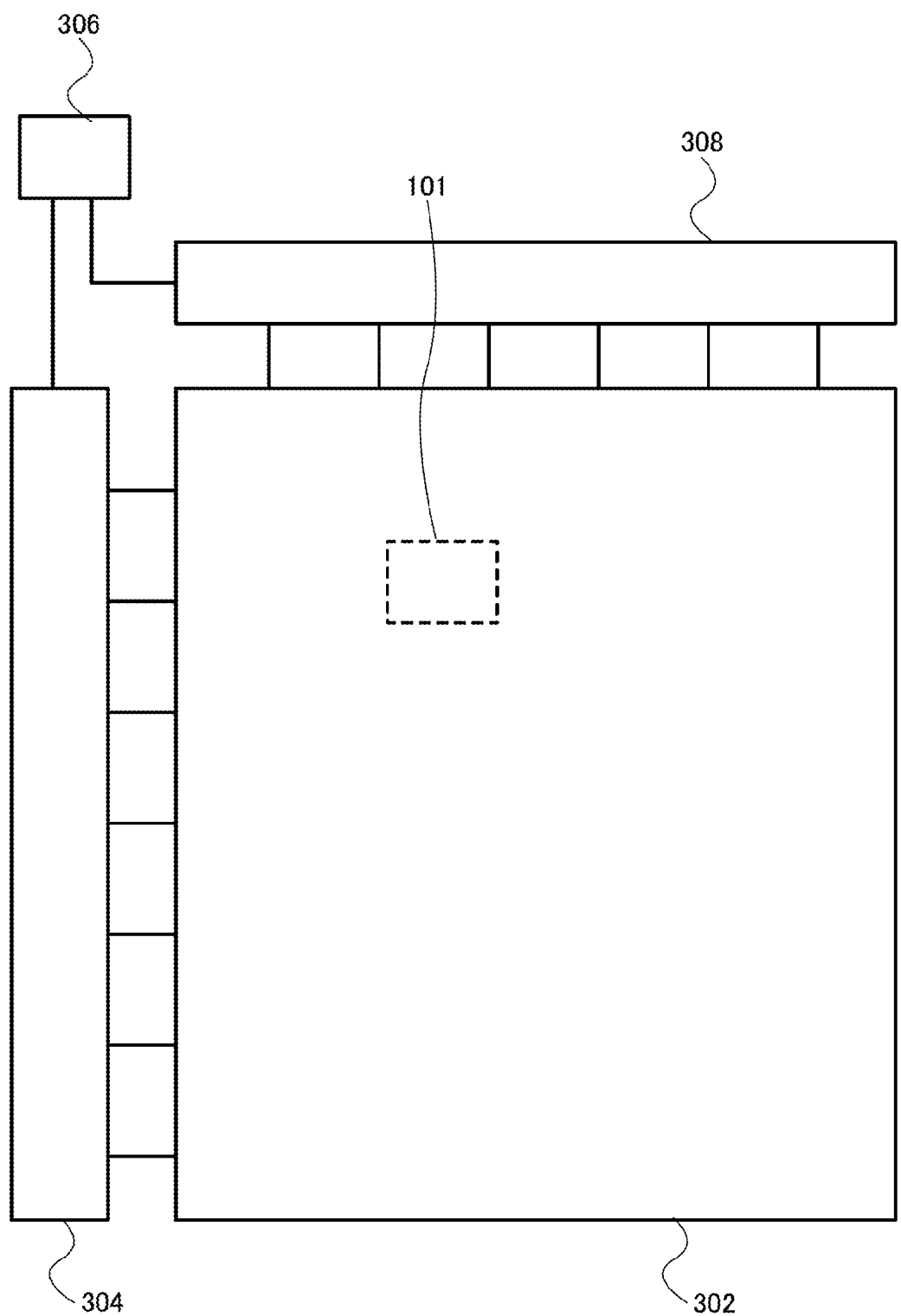
FIG. 45 is a circuit diagram of a semiconductor device according to one embodiment of the present invention.

FIG. 45 illustrates a configuration of a memory device. A plurality of circuits 101 are arranged in a matrix in a circuit 302.

A circuit 304 is connected to, for example, the circuit 302. The circuit 304 can control the potential of a wiring that functions as a word line, for example. That is, the circuit 304 has a function of selecting the circuits 101 in each row. For example, the circuit 304 includes a shift register, a decoder, or the like.

A circuit 308 is connected to the circuit 302, for example. The circuit 308 has a function of reading a signal output from a wiring that functions as a bit line, for example. Furthermore, the circuit 308 can control the potential of the wiring that functions as a bit line, for example. The circuit 308 includes a sense amplifier, for example.

In the case where the circuit 308 or the circuit 304 includes an inverter circuit, a NAND circuit, a NOR circuit, an analog circuit, or the like, a transistor including an oxide semiconductor in its channel region may be used as an n-channel transistor, and a transistor including a single crystal semiconductor (e.g., silicon, gallium, and arsenic) in its channel region may be used as a p-channel transistor, for example. In this way, a transistor including an oxide semiconductor in its channel region can be stacked over a transistor including a single crystal semiconductor (e.g., silicon, gallium, and arsenic) in its channel region. As a result, the layout area can be reduced. Note that one embodiment of the present invention is not limited to this example. Also in the circuit 101, a transistor including an oxide semiconductor in its channel region may be used as an n-channel transistor, and a transistor including a single crystal semiconductor (e.g., silicon, gallium, and arsenic) in its channel region may be used as a p-channel transistor. In this way, a transistor including an oxide semiconductor in its channel region can be stacked over a transistor including a single crystal semiconductor (e.g., silicon, gallium, and arsenic) in its channel region. As a result, the layout area can be reduced. Note that one embodiment of the present invention is not limited to this example.

A circuit 306 is connected to the circuit 304, for example. The circuit 306 is connected to the circuit 308, for example. The circuit 306 has a function of supplying a start pulse signal, a clock signal, or the like to the circuit 304 or the circuit 308, for example. That is, the circuit 306 has a function as a controller.

Figure 46:
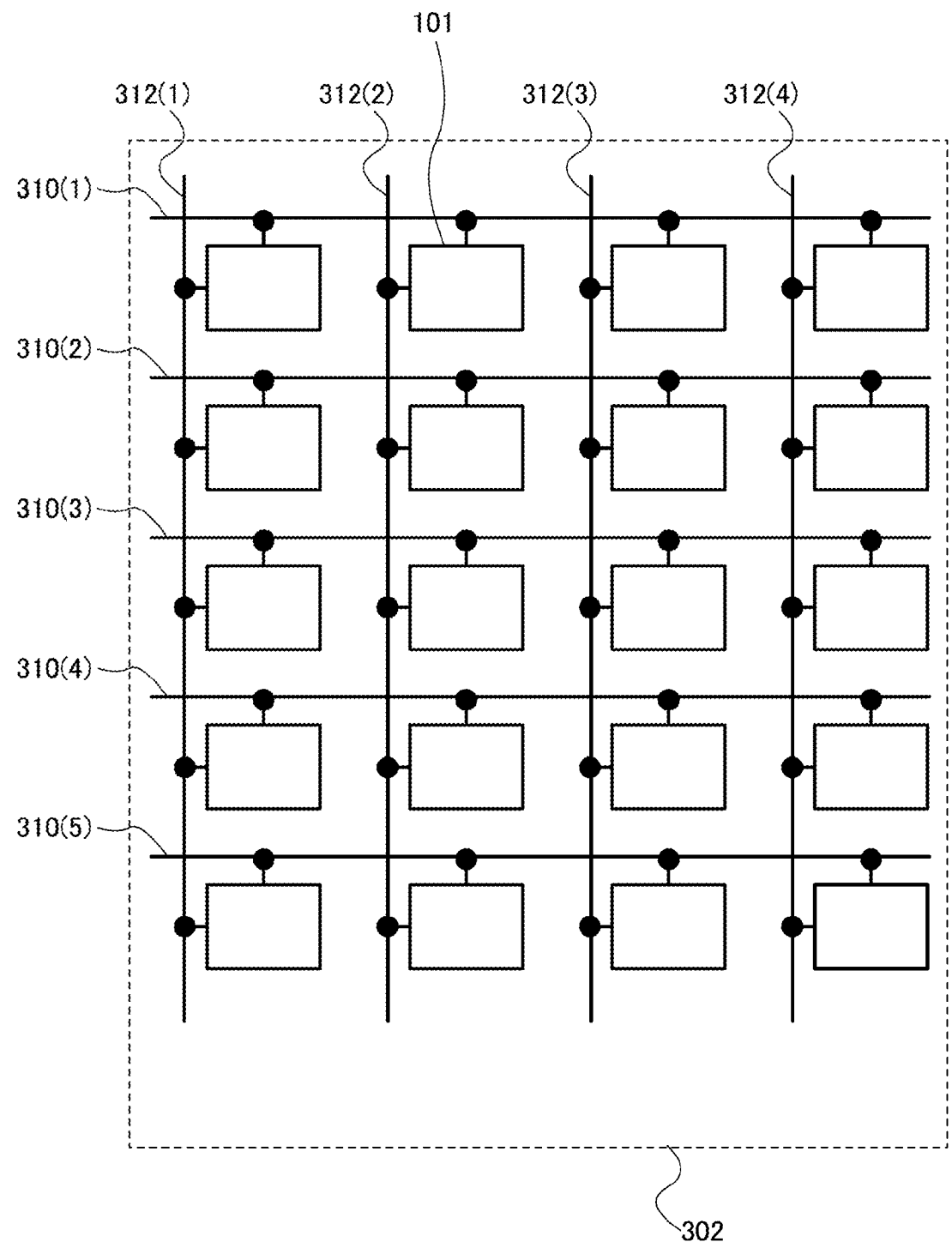
FIG. 46 is a circuit diagram of a semiconductor device according to one embodiment of the present invention.

Next, an example of the configuration of the circuit 302 is illustrated in FIG. 46.

For example, wirings 310 extend in the lateral direction (from side to side). That is, a wiring 310(1), a wiring 310(2), a wiring 310(3), a wiring 310(4), a wiring 310(5), and the like are arranged in rows. These wirings function as word lines, for example.

Figure 47:
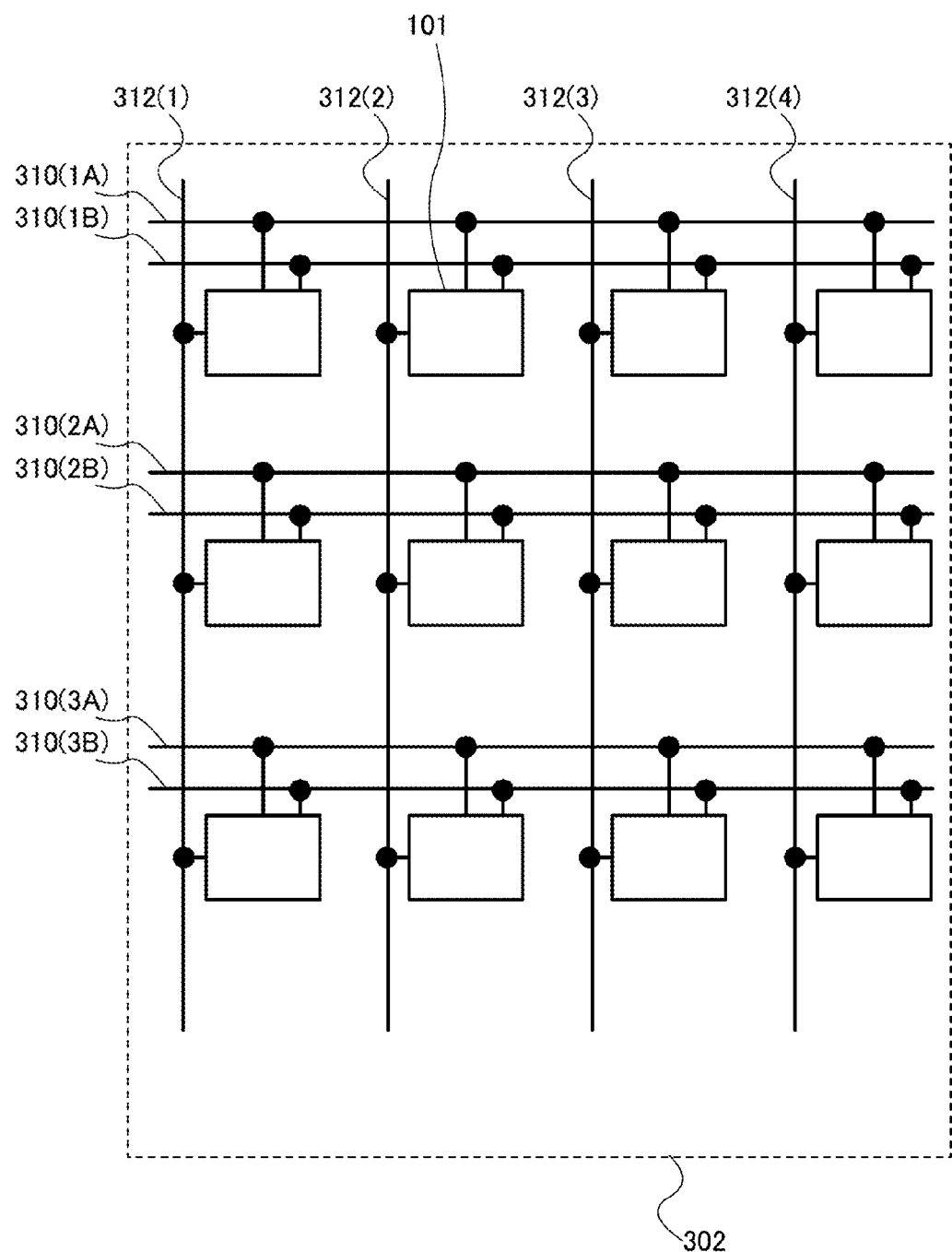
FIG. 47 is a circuit diagram of a semiconductor device according to one embodiment of the present invention.

Note that a plurality of wirings are connected to one circuit 101 in some cases. For example, as illustrated in FIG. 47, a wiring 310(1A), a wiring 310(1B), a wiring 310(2A), a wiring 310(2B), a wiring 310(3A), a wiring 310(3B), and the like are arranged.

For example, wirings 312 extend in the vertical direction (from top to bottom). That is, a wiring 312(1), a wiring 312(2), a wiring 312(3), a wiring 312(4), and the like are arranged in columns. These wirings function as bit lines, for example.

Note that a plurality of wirings 312 are connected to one circuit 101 in some cases.

Figure 48:
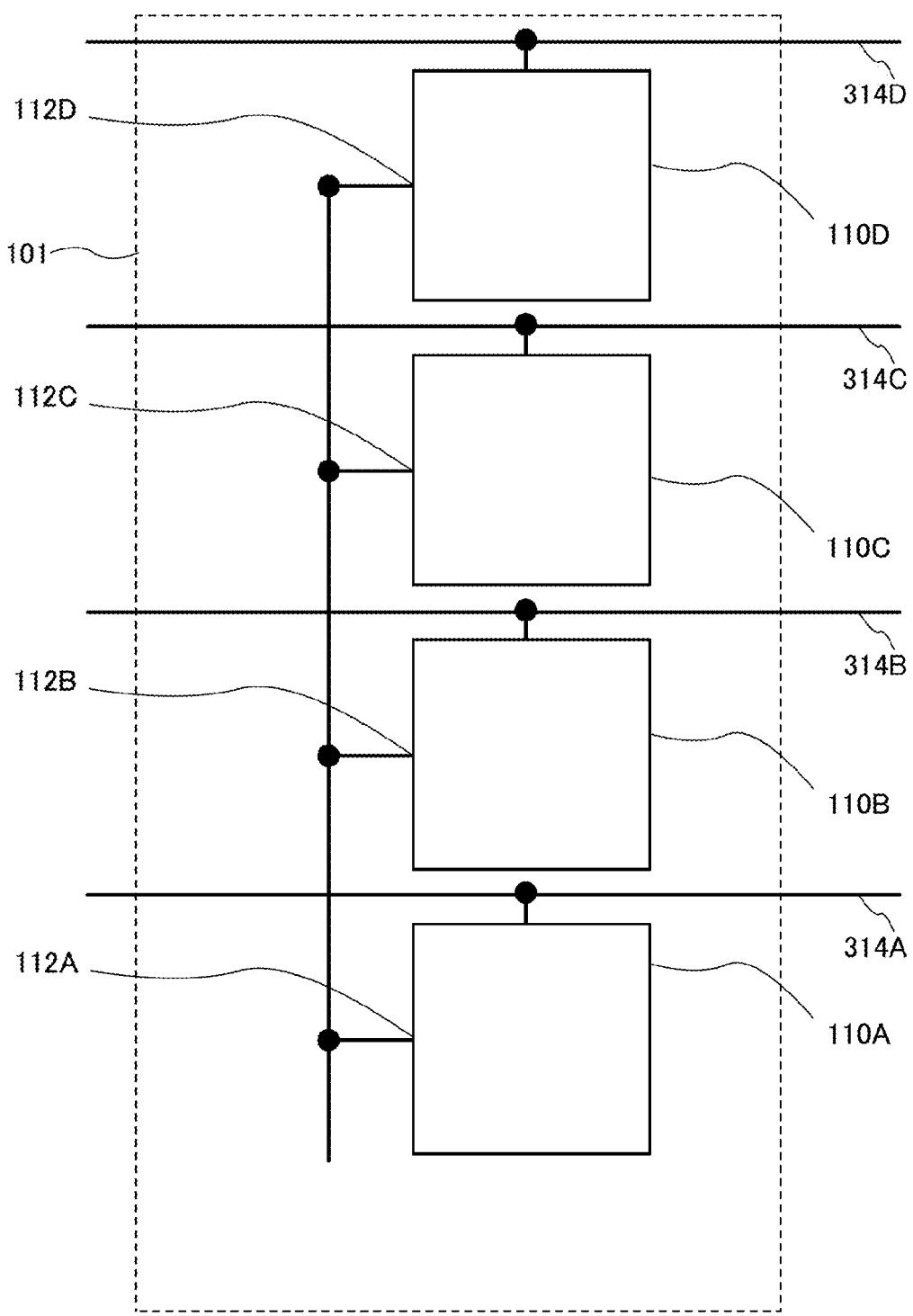
FIG. 48 is a circuit diagram of a semiconductor device according to one embodiment of the present invention.
Figure 49:
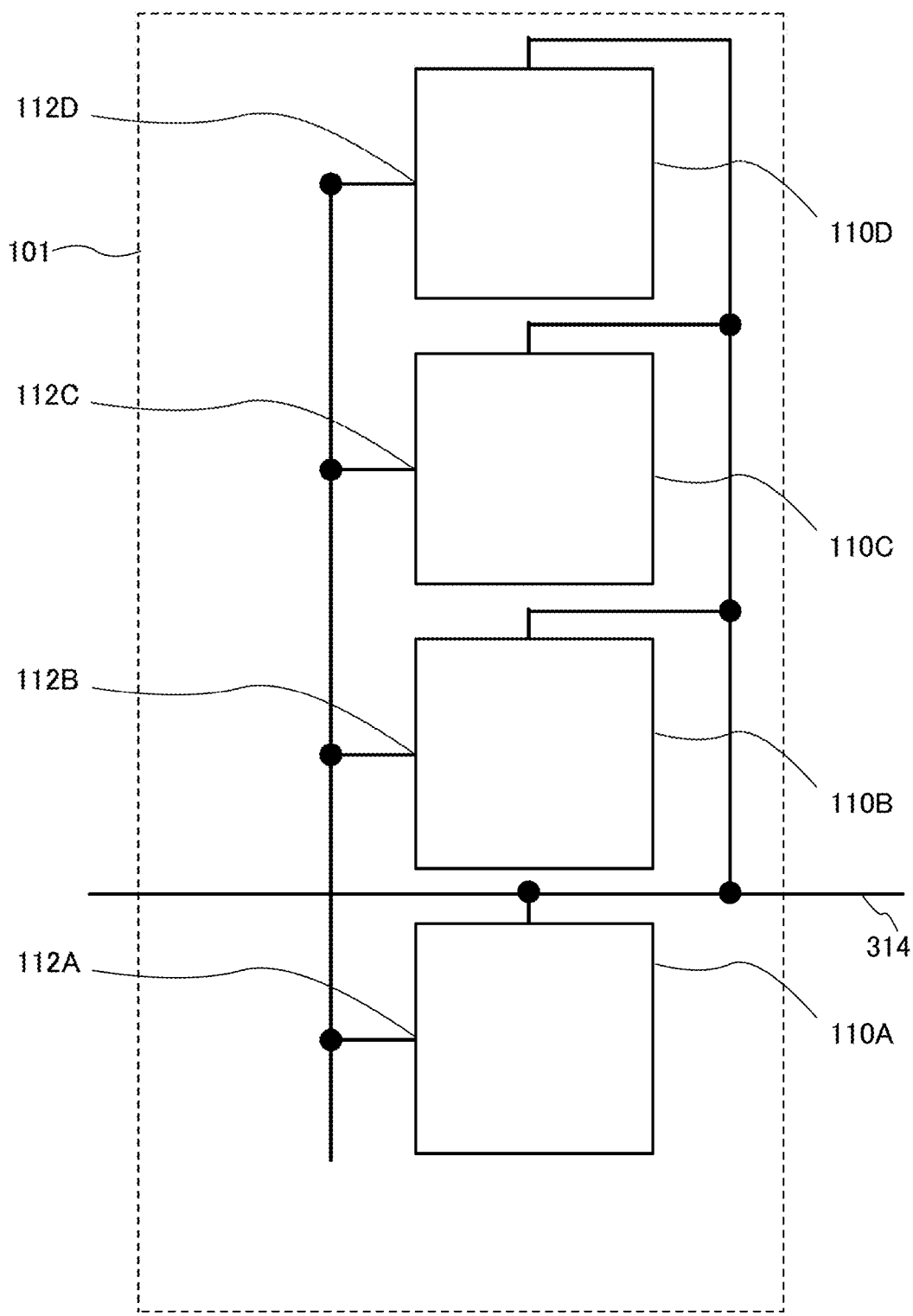
FIG. 49 is a circuit diagram of a semiconductor device according to one embodiment of the present invention.

Next, an example of connection between wirings extending in the lateral direction (from side to side) and the circuits 110 in one circuit 101 is illustrated in FIG. 48. For example, the circuit 110A is connected to a wiring 314A, the circuit 110B is connected to a wiring 314B, the circuit 110C is connected to a wiring 314C, and the circuit 110D is connected to a wiring 314D. That is, each circuit 110 is connected to a different wiring 314. The wirings 314 have a function as word lines, for example. The wirings 314 correspond to various wirings included in the circuits 110 or various wirings connected to the circuits 110. Note that one embodiment of the present invention is not limited to this example. For example, as illustrated in FIG. 49, a plurality of circuits 110 may be connected to one wiring 314.

Figure 50:
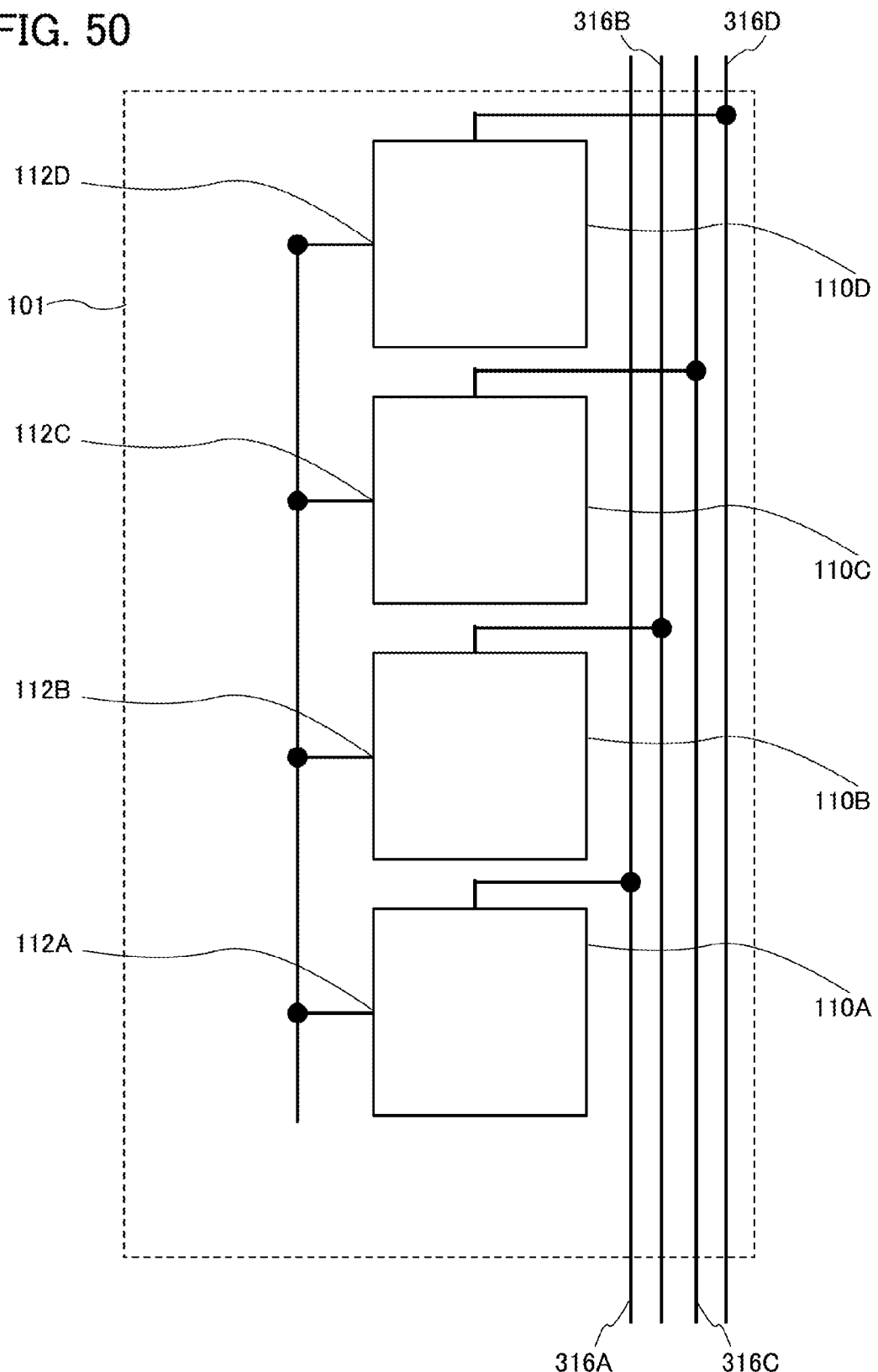
FIG. 50 is a circuit diagram of a semiconductor device according to one embodiment of the present invention.
Figure 51:
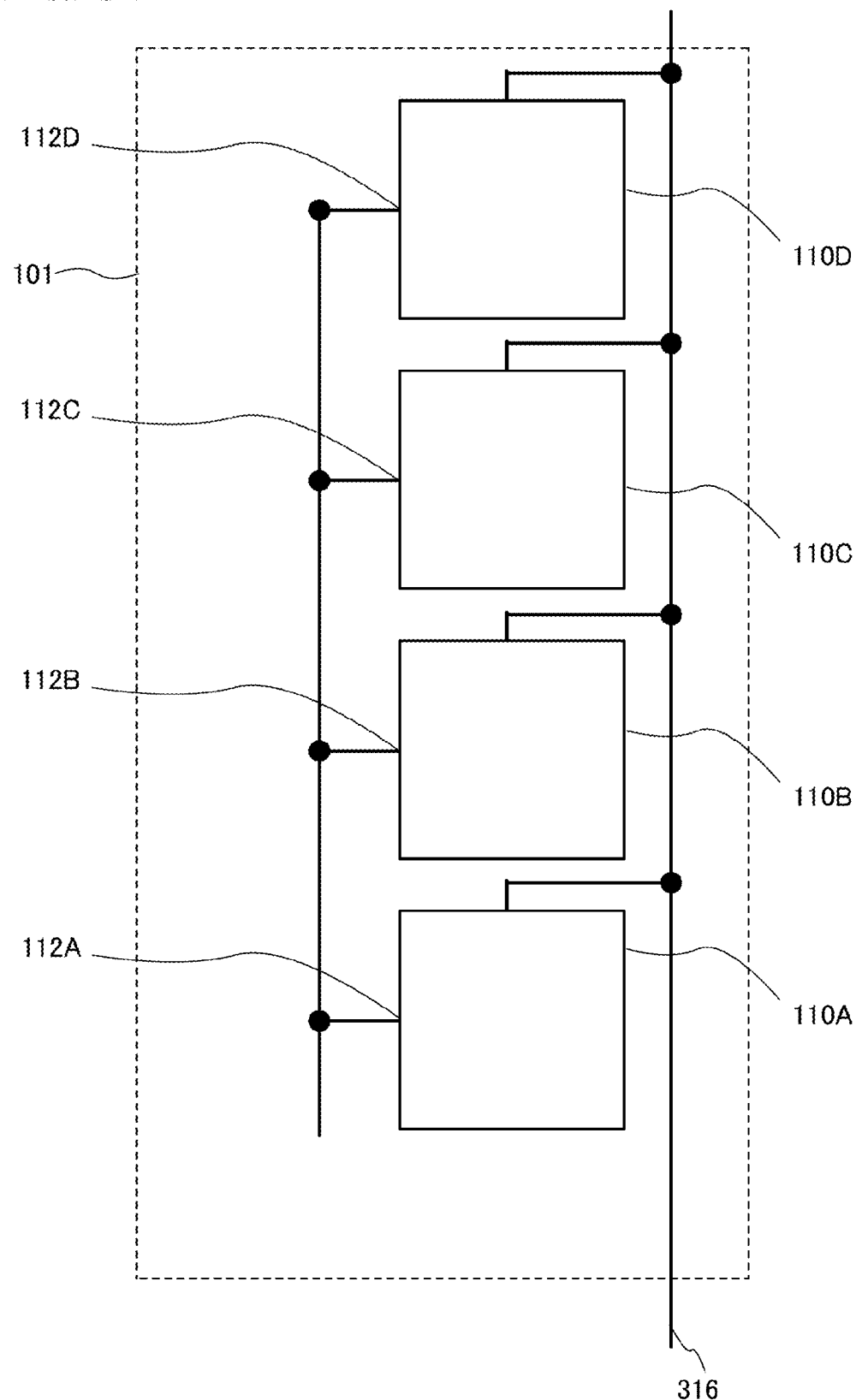
FIG. 51 is a circuit diagram of a semiconductor device according to one embodiment of the present invention.
Figure 52:
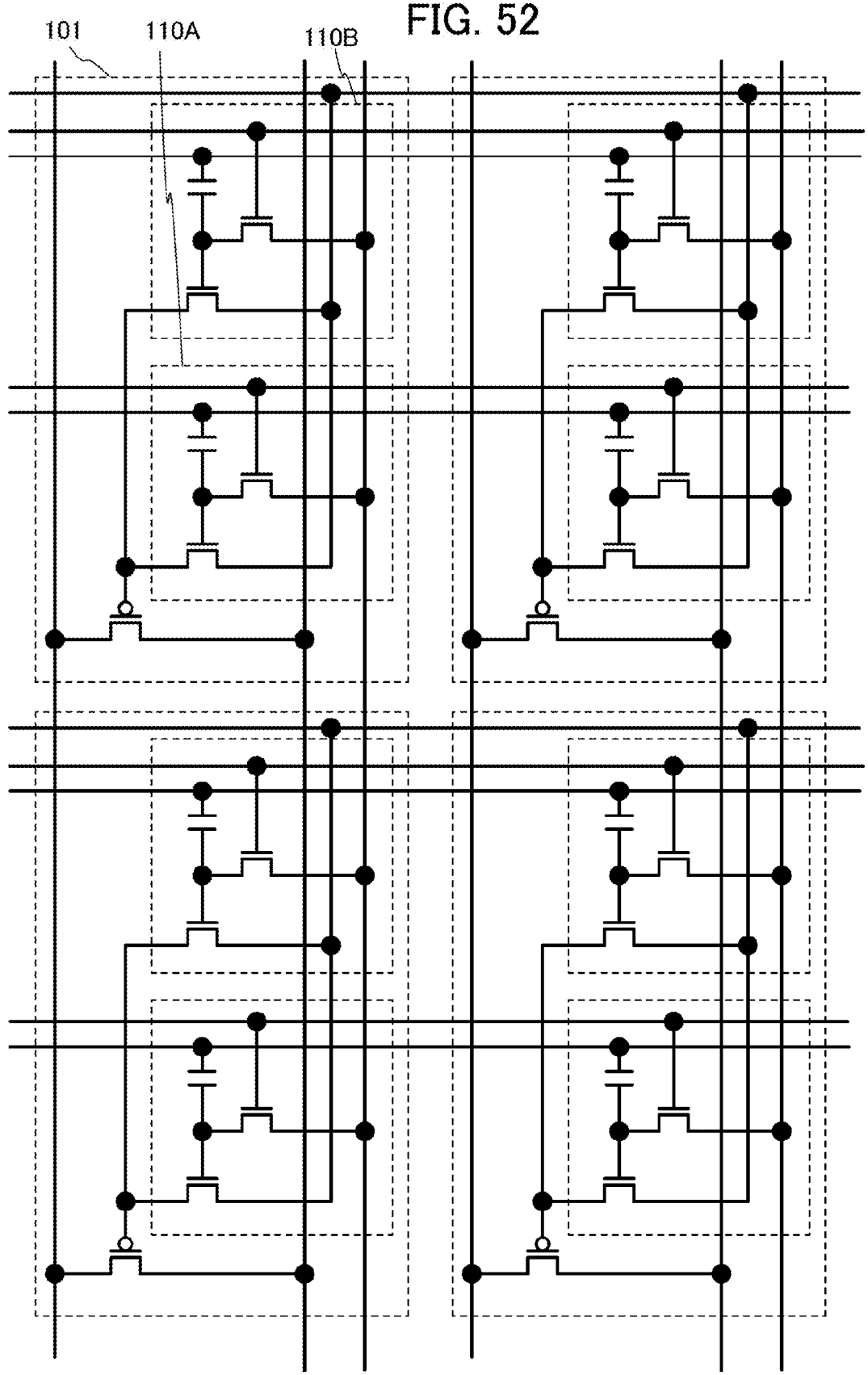
FIG. 52 is a circuit diagram of a semiconductor device according to one embodiment of the present invention.
Figure 53:
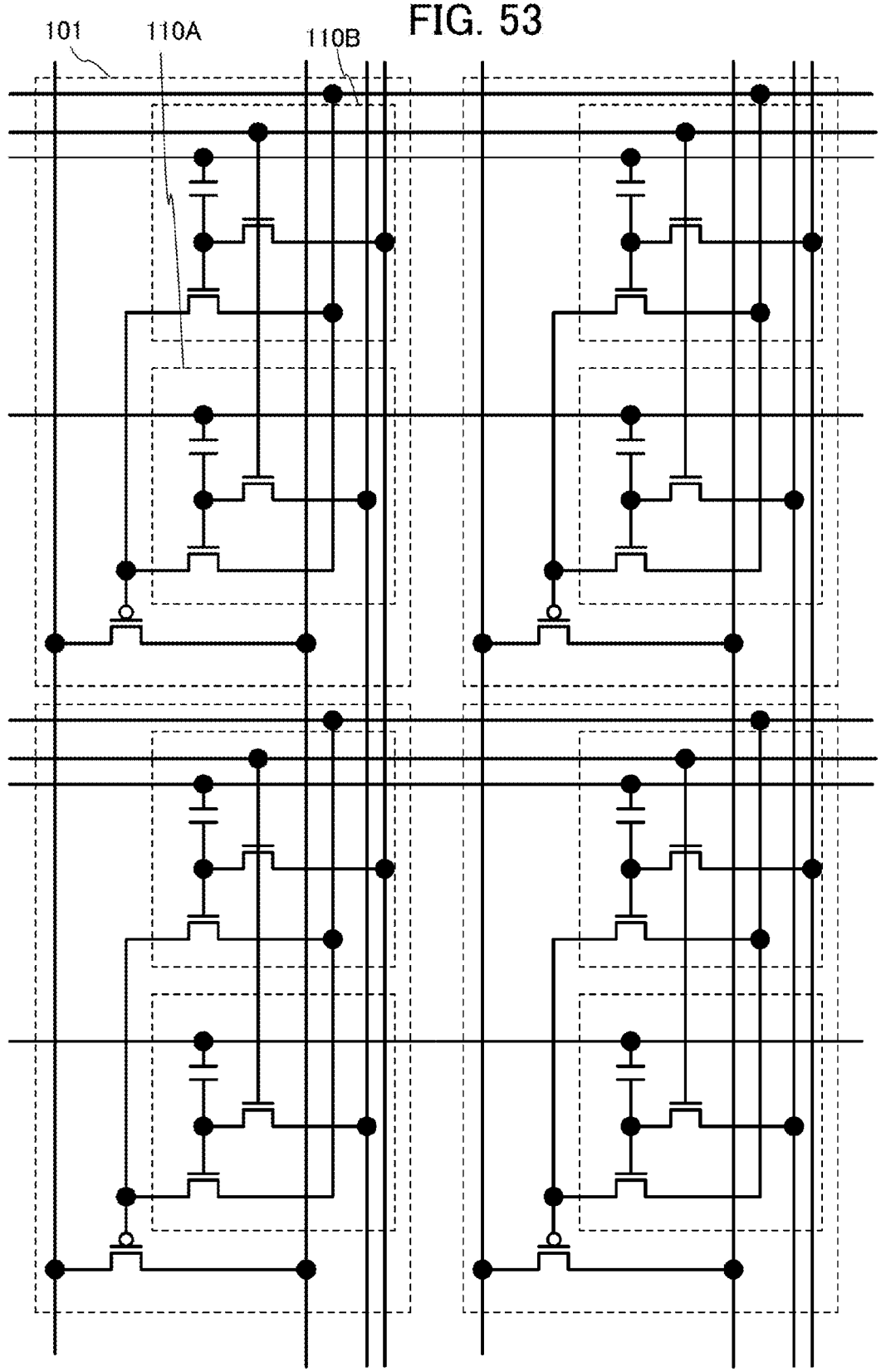
FIG. 53 is a circuit diagram of a semiconductor device according to one embodiment of the present invention.
Figure 54:
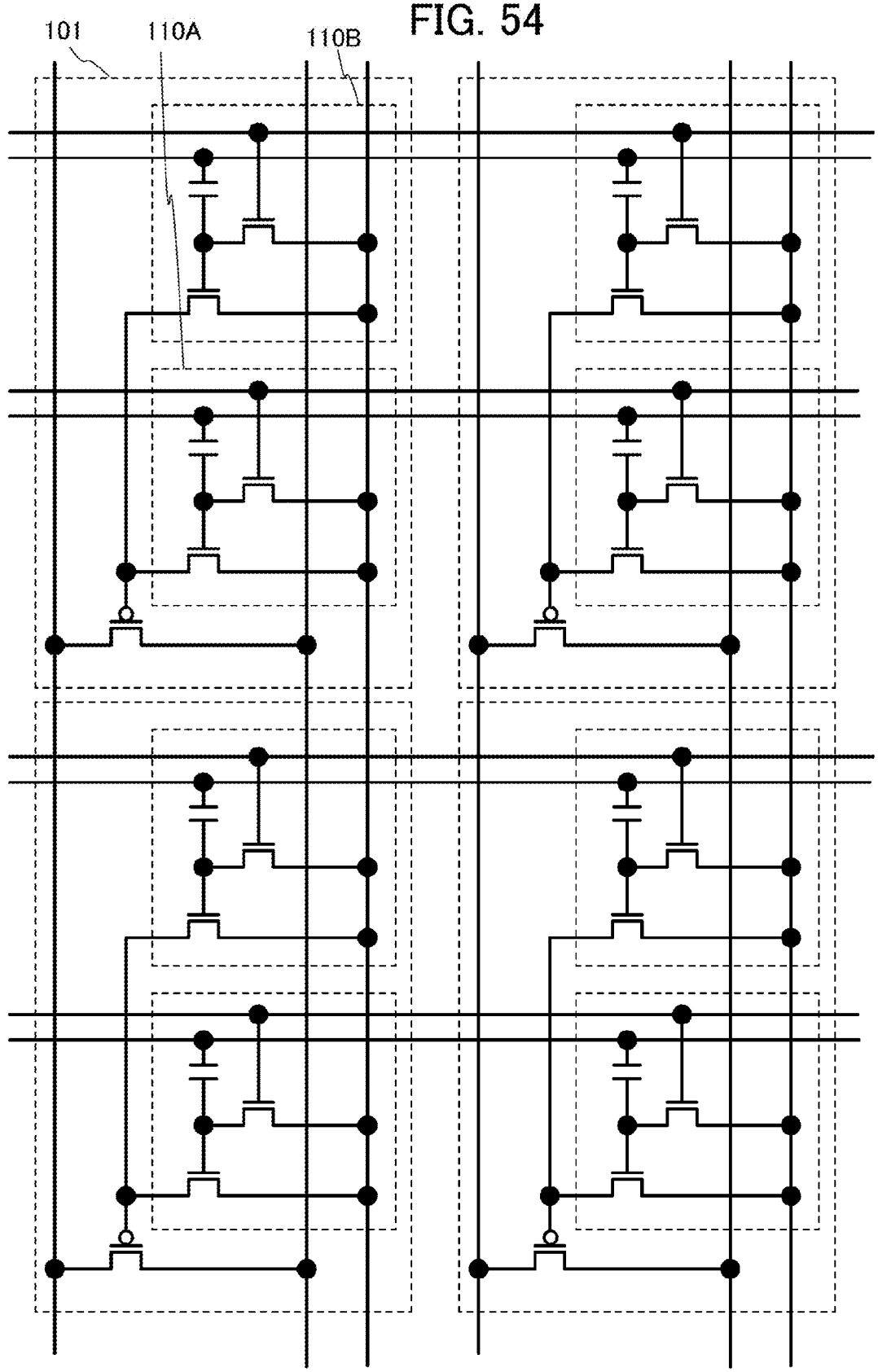
FIG. 54 is a circuit diagram of a semiconductor device according to one embodiment of the present invention.
Figure 55:
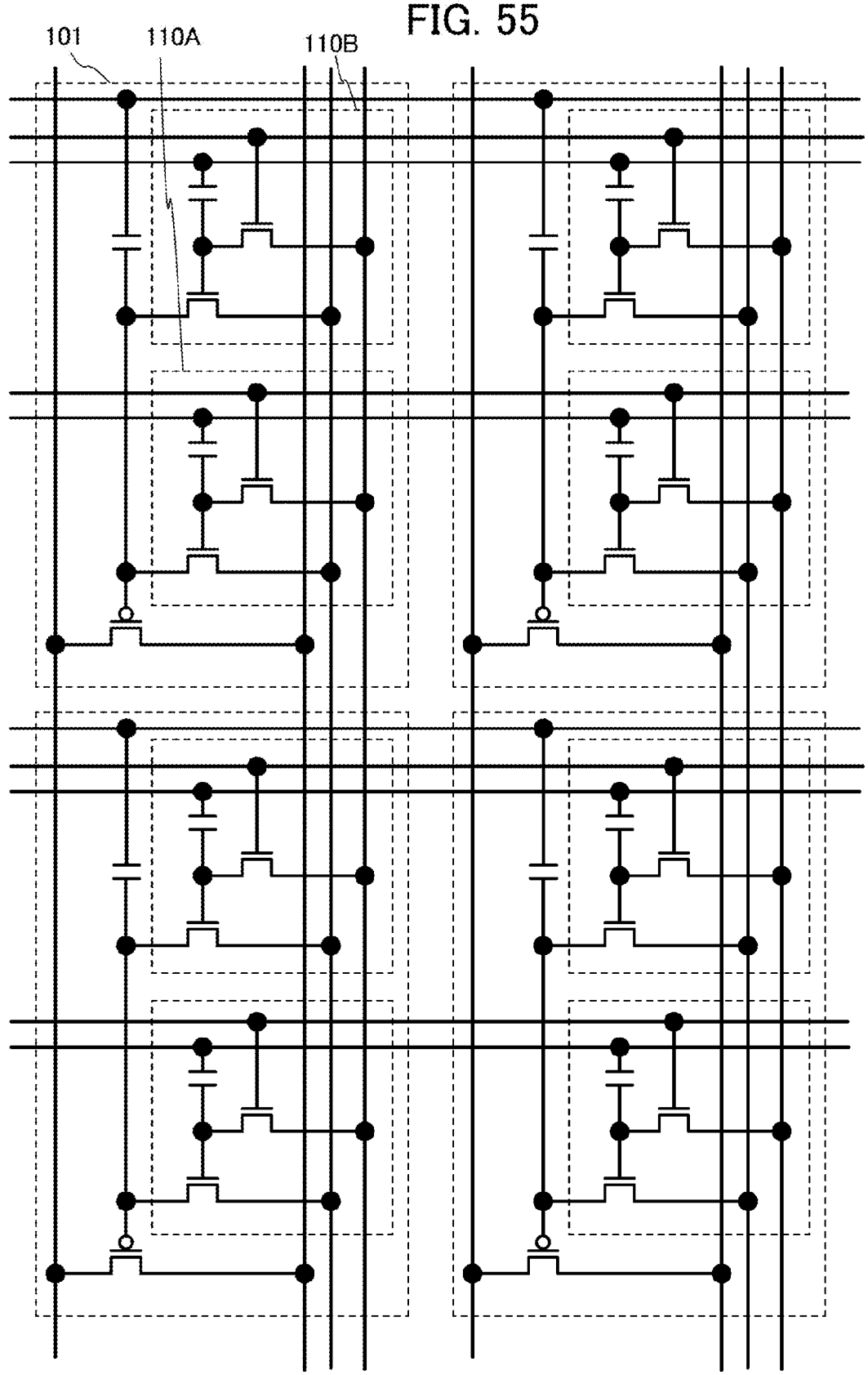
FIG. 55 is a circuit diagram of a semiconductor device according to one embodiment of the present invention.
Figure 56:
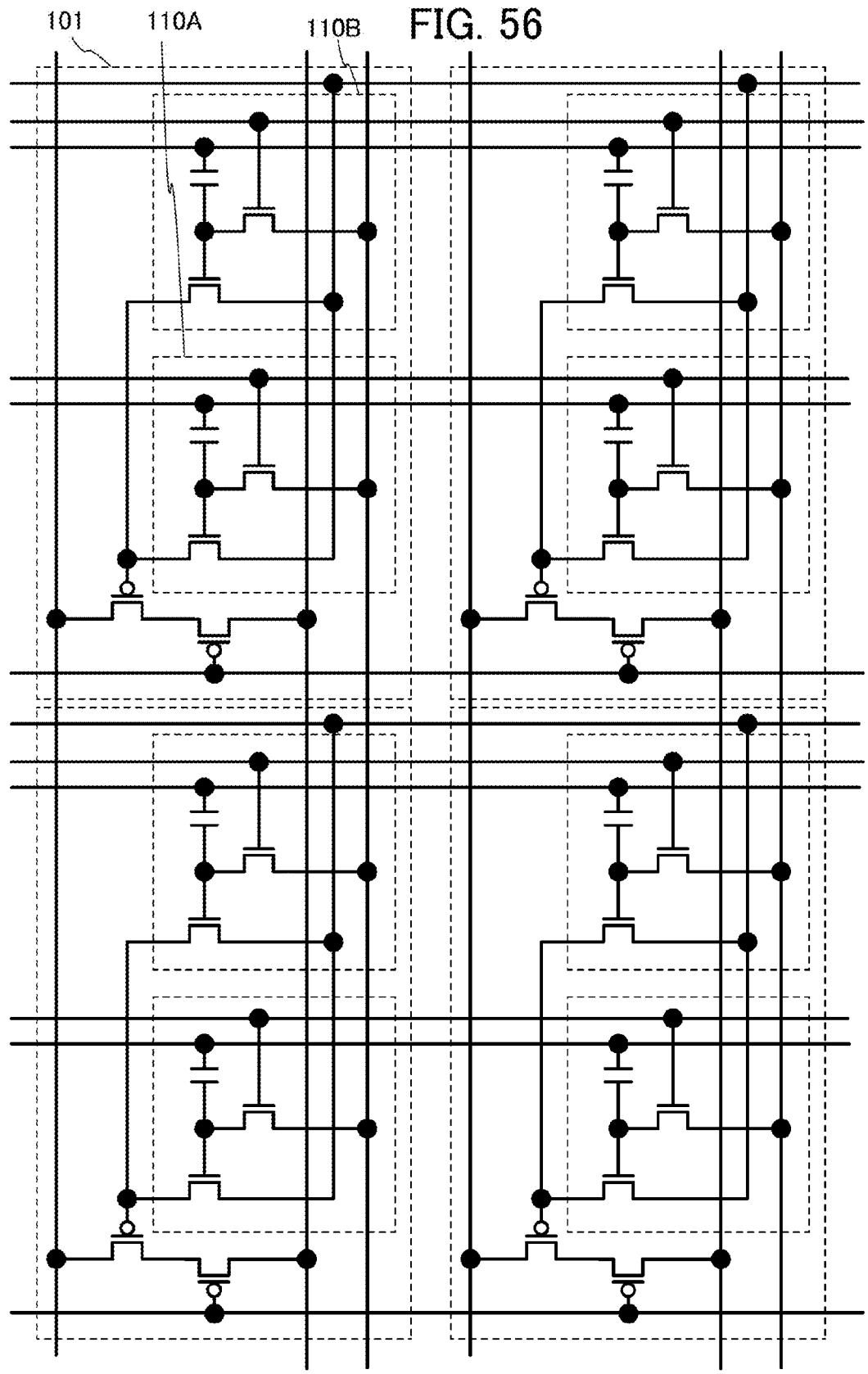
FIG. 56 is a circuit diagram of a semiconductor device according to one embodiment of the present invention.
Figure 57:
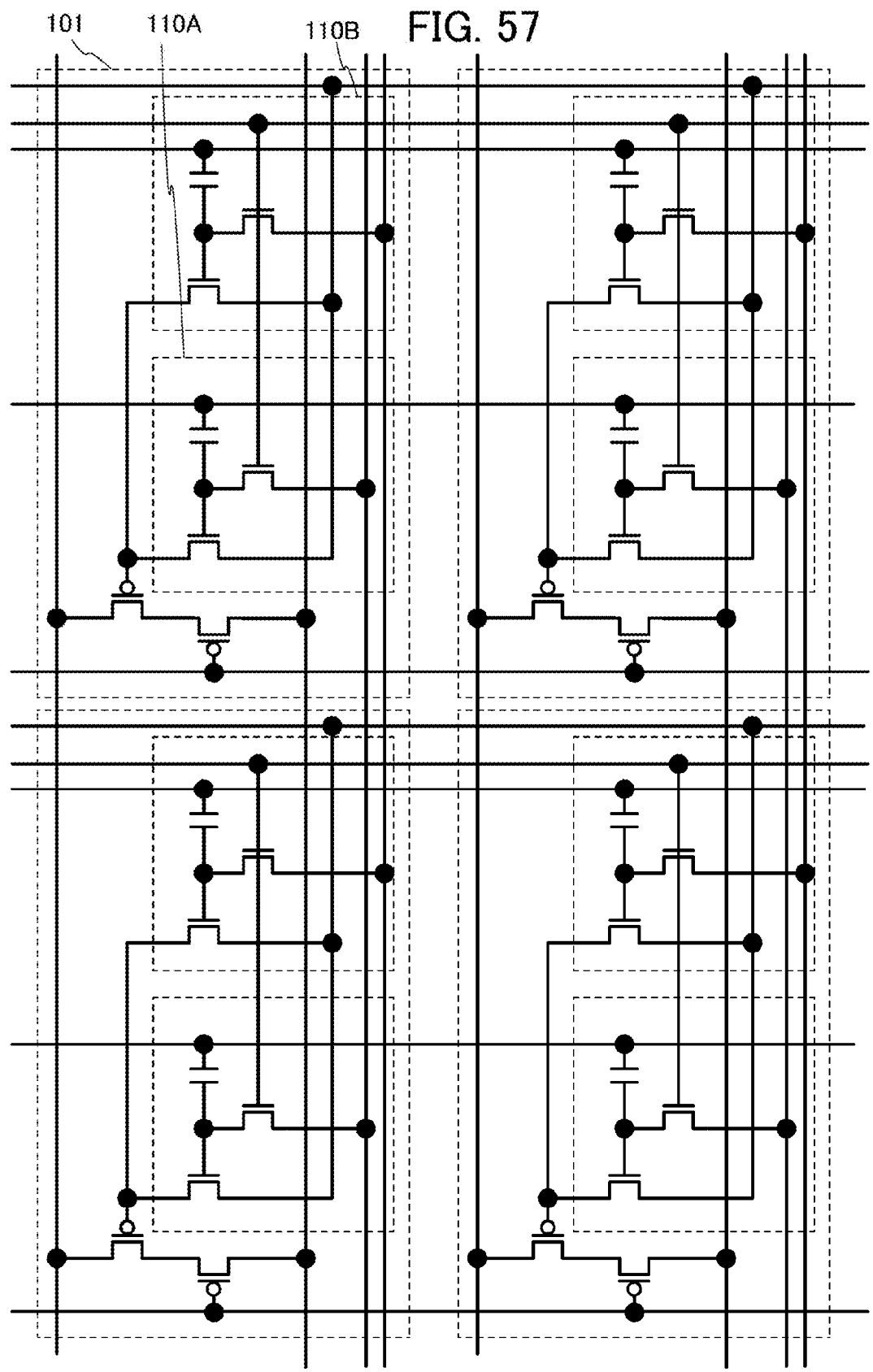
FIG. 57 is a circuit diagram of a semiconductor device according to one embodiment of the present invention.
Figure 58:
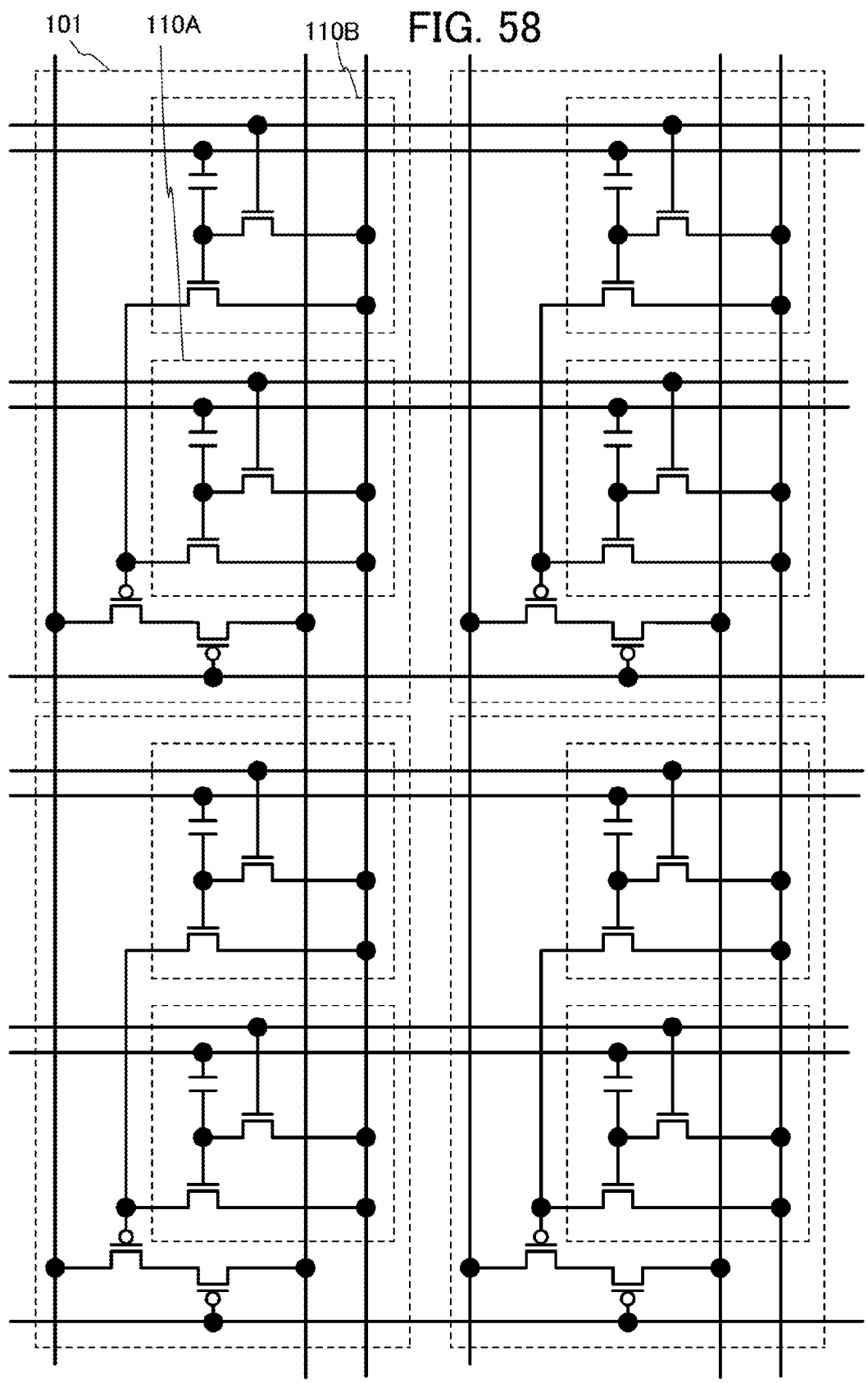
FIG. 58 is a circuit diagram of a semiconductor device according to one embodiment of the present invention.
Figure 59:
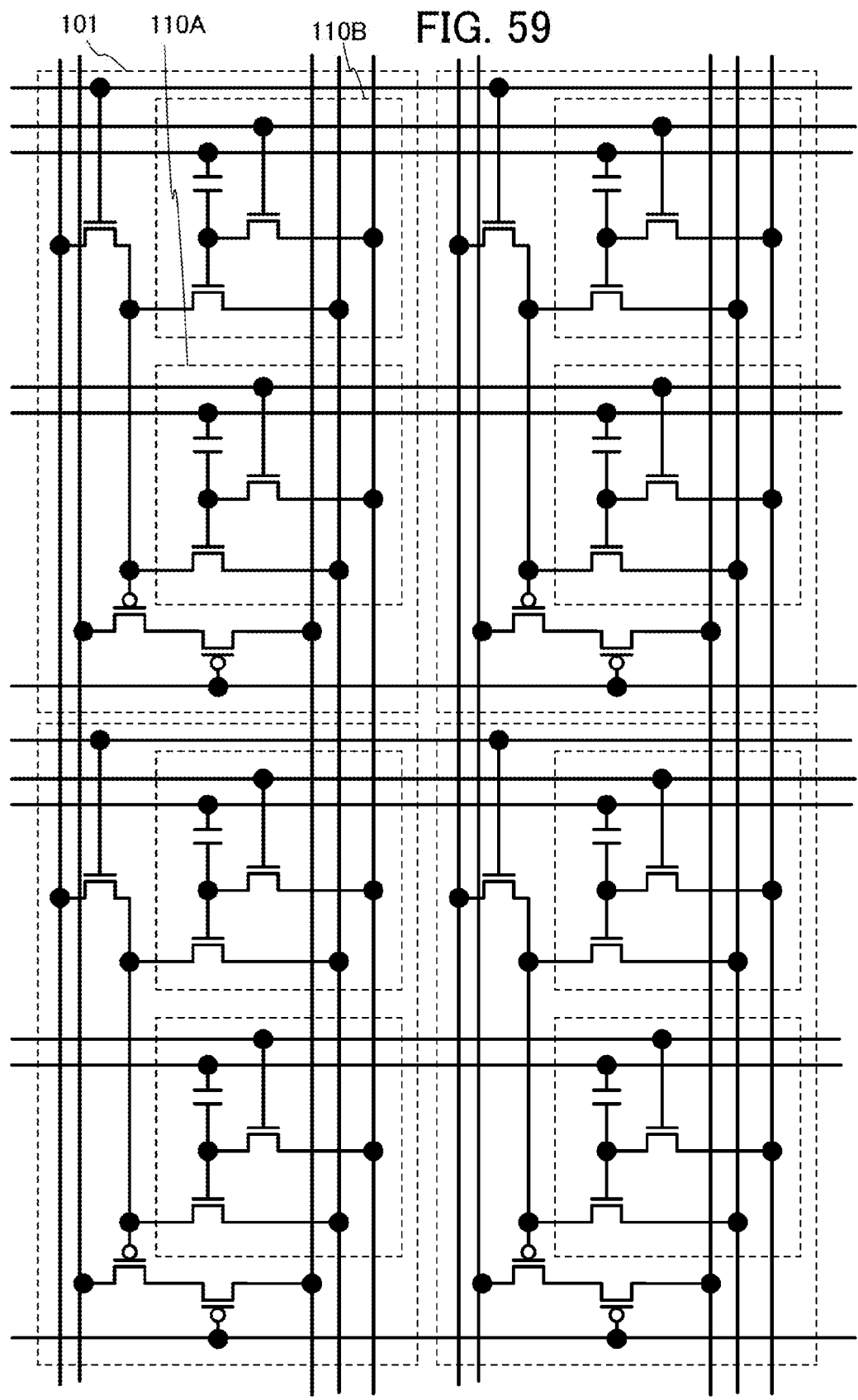
FIG. 59 is a circuit diagram of a semiconductor device according to one embodiment of the present invention.

Next, an example of connection between wirings extending in the vertical direction (from top to bottom) and the circuits 110 in one circuit 101 is illustrated in FIG. 50. For example, the circuit 110A is connected to a wiring 316A, the circuit 110B is connected to a wiring 316B, the circuit 110C is connected to a wiring 316C, and the circuit 110D is connected to a wiring 316D. That is, each circuit 110 is connected to a different wiring 316. The wirings 316 are wirings having a function of supplying a signal to be stored in the circuits 110, for example. The wirings 316 correspond to various wirings included in the circuits 110 or various wirings connected to the circuits 110. Note that one embodiment of the present invention is not limited to this example. For example, as illustrated in FIG. 51, a plurality of circuits 110 may be connected to one wiring 316.

Specific examples of the configuration of FIG. 46 or FIG. 47 are illustrated in FIG. 52, FIG. 53, FIG. 54, FIG. 55, FIG. 56, FIG. 57, FIG. 58, FIG. 59, and the like. Note that the circuits 101 in FIG. 52, FIG. 53, FIG. 54, and FIG. 55 correspond to that of Embodiment 1 or 2, and the circuits 101 in FIG. 56, FIG. 57, FIG. 58, and FIG. 59 correspond to that of Embodiment 3 or 4.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 7)

In this embodiment, an oxide semiconductor layer that can be used as a semiconductor layer of the transistor with low off-state current described in the foregoing embodiment will be described.

An oxide semiconductor used for a channel formation region in the semiconductor layer of the transistor preferably contains at least indium (In) or zinc (Zn). In particular, the oxide semiconductor preferably contains both In and Zn. The oxide semiconductor preferably contains a stabilizer for strongly bonding oxygen, in addition to In and Zn. The oxide semiconductor preferably contains at least one of gallium (Ga), tin (Sn), zirconium (Zr), hafnium (Hf), and aluminum (Al) as the stabilizer.

As another stabilizer, the oxide semiconductor may contain one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor used for the semiconductor layer of the transistor, any of the following can be used, for example: indium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—Zr—Zn-based oxide, In—Ti—Zn-based oxide, In—Sc—Zn-based oxide, In—Y—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide with an atomic ratio of In:Ga:Zn=1:1:1, 3:1:2, or 2:1:3 or an oxide with an atomic ratio close to the above atomic ratios can be used.

If an oxide semiconductor film forming the semiconductor layer contains a large amount of hydrogen, the hydrogen and the oxide semiconductor are bonded to each other, so that part of the hydrogen serves as a donor and causes generation of an electron which is a carrier. As a result, the threshold voltage of the transistor shifts in the negative direction. It is therefore preferable that after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is sometimes reduced by the dehydration treatment (dehydrogenation treatment). For that reason, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, or treatment for making the oxygen content of an oxide semiconductor film be in excess of that of the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film that is extremely close to an i-type oxide semiconductor film. Note that "substantially intrinsic" means that the oxide semiconductor film contains extremely few (close to zero) carriers derived from a donor and has a carrier density which is $1\times10^{17}/cm^3$ or lower, $1\times10^{16}/cm^3$ or lower, $1\times10^{15}/cm^3$ or lower, $1\times10^{14}/cm^3$ or lower, or $1\times10^{13}/cm^3$ or lower, particularly preferably lower than $8\times10^{11}/cm^3$, lower than $1\times10^{11}/cm^3$, or lower than $1\times10^{10}/cm^3$, and is $1\times10^{-9}/cm^3$ or higher.

The transistor including an i-type or substantially i-type oxide semiconductor film can have extremely favorable off-state current characteristics. For example, the off-state drain current of the transistor including the oxide semiconductor film can be $1\times10^{-18}$ A or less, preferably $1\times10^{-21}$ A or less, more preferably $1\times10^{-24}$ A or less at room temperature (approximately 25° C.), or $1\times10^{-15}$ A or less, preferably $1\times10^{-18}$ A or less, more preferably $1\times10^{-21}$ A or less at 85° C. Note that the off state of an n-channel transistor refers to a state where a gate voltage is sufficiently lower than the threshold voltage. Specifically, the transistor is off when the gate voltage is lower than the threshold voltage by 1 V or more, 2 V or more, or 3 V or more.

A structure of the oxide semiconductor film is described below.

An oxide semiconductor film is classified roughly into a single crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to the sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

In the high-resolution plan-view TEM image of the CAAC-OS film observed in a direction substantially perpendicular to the sample surface, metal atoms arranged in a triangular or hexagonal configuration are seen in the crystal parts. However, there is no regularity of arrangement of metal atoms between different crystal parts.

FIG. 60A is a high-resolution cross-sectional TEM image of a CAAC-OS film. FIG. 60B is a high-resolution cross-sectional TEM image obtained by enlarging the image of FIG. 60A. In FIG. 60B, atomic arrangement is highlighted for easy understanding.

FIG. 60C is local Fourier transform images of regions each surrounded by a circle (the diameter is about 4 nm) between A and O and between O and A' in FIG. 60A. C-axis alignment can be observed in each region in FIG. 60C. The c-axis direction between A and O is different from that between O and A', which indicates that a grain in the region between A and O is different from that between O and A'. In addition, the angle of the c-axis between A and O continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) indicating alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 61A).

From the results of the high-resolution cross-sectional TEM image and the high-resolution plan-view TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the high-resolution plan-view TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray is incident on a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of InGaZnO$_4$, six peaks appear. The six peaks are derived from crystal planes equivalent to the (110) plane. In the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the high-resolution cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where the shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added may be altered and the proportion of the c-axis aligned crystal parts in the CAAC-OS film might vary depending on regions.

Note that when the CAAC-OS film with an InGaZnO$_4$ crystal is analyzed by an out-of-plane method, a peak may also be observed when 2θ is around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Therefore, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released and might behave like fixed electric charge. Thus, the transistor including the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In a high-resolution TEM image of the polycrystalline oxide semiconductor film, crystal grains are observed. In most cases, the crystal grain size in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in the high-resolution TEM image, for example. Moreover, in the high-resolution TEM image of the polycrystalline oxide semiconductor film, a grain boundary may be observed.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of $2\theta$ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger changes in electrical characteristics and lower reliability than a transistor including a CAAC-OS film in some cases.

Next, a microcrystalline oxide semiconductor film is described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, a grain boundary cannot be found clearly in the nc-OS film sometimes for example.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak showing a crystal plane does not appear. A diffraction pattern like a halo pattern appears in a selected-area electron diffraction pattern of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. In a nanobeam electron diffraction pattern of the nc-OS film, regions with high luminance in a circular (ring) pattern are shown in some cases. Furthermore, in a nanobeam electron diffraction pattern of the nc-OS film, a plurality of circumferentially distributed spots are observed in some cases (see FIG. 61B).

The nc-OS film is an oxide semiconductor film that has high regularity as compared to an amorphous oxide semiconductor film. Thus, the nc-OS film has a lower density of defect states than an amorphous oxide semiconductor film. Note that there is no regularity of crystal orientation between different crystal parts in the nc-OS film. Hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger changes in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Thus, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak showing a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Thus, the amorphous oxide semiconductor film has a much higher carrier density than the nc-OS film in some cases. Therefore, a transistor including the amorphous oxide semiconductor film tends to be normally on. Therefore, in some cases, such an amorphous oxide semiconductor layer can be applied to a transistor that needs to be normally on. Since the amorphous oxide semiconductor film has a high density of defect states, carrier traps might be increased. Consequently, a transistor including the amorphous oxide semiconductor film has larger changes in electrical characteristics and lower reliability than a transistor including the CAAC-OS film or the nc-OS film.

Next, a single crystal oxide semiconductor film is described.

The single crystal oxide semiconductor film has a lower impurity concentration and a lower density of defect states (few oxygen vacancies). Thus, the carrier density can be decreased. Thus, a transistor including the single crystal oxide semiconductor film is unlikely to be normally on. Moreover, since the single crystal oxide semiconductor film has a lower impurity concentration and a lower density of defect states, carrier traps might be reduced. Thus, the transistor including the single crystal oxide semiconductor film has small changes in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (amorphous-like OS) film.

In a high-resolution TEM image of the amorphous-like OS film, a void may be seen. Furthermore, in the high-resolution TEM image, there are a region where a crystal part is clearly observed and a region where a crystal part is not observed. In the amorphous-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the amorphous-like OS film and the nc-OS film can be measured using high-resolution TEM images. For example, an InGaZnO$_4$ crystal has a layered structure in which two Ga—Zn—O layers are included between In—O layers. A unit cell of the InGaZnO$_4$ crystal has a structure in which nine layers of three In—O layers and six Ga—Zn—O layers are layered in the c-axis direction. Thus, the distance between the adjacent layers is equivalent to the lattice spacing on the (009) plane (also referred to as d value). The value is calculated to be 0.29 nm from crystal structural analysis. Thus, each of the lattice fringes having a distance therebetween of from 0.28 nm to 0.30 nm is regarded as corresponding to the a-b plane of the InGaZnO$_4$ crystal, focusing on the lattice fringes in the high-resolution TEM image. The maximum length in the region in which the lattice fringes are observed is regarded as the size of the crystal parts of the amorphous-like OS film and the nc-OS film. Note that the crystal part whose size is 0.8 nm or larger is selectively evaluated.

Figure 62:
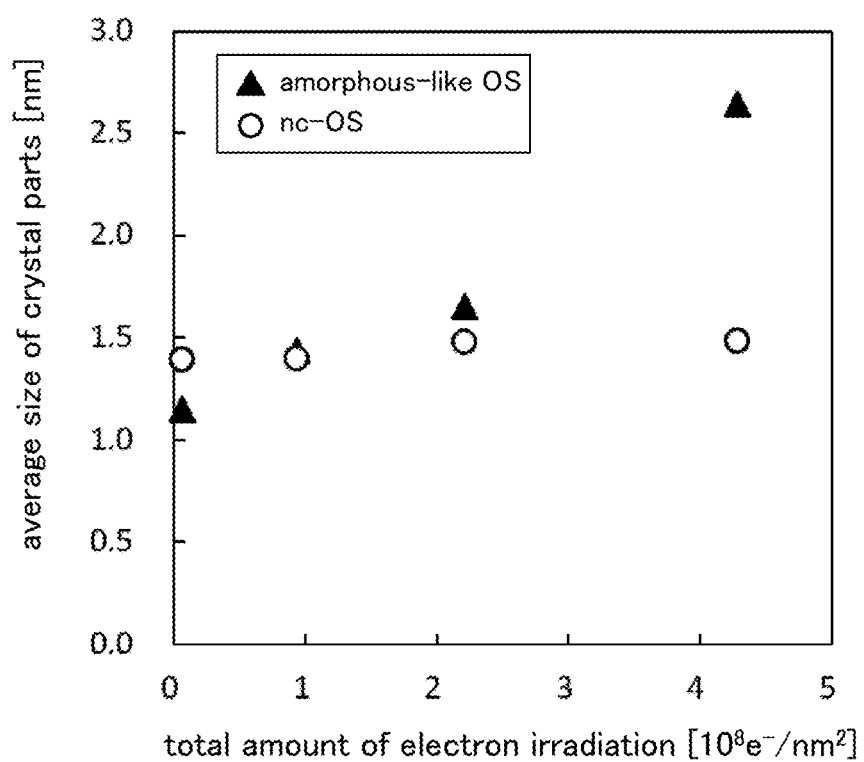
FIG. 62 shows a change in crystal parts by electron beam irradiation.

FIG. 62 shows examination results of change in average size of crystal parts (20-40 points) in the amorphous-like OS film and the nc-OS film using the high-resolution TEM images. As in FIG. 62, the crystal part size in the amorphous-like OS film increases with an increase of the total amount of electron irradiation. Specifically, the crystal part of approximately 1.2 nm at the start of TEM observation grows to a size of approximately 2.6 nm at the total amount of electron irradiation of $4.2 \times 10^8 e^-/nm^2$. In contrast, the crystal part size in the good-quality nc-OS film shows little change from the start of electron irradiation to the total amount of electron irradiation of $4.2 \times 10^8 e^-/nm^2$ regardless of the amount of electron irradiation.

Furthermore, in FIG. 62, by linear approximation of the change in the crystal part size in the amorphous-like OS film and the nc-OS film and extrapolation to the total amount of electron irradiation of $0e^-/nm^2$, the average size of the crystal part is found to be a positive value. This means that the crystal parts exist in the amorphous-like OS film and the nc-OS film before TEM observation.

Note that an oxide semiconductor film may be a stacked-layer film including two or more films of an amorphous oxide semiconductor film, a microcrystalline oxide semiconductor film, and a CAAC-OS film, for example.

In the case where an oxide semiconductor film has a plurality of structures, the structures can be analyzed using nanobeam electron diffraction in some cases.

Figure 61A:
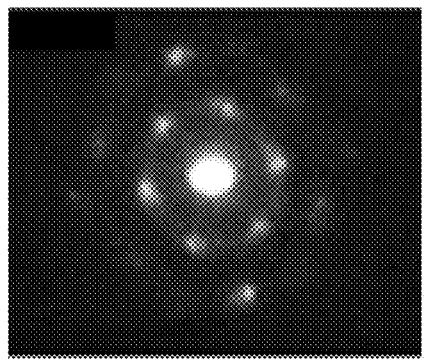
FIGS. 61A and 61B show nanobeam electron diffraction patterns of oxide semiconductor films and FIGS. 61C and 61D illustrate an example of a transmission electron diffraction measurement apparatus.
Figure 61B:
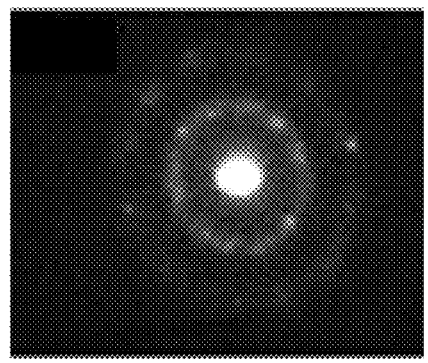
Figure 61C:
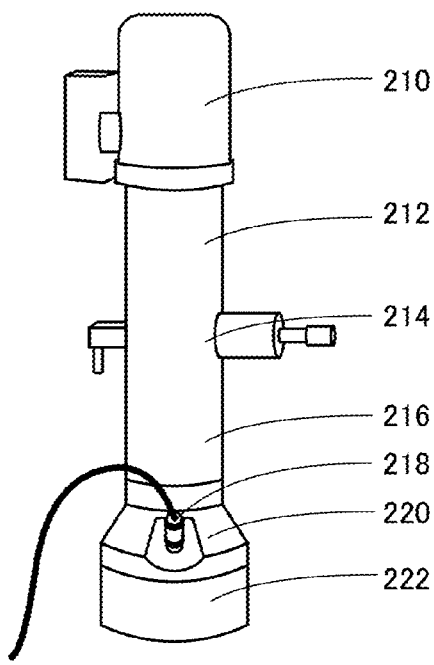

FIG. 61C illustrates a transmission electron diffraction measurement apparatus which includes an electron gun chamber 210, an optical system 212 below the electron gun chamber 210, a sample chamber 214 below the optical system 212, an optical system 216 below the sample chamber 214, an observation chamber 220 below the optical system 216, a camera 218 installed in the observation chamber 220, and a film chamber 222 below the observation chamber 220. The camera 218 is provided to face toward the inside of the observation chamber 220. Note that the film chamber 222 is not necessarily provided.

Figure 61D:
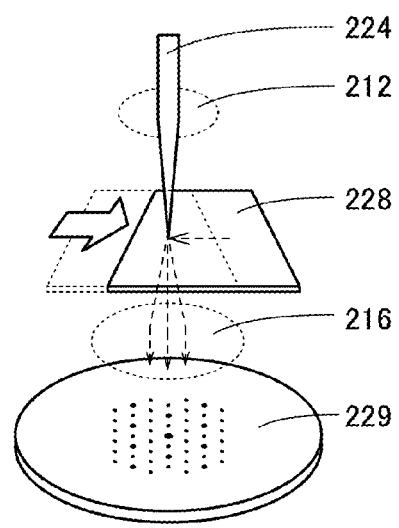

FIG. 61D illustrates an internal structure of the transmission electron diffraction measurement apparatus illustrated in FIG. 61C. In the transmission electron diffraction measurement apparatus, a substance 228 which is positioned in the sample chamber 214 is irradiated with electrons emitted from an electron gun installed in the electron gun chamber 210 through the optical system 212. Electrons passing through the substance 228 are incident on a fluorescent plate 229 provided in the observation chamber 220 through the optical system 216. On the fluorescent plate 229, a pattern corresponding to the intensity of the incident electrons appears, which allows measurement of a transmission electron diffraction pattern.

The camera 218 is installed so as to face the fluorescent plate 229 and can take an image of a pattern appearing on the fluorescent plate 229. An angle formed by a straight line which passes through the center of a lens of the camera 218 and the center of the fluorescent plate 229 and an upper surface of the fluorescent plate 229 is, for example, 15° or more and 80° or less, 30° or more and 75° or less, or 45° or more and 70° or less. As the angle is reduced, distortion of the transmission electron diffraction pattern taken by the camera 218 becomes larger. Note that if the angle is obtained in advance, the distortion of an obtained transmission electron diffraction pattern can be corrected. Note that the film chamber 222 may be provided with the camera 218. For example, the camera 218 may be set in the film chamber 222 so as to be opposite to the incident direction of electrons 224. In this case, a transmission electron diffraction pattern with less distortion can be taken from the rear surface of the fluorescent plate 229.

A holder for fixing the substance 228 that is a sample is provided in the sample chamber 214. The holder transmits electrons passing through the substance 228. The holder may have, for example, a function of moving the substance 228 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 228.

Then, a method for measuring a transmission electron diffraction pattern of a substance by the transmission electron diffraction measurement apparatus described above will be described.

For example, changes in the structure of a substance can be observed by changing the irradiation position of the electrons 224 that are a nanobeam on the substance (or by scanning) as illustrated in FIG. 61D. At this time, when the substance 228 is a CAAC-OS film, a diffraction pattern shown in FIG. 61A is observed. When the substance 228 is an nc-OS film, a diffraction pattern shown in FIG. 61B is observed.

Even when the substance 228 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high-quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 63A:
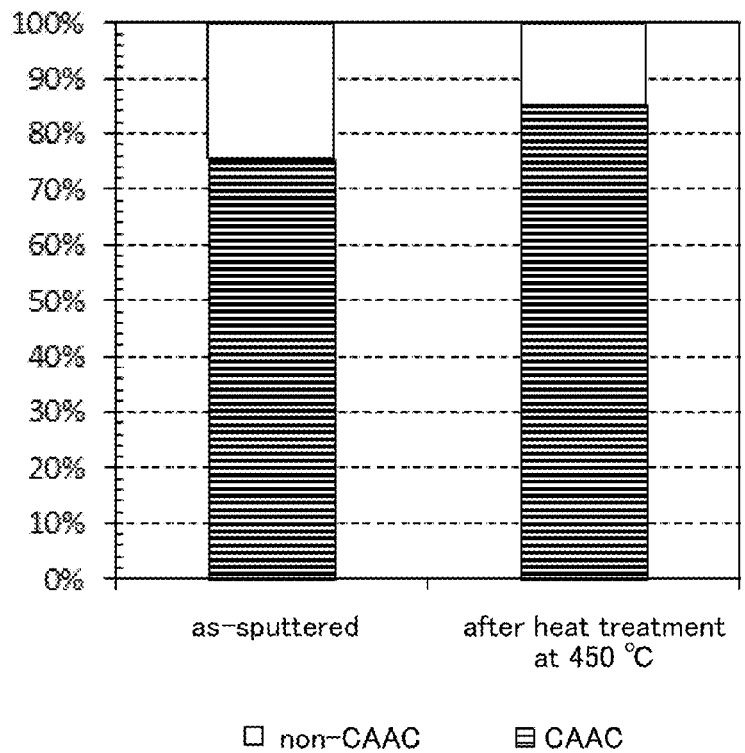
FIG. 63A shows an example of structural analysis by transmission electron diffraction measurement and FIGS. 63B and 63C show high-resolution planar TEM images.

FIG. 63A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%).

These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 63B:
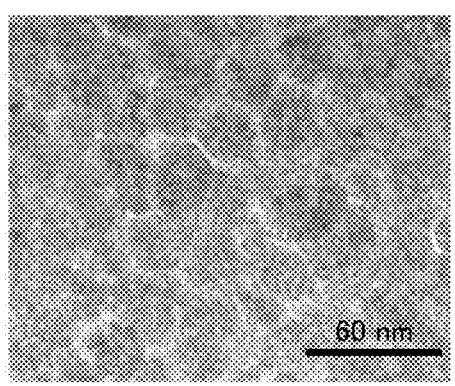
Figure 63C:
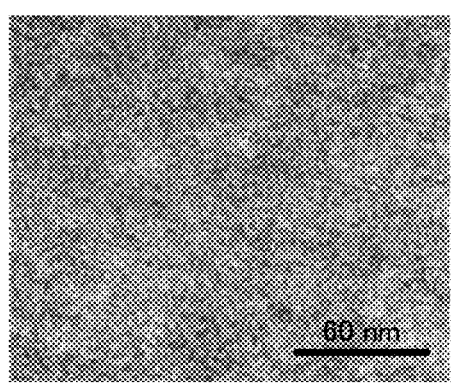

FIGS. 63B and 63C are high-resolution plan-view TEM images of the CAAC-OS film obtained just after the deposition and the CAAC-OS film subjected to the heat treatment at 450° C., respectively. Comparison between FIGS. 63B and 63C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be used as appropriate in combination with any of the structures, methods, and the like described in the other embodiments.

(Embodiment 8)

In this embodiment, a cross-sectional structure of a transistor included in a semiconductor device of one embodiment of the disclosed invention will be described with reference to drawings.

<Schematic Views of Cross-Sectional Structure>

First, schematic views of a cross-sectional structure of a semiconductor device of one embodiment of the invention will be described with reference to FIGS. 64A and 64B.

Transistors included in the semiconductor device of one embodiment of the present invention are constituted of Si transistors and OS transistors. For example, the semiconductor device has a cross-sectional structure in which a layer including Si transistors and a layer including OS transistors are stacked. Each of the layers includes a plurality of transistors including semiconductor layers of the same material.

Figure 64A:
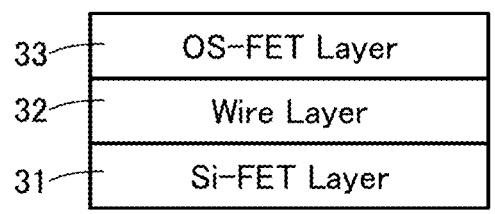
FIGS. 64A and 64B are schematic cross-sectional views each illustrating a semiconductor device of one embodiment of the present invention.

The semiconductor device of one embodiment of the present invention can be formed by, for example as illustrated in FIG. 64A, stacking a layer 31 including Si transistors (represented as Si-FET Layer in the drawing), a layer 32 in which a wiring is provided (represented as Wire Layer in the drawing), and a layer 33 including OS transistors (represented as OS-FET Layer in the drawing) in this order.

In the schematic view of the cross-sectional structure in FIG. 64A, the layer 31 including Si transistors includes Si transistors formed on a single crystal silicon substrate. Note that the Si transistors may be transistors including a thin semiconductor film of silicon, germanium, or the like in an amorphous, microcrystalline, polycrystalline, or single crystal state.

The layer 33 including OS transistors in the schematic view of the cross-sectional structure in FIG. 64A includes OS transistors formed over a planarized insulating surface.

The layer 32 in which a wiring is provided in the schematic view of the cross-sectional structure in FIG. 64A includes a wiring for electrically connecting transistors in the layer 31 including Si transistors and/or the layer 33 including OS transistors or includes a wiring for supplying a potential to the transistors. Although the layer 32 in which a wiring is provided is illustrated as a single layer in FIG. 64A, it may include a plurality of stacked layers.

Furthermore, although the layer 33 including OS transistors is illustrated as a single layer in the schematic view of the cross-sectional structure in FIG. 64A, it may include a plurality of stacked layers. In the case of stacking a plurality of layers, the schematic view of the cross sectional structure is as illustrated in FIG. 64B.

Figure 64B:
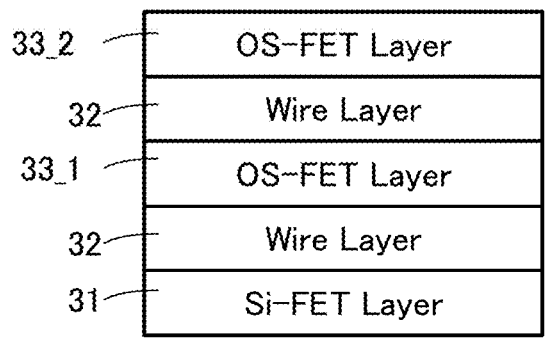

In FIG. 64B, a two-layer structure including a layer 33_1 including OS transistors and a layer 33_2 including OS transistors is illustrated. In the schematic view of the cross-sectional structure in FIG. 64B, the layer 33_1 including OS transistors and the layer 33_2 including OS transistors include OS transistors each formed over a planarized insulating surface. Although the example of stacking two layers is illustrated in FIG. 64B, the number of stacked layers is not limited to two. The layer 32 in which a wiring is provided can be provided between the layer 33_1 including OS transistors and the layer 33_2 including OS transistors. With this structure, OS transistors can be electrically connected to each other.

Stacking the layer including OS transistors and the layer including Si transistors as illustrated in FIGS. 64A and 64B enables a reduction in the circuit area of a memory cell, that is, the chip area of the semiconductor device.

<Cross-Sectional Structure of Layer Including Si Transistors and Layer in which Wiring is Provided>

Figure 65:
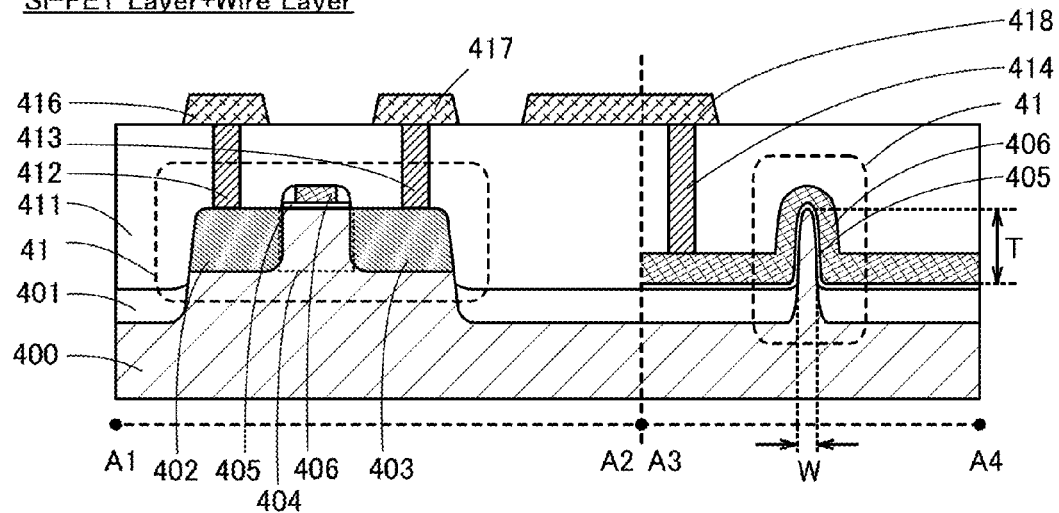
FIG. 65 is a cross-sectional view of a semiconductor device according to one embodiment of the present invention.

Next, FIG. 65 illustrates an example of a cross-sectional structure of the layer 31 including Si transistors and the layer 32 in which a wiring is provided which are described with reference to FIGS. 64A and 64B. In FIG. 65, a cross-sectional structure of a transistor 41 included in the layer 31 including Si transistors is illustrated. The cross-sectional structure of the transistor 41 in FIG. 65 can be applied to the transistors illustrated in various embodiments, for example.

In FIG. 65, a region along dashed line A1-A2 shows a structure of the transistor 41 in the channel length direction, and a region along dashed line A3-A4 shows a structure of the transistor 41 in the channel width direction.

In FIG. 65, a substrate 400 where the transistor 41 is formed can be, for example, a silicon substrate, a germanium substrate, or a silicon germanium substrate. In FIG. 65, a single crystal silicon substrate is used as the substrate 400.

The transistor 41 is electrically isolated by an element isolation method. As the element isolation method, a trench isolation method (a shallow trench isolation (STI) method) or the like can be used. FIG. 65 illustrates an example where the trench isolation method is used to electrically isolate the transistor 41. Specifically, in FIG. 65, the transistor 41 is electrically isolated by element isolation using an element isolation region 401 formed in such a manner that an insulator including silicon oxide or the like is buried in a trench formed in the substrate 400 by etching or the like and then the insulator is partly removed by etching or the like.

In a projection of the substrate 400 that exists in a region other than the trench, an impurity region 402 and an impurity region 403 of the transistor 41 and a channel formation region 404 placed between the impurity regions 402 and 403 are provided. Furthermore, the transistor 41 includes an insulating film 405 covering the channel formation region 404 and a gate electrode 406 that overlaps with the channel formation region 404 with the insulating film 405 provided therebetween.

In the transistor 41, a side portion and an upper portion of the projection in the channel formation region 404 overlap with the gate electrode 406 with the insulating film 405 positioned therebetween, so that carriers flow in a wide area including the side portion and the upper portion of the channel formation region 404. Therefore, an area over the substrate occupied by the transistor 41 can be reduced, and the number of transferred carriers in the transistor 41 can be increased. As a result, the on-state current and field-effect mobility of the transistor 41 are increased. Suppose the length in the channel width direction (channel width) of the projection in the channel formation region 404 is W, and the thickness of the projection in the channel formation region 404 is T. When the aspect ratio of the thickness T to the channel width W is high, a region where carriers flow becomes larger. Thus, the on-state current of the transistor 41 can be further increased and the field-effect mobility of the transistor 41 can be further increased.

Note that when the transistor 41 is formed using a bulk semiconductor substrate, the aspect ratio is preferably 0.5 or more, further preferably 1 or more.

An insulating film 411 is provided over the transistor 41. Openings are formed in the insulating film 411. Conductive films 412 and 413 that are electrically connected to the impurity regions 402 and 403, respectively, and a conductive film 414 that is electrically connected to the gate electrode 406 are formed in the openings.

The conductive film 412 is electrically connected to a conductive film 416 formed over the insulating film 411. The conductive film 413 is electrically connected to a conductive film 417 formed over the insulating film 411. The conductive film 414 is electrically connected to a conductive film 418 formed over the insulating film 411.

Note that the layer 32 in which a wiring is provided illustrated in FIGS. 64A and 64B corresponds to conductive layers 416, 417, and 418 in FIG. 65. The layer 32 in which a wiring is provided can be stacked by forming an insulating film, an opening in the insulating film, and a conductive film in a region including the opening, in this order.

<Cross-Sectional Structure of Layer Including OS Transistors>

Figure 66A:
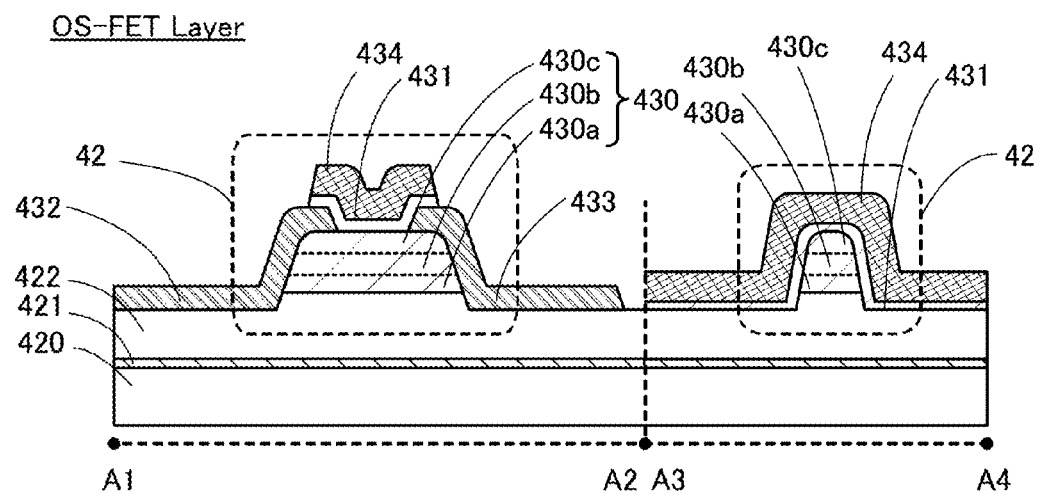
FIGS. 66A and 66B are each a cross-sectional view of a semiconductor device according to one embodiment of the present invention.
Figure 66B:
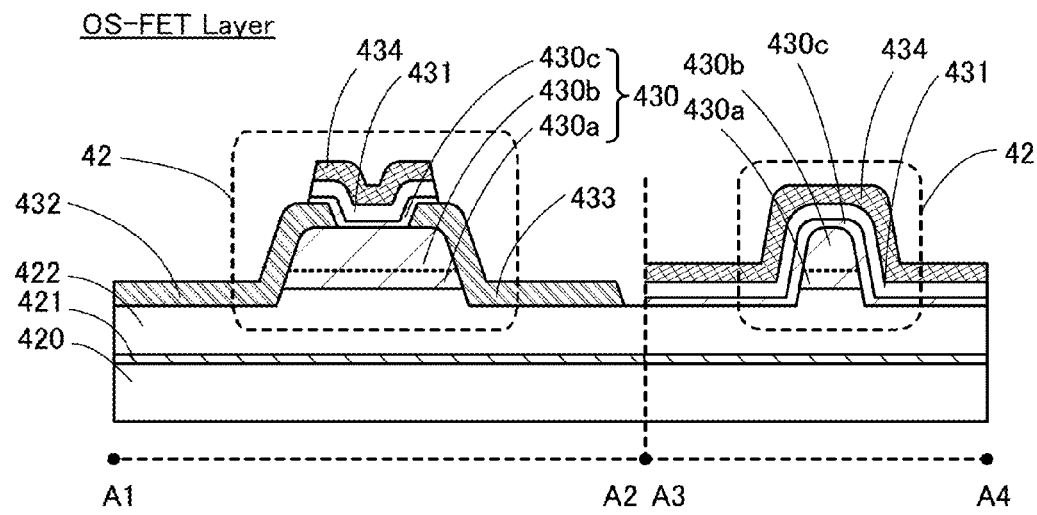

Next, FIGS. 66A and 66B illustrates an example of a cross-sectional structure of the layer 33 including OS transistors described with reference to FIGS. 64A and 64B. In FIGS. 66A and 66B, cross-sectional structures of a transistor 42 included in the layer 33 including OS transistors is illustrated. The cross-sectional structures of the transistor 42 in FIGS. 66A and 66B can be applied to the transistors described in the other embodiments, for example.

In FIGS. 66A and 66B, in a manner similar to that of FIG. 65, a region along dashed line A1-A2 shows a structure of the transistor 42 in the channel length direction, and a region along dashed line A3-A4 shows a structure of the transistor 42 in the channel width direction.

An insulating film 421 having a blocking effect of preventing diffusion of oxygen, hydrogen, and water is provided over an insulating film 420 that is provided over the layer 32 in which a wiring is provided described with reference to FIGS. 64A and 64B. As the insulating film 421 has higher density and becomes denser or has a fewer dangling bonds and becomes more chemically stable, the insulating film 421 has a higher blocking effect. The insulating film 421 that has the effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. The insulating film 421 having an effect of blocking diffusion of hydrogen and water can be formed using, for example, silicon nitride or silicon nitride oxide.

An insulating film 422 is provided over the insulating film 421, and the transistor 42 is provided over the insulating film 422.

The transistor 42 includes, over the insulating film 422, a semiconductor film 430 including an oxide semiconductor, conductive films 432 and 433 functioning as source and drain electrodes and electrically connected to the semiconductor film 430, a gate insulating film 431 covering the semiconductor film 430, and a gate electrode 434 overlapping with the semiconductor film 430 with the gate insulating film 431 positioned therebetween.

Note that in FIG. 66A, the transistor 42 includes at least the gate electrode 434 on one side of the semiconductor film 430, and may further include a gate electrode overlapping with the semiconductor film 430 with the insulating film 422 positioned therebetween.

In the case where the transistor 42 has a pair of gate electrodes, one of the gate electrodes may be supplied with a signal for controlling the on/off state, and the other of the gate electrodes may be supplied with a potential from another element. In this case, potentials with the same level may be supplied to the pair of gate electrodes, or a fixed potential such as the ground potential may be supplied only to the other of the gate electrodes. By controlling the level of a potential supplied to the other of the gate electrodes, the threshold voltage of the transistor can be controlled.

In FIG. 66A, the transistor 42 has a single-gate structure where one channel formation region corresponding to one gate electrode 434 is provided. However, the transistor 42 may have a multi-gate structure where a plurality of electrically connected gate electrodes are provided so that a plurality of channel formation regions are included in one active layer.

FIG. 66A illustrates an example in which the semiconductor film 430 included in the transistor 42 includes oxide semiconductor films 430a to 430c that are stacked in this order over the insulating film 422. Note that in one embodiment of the present invention, the semiconductor film 430 of the transistor 42 may be formed using a single-layer metal oxide film.

In the case where the oxide semiconductor film 430b is an In-M-Zn oxide film (M is Ga, Y, Zr, La, Ce, or Nd) and a target having the atomic ratio of metal elements of In:M:Zn=$x_1$:$y_1$:$z_1$ is used for forming the oxide semiconductor film 430b, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film as the oxide semiconductor film 430b is easily formed. Typical examples of the atomic ratio of the metal elements of the target are In:M:Zn=1:1:1 and In:M:Zn=3:1:2.

Note that in the case where the oxide semiconductor film 430a and the oxide semiconductor film 430c are an In-M-Zn oxide film (M represents Ga, Y, Zr, La, Ce, or Nd) and a target having the atomic ratio of metal elements of In:M:Zn=$x_2$:$y_2$:$z_2$ is used for forming the oxide semiconductor films 430a and 430c, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, CAAC-OS films are easily formed as the oxide semiconductor films 430a and 430c. Typical examples of the atomic ratio of the metal elements of the target are In:M:Zn=1:3:2, In:M:Zn=1:3:4, In:M:Zn=1:3:6, and the like.

The insulating film 422 preferably has a function of supplying part of oxygen to the oxide semiconductor films 430a to 430c by heating. It is preferable that the number of defects in the insulating film 422 be small, and typically the spin density of g =2.001 due to a dangling bond of silicon be lower than or equal to $1 \times 10^{18}$ spins/cm$^3$. The spin density is measured by electron spin resonance (ESR) spectroscopy.

The insulating film 422, which has a function of supplying part of the oxygen to the oxide semiconductor films 430a to 430c by heating, is preferably an oxide. Examples of the oxide include aluminum oxide, magnesium oxide, silicon oxide, silicon oxynitride, silicon nitride oxide, gallium oxide, germanium oxide, yttrium oxide, zirconium oxide, lanthanum oxide, neodymium oxide, hafnium oxide, and tantalum oxide. The insulating film 422 can be formed by a plasma CVD (chemical vapor deposition) method, a sputtering method, or the like.

Note that in this specification, oxynitride contains more oxygen than nitrogen, and nitride oxide contains more nitrogen than oxygen.

Note that in the transistor 42 illustrated in FIG. 66A, the gate electrode 434 overlaps with end portions of the oxide semiconductor film 430b including a channel region that do not overlap with the conductive films 432 and 433, i.e., end portions of the oxide semiconductor film 430b that are in a region different from a region where the conductive films 432 and 433 are located. When the end portions of the oxide semiconductor film 430b are exposed to plasma by etching for forming the end portions, a chlorine radical, a fluorine radical, or other radicals generated from an etching gas are easily bonded to a metal element contained in an oxide semiconductor. For this reason, in the end portions of the oxide semiconductor film, oxygen bonded to the metal element is easily eliminated, so that an oxygen vacancy is easily formed; thus, the oxide semiconductor film easily has n-type conductivity. However, an electric field applied to the end portions can be controlled by controlling the potential of the gate electrode 434 because the end portions of the oxide semiconductor film 430b that do not overlap with the conductive films 432 and 433 overlap with the gate electrode 323 in the transistor 42 illustrated in FIG. 66A. Consequently, current that flows between the conductive films 432 and 433 through the end portions of the oxide semiconductor film 430b can be controlled by the potential applied to the gate electrode 434. Such a structure of the transistor 42 is referred to as a surrounded channel (s-channel) structure.

With the s-channel structure, specifically, when a potential at which the transistor 42 is turned off is supplied to the gate electrode 434, the amount of off-state current that flows between the conductive films 432 and 433 through the end portions can be reduced. For this reason, in the transistor 42, even when the distance between the conductive films 432 and 433 at the end portions of the oxide semiconductor film 430b is reduced as a result of reducing the channel length to obtain high on-state current, the transistor 42 can have low off-state current. Consequently, with the short channel length, the transistor 42 can have high on-state current when in an on state and low off-state current when in an off state.

With the s-channel structure, specifically, when a potential at which the transistor 42 is turned on is supplied to the gate electrode 434, the amount of current that flows between the conductive films 432 and 433 through the end portions of the oxide semiconductor film 430b can be increased. The current contributes to an increase in the field-effect mobility and the on-state current of the transistor 42. When the end portions of the oxide semiconductor film 430b overlap with the gate electrode 434, carriers flow in a wide region of the oxide semiconductor film 430b without being limited to a region in the vicinity of the interface between the oxide semiconductor film 430b and the gate insulating film 431, which results in an increase in carrier mobility the transistor 42. As a result, the on-state current of the transistor 42 is increased, and the field-effect mobility is increased to greater than or equal to 10 $cm^2/V \times s$ or to greater than or equal to 20 $cm^2/V \times s$, for example. Note that here, the field-effect mobility is not an approximate value of the mobility as the physical property of the oxide semiconductor film but is an index of current drive capability and the apparent field-effect mobility of a saturation region of the transistor.

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

Note that the channel width refers to, for example, the length of a portion where a source and a drain face each other in a region where a semiconductor (or a portion where a current flows in a semiconductor when a transistor is on) and a gate electrode overlap with each other, or a region where a channel is formed, in the plan view. In one transistor, channel widths in all regions are not necessarily the same value. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of a semiconductor in some cases. In that case, an effective channel width obtained when a channel is actually formed is greater than an apparent channel width shown in the top view.

In a transistor having a three-dimensional structure, an effective channel width is difficult to measure in some cases. For example, estimation of an effective channel width from a design value requires an assumption that the shape of a semiconductor is known. Therefore, without accurate information on the shape of a semiconductor, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from the value obtained by calculation using an effective channel width is obtained in some cases.

In the description with FIG. 66A, the structure in which the semiconductor film 430 included in the transistor 42 includes the oxide semiconductor films 430a, 430b, and 430c stacked in this order is used as an example. As another structure, a structure illustrated in FIG. 66B may also be employed for the semiconductor film 430. As illustrated in FIG. 66B, the oxide semiconductor film 430c included in the semiconductor film 430 may be provided over the conductive films 432 and 433 and overlap with the gate insulating film 431.

<Cross-Sectional Structure of Stack Including Layer Including Si Transistors and Layer Including OS Transistors>

Figure 67:
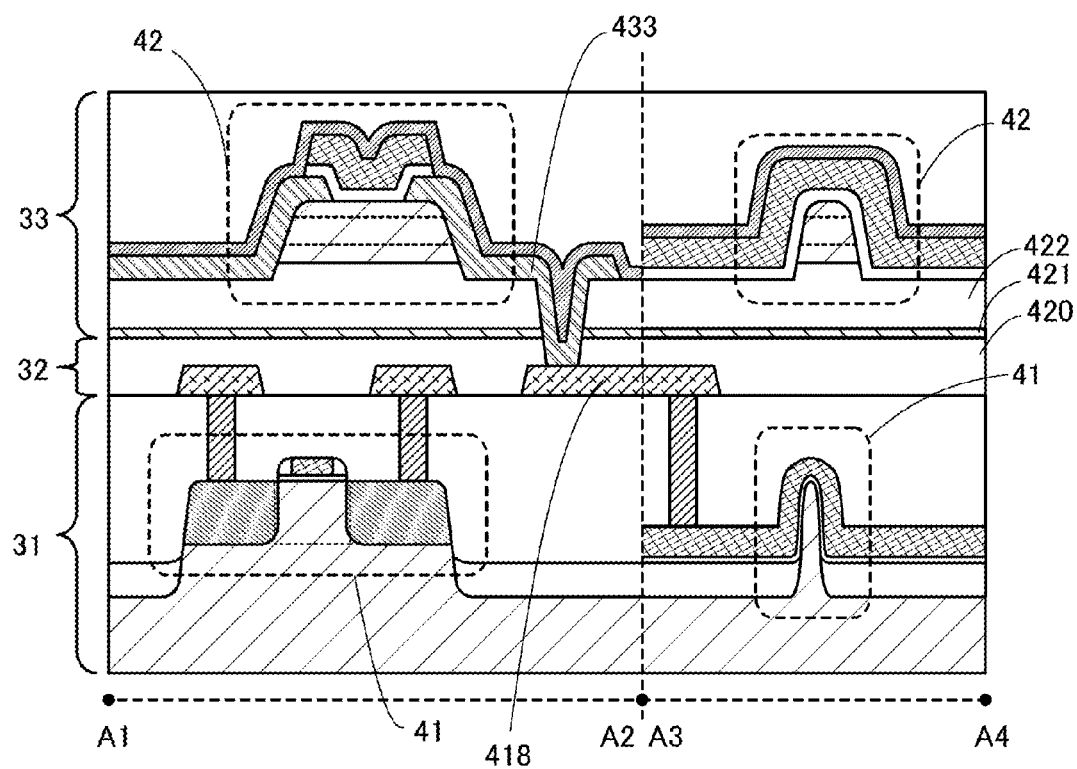
FIG. 67 is a cross-sectional view of a semiconductor device according to one embodiment of the present invention.
Figure 68:
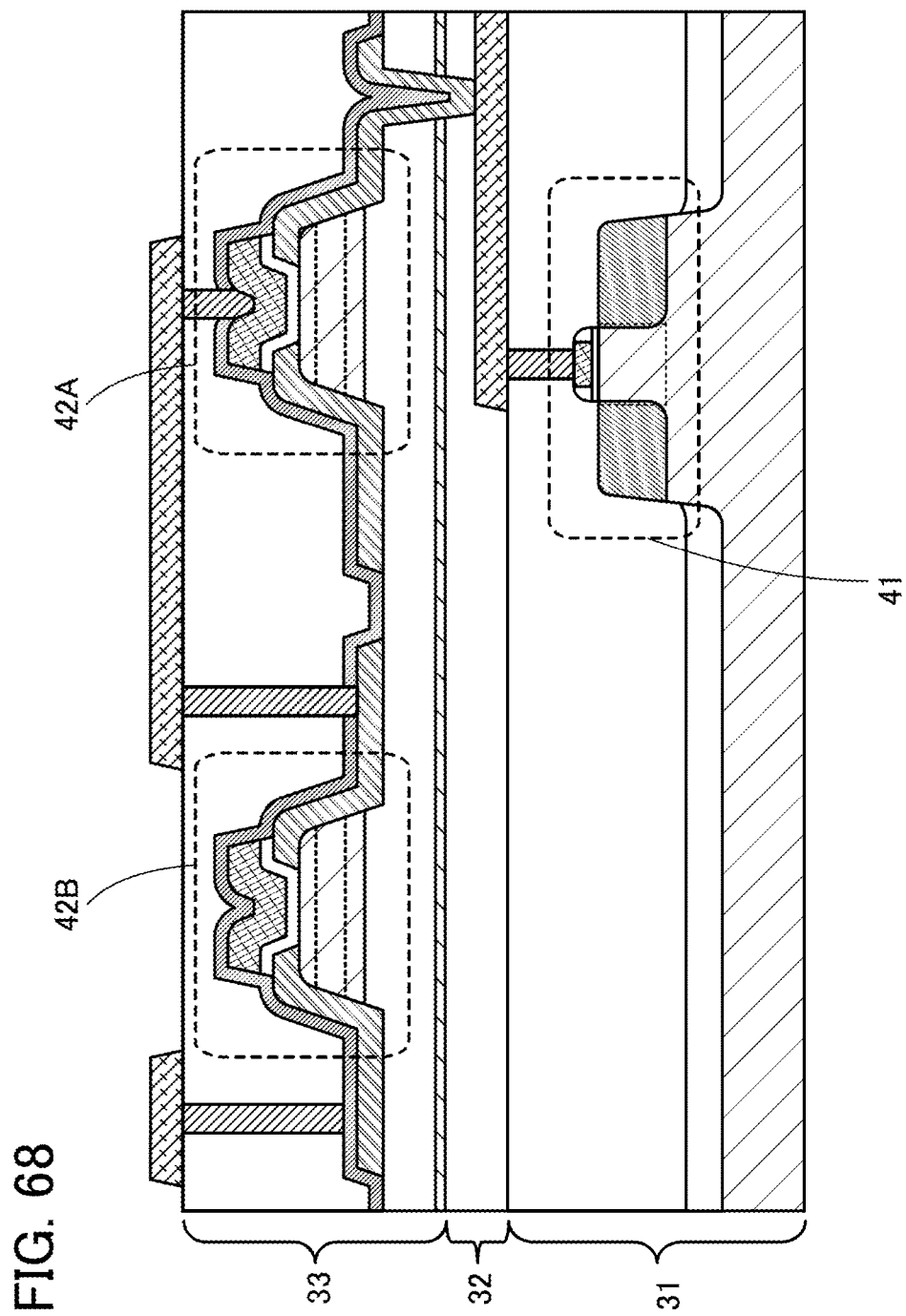
FIG. 68 is a cross-sectional view of a semiconductor device according to one embodiment of the present invention.
Figure 69:
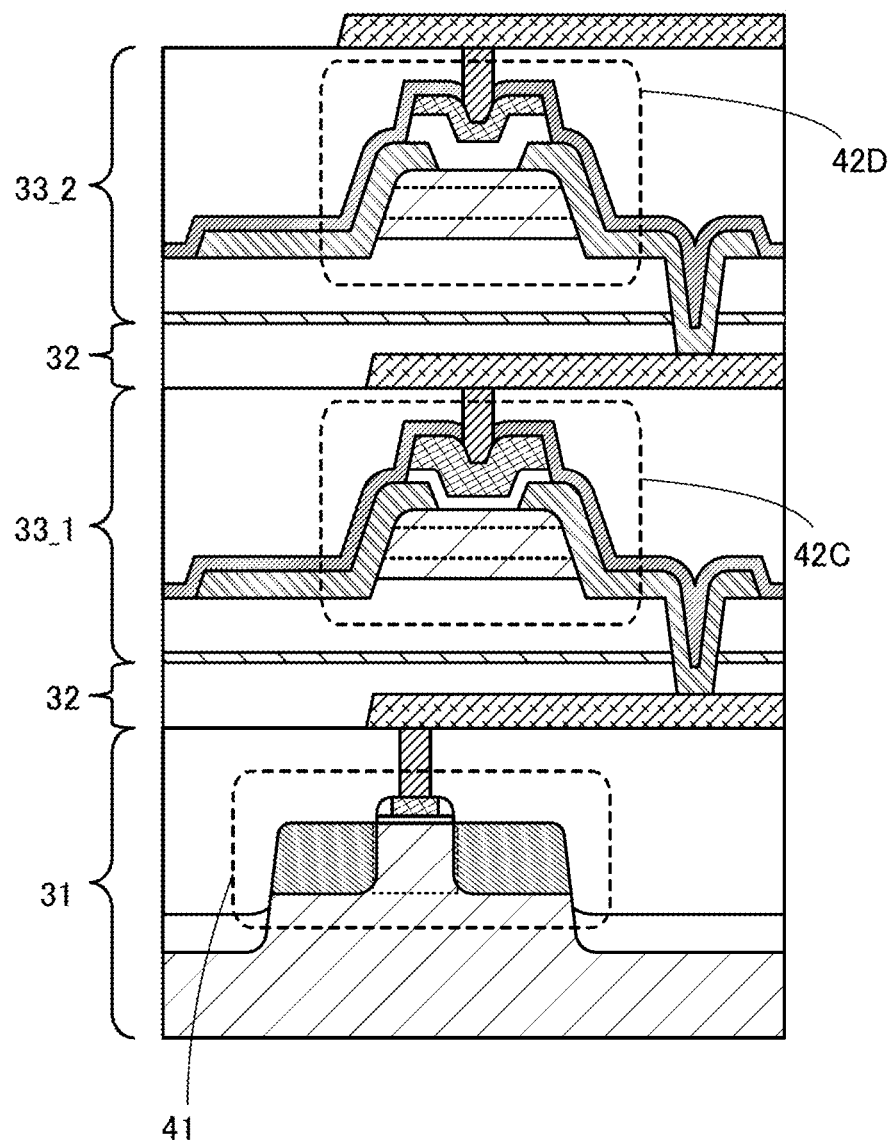
FIG. 69 is a cross-sectional view of a semiconductor device according to one embodiment of the present invention.

Next, FIG. 67, FIG. 68, and FIG. 69 illustrate an example of a cross-sectional structure in the case of stacking the layer including Si transistors and the layer in which a wiring is provided, which are described with FIG. 65, and the layer 33 including OS transistors described with FIG. 66A.

FIG. 67 illustrates an example of a cross-sectional structure illustrated in the schematic view of FIG. 64A.

In FIG. 67, in a manner similar to that of FIG. 65 and FIG. 66A, a region along dashed line A1-A2 shows a structure of the transistors 41 and 42 in the channel length direction, and a region along dashed line A3-A4 shows a structure of the transistors 41 and 42 in the channel width direction.

Note that in one embodiment of the present invention, as shown in FIG. 67, the channel length direction of the transistor 41 and the channel length direction of the transistor 42 may not be necessarily consistent with each other.

In FIG. 67, for electrical connection between the transistor 41 and the transistor 42, an opening is provided in the insulating films 420 to 422. The conductive film 433 provided in the opening is connected to the conductive film 418 in the opening.

In the cross-sectional structure illustrated in FIG. 67, as described for FIG. 64A, the transistor 42 including a channel formation region in an oxide semiconductor film is formed over the transistor 41 including a channel formation region in a single crystal silicon substrate. With the structure illustrated in FIG. 67, the channel formation region of the transistor 42 can overlap with the channel formation region of the transistor 41. Accordingly, a semiconductor device including a memory cell with such a structure can have a reduced layout area.

In the case where a plurality of transistors 42 are provided in the layer 33 including OS transistors, the transistors 42 may be provided in the same layer or different layers.

For example, in the case where the transistors 42 are provided in the same layer in the layer 33 including OS transistors, the structure illustrated in FIG. 68 can be formed. In the case where the transistors 42 are provided in different layers in the layer 33 including OS transistors, the layer 33_1 including OS transistors and the layer 332 including OS transistors can be separately provided so as to be stacked with the layer 32 in which a wiring is provided placed therebetween. This structure is illustrated in FIG. 69.

In the case of the cross-sectional structure illustrated in FIG. 68, even when the number of OS transistors is increased, only one layer, which is the layer 33 including OS transistors, is required; accordingly, the number of stacked layers can be reduced. In FIG. 68, a transistor 42A and a transistor 42B can be formed at once, for example. Accordingly, the number of steps for manufacturing a semiconductor device can be reduced.

FIG. 68 illustrates a structure of the transistors 41, 42A, and 42B in the channel length direction. The structure in the channel width direction thereof is similar to that illustrated in FIG. 67, and the aforementioned structure can be referred to.

By applying the cross-sectional structure of FIG. 68 to the transistors described in the other embodiments, manufacturing cost of the semiconductor devices including a memory cell can be reduced.

Moreover, with the cross-sectional structure illustrated in FIG. 69, even when the number of OS transistors is increased, the layer 33_1 including OS transistors and the layer 33_2 including OS transistors are separately provided in a plurality of layers; accordingly, an increase in circuit area can be prevented. Therefore, the chip area of a semiconductor device can be reduced.

FIG. 69 illustrates a structure of the transistor 41, a transistor 42C, and a transistor 42D in the channel length direction. The structure in the channel width direction thereof is similar to that illustrated in FIG. 67, and the aforementioned structure can be referred to.

In the cross-sectional structure illustrated in FIG. 69, OS transistors included in the layer 33_1 including OS transistors and OS transistors included in the layer 33_2 including OS transistors, which exist in different layers, can have different film thicknesses, film qualities, and the like from each other. Thus, transistors with different characteristics can be formed separately. For example, transistors having high switching characteristics owing to thin gate insulating films and transistors having high withstand voltage owing to thick gate insulating films can be stacked. Accordingly, the semiconductor device can have high performance.

For example, the transistors 42C and 42D illustrated in FIG. 69 are transistors corresponding to the OS transistors described in the other embodiments.

In the cross-sectional structure illustrated in FIG. 69, a gate insulating film of the transistor 42C is thin, and a gate insulating film of the transistor 42D is thick, as an example. Thus, the transistor 42C with high switching characteristics and the transistor 42D with high withstand voltage can be stacked in the cross-sectional structure illustrated in FIG. 69.

By applying the cross-sectional structure of FIG. 69 to the transistors described in the other embodiments, high performance of the semiconductor devices including a memory cell can be achieved.

Note that the structures, methods, and the like described in this embodiment can be used as appropriate in combination with any of the structures, methods, and the like described in the other embodiments.

(Embodiment 9)

In this embodiment, examples of using the semiconductor device described in the foregoing embodiment in an electronic component and an electronic device including the electronic component will be described with reference to FIGS. 70A and 70B and FIGS. 71A to 71E.

Figure 70A:
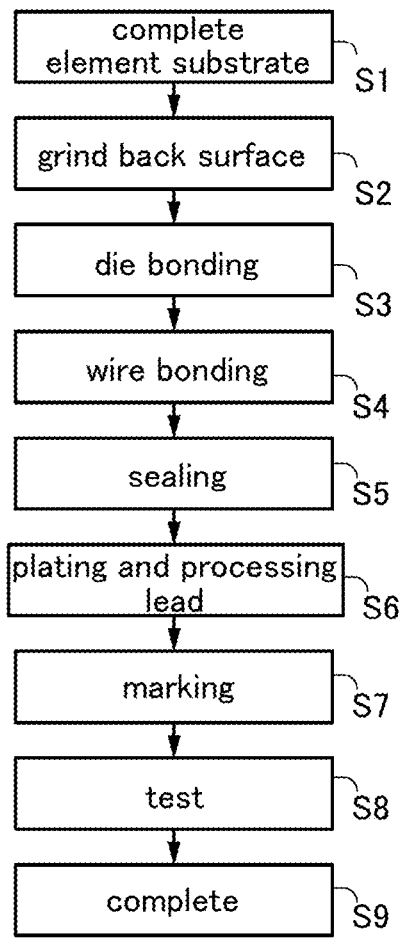
FIG. 70A is a flow chart showing manufacturing steps of a semiconductor device according to one embodiment of the present invention and FIG. 70B is a schematic perspective view of the semiconductor device.

FIG. 70A shows an example where the semiconductor device described in the foregoing embodiment is used to make an electronic component. Note that an electronic component is also referred to as semiconductor package or IC package. For the electronic component, there are various standards and names corresponding to the direction of terminals or the shape of terminals; hence, one example of the electronic component will be described in this embodiment.

A semiconductor device including the transistors illustrated in FIG. 65 to FIG. 69 of Embodiment 8 is completed by integrating detachable components on a printed circuit board through the assembly process (post-process).

The post-process can be completed through steps shown in FIG. 70A. Specifically, after an element substrate obtained in the preceding process is completed (Step S1), a back surface of the substrate is ground (Step S2). The substrate is thinned in this step to reduce warpage or the like of the substrate in the preceding process and to reduce the size of the component itself.

A dicing step of grinding the back surface of the substrate and separating the substrate into a plurality of chips is performed. Then, a die bonding step of individually picking up separate chips to be mounted on and bonded to a lead frame is performed (Step S3). In this die bonding step, the chip is bonded to the lead frame by an appropriate method depending on a product, for example, bonding with a resin or a tape. Note that in the die bonding step, a chip may be mounted on and bonded to an interposer.

Next, wire bonding for electrically connecting a lead of the lead frame and an electrode on a chip through a metal wire is performed (Step S4). As a metal wire, a silver wire or a gold wire can be used. For wire bonding, ball bonding or wedge bonding can be employed.

A wire-bonded chip is subjected to a molding step of sealing the chip with an epoxy resin or the like (Step S5). With the molding step, the inside of the electronic component is filled with a resin, so that the mounted circuit portion and wire can be protected from external mechanical force and deterioration of characteristics due to moisture or dust can be reduced.

Subsequently, the lead of the lead frame is plated. Then, the lead is cut and processed into a predetermined shape (Step S6). With the plating process, corrosion of the lead can be prevented, and soldering for mounting the electronic component on a printed circuit board in a later step can be performed with higher reliability.

Next, printing process (marking) is performed on a surface of the package (Step S7). Then, through a final test step (Step S8), the electronic component is completed (Step S9).

The electronic component described above includes the semiconductor device of the foregoing embodiment. Therefore, the electronic component can include the semiconductor device that can store multilevel data. Accordingly, the electronic component has improved storage capacity.

Figure 70B:
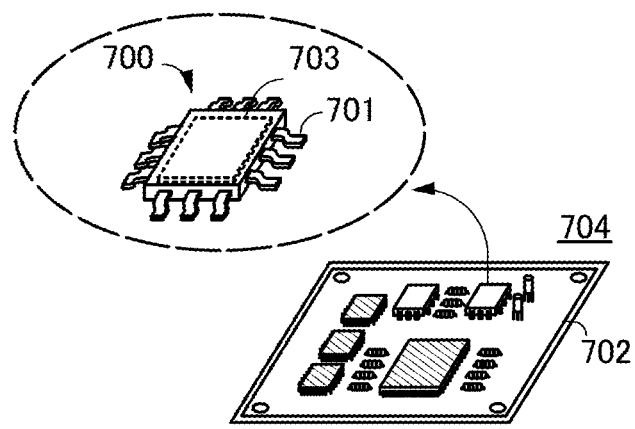

FIG. 70B is a perspective schematic diagram of a completed electronic component. FIG. 70B shows a perspective schematic diagram of a quad flat package (QFP) as an example of the electronic component. An electronic component 700 illustrated in FIG. 70B includes a lead 701 and a semiconductor device 703. The electronic component 700 in FIG. 70B is, for example, mounted on a printed circuit board 702. A plurality of electronic components 700 are used in combination and electrically connected to each other over the printed wiring board 702; thus, a substrate on which the electronic components are mounted (a circuit board 704) is completed. The completed circuit board 704 is provided in an electronic device or the like.

Next, the description is made on applications of the above electronic component to electronic devices such as a computer, a portable information appliance (including a mobile phone, a portable game machine, and an audio reproducing device), electronic paper, a television device (also referred to as television or television receiver), and a digital video camera.

Figure 71A:
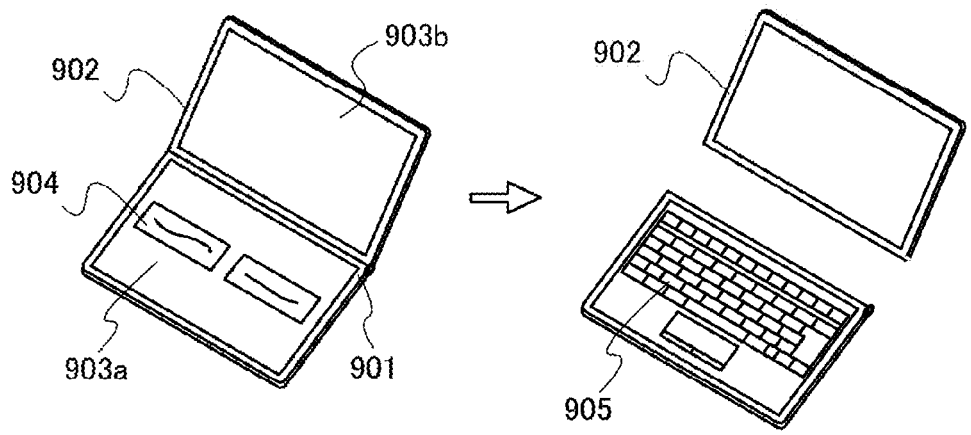
FIGS. 71A to 71E each illustrate an electronic device that uses a semiconductor device according to one embodiment of the present invention.

FIG. 71A illustrates a portable information appliance that includes a housing 901, a housing 902, a first display portion 903a, a second display portion 903b, and the like. At least one of the housings 901 and 902 includes the circuit board including the semiconductor device of the foregoing embodiment. Thus, it is possible to obtain a portable information appliance with improved storage capacity.

Note that the first display portion 903a is a panel having a touch input function, and for example, as illustrated in the left of FIG. 71A, which of "touch input" and "keyboard input" is performed can be selected with a selection button 904 displayed on the first display portion 903a. Since selection buttons with a variety of sizes can be displayed, the information appliance can be easily used by people of any generation. For example, when "keyboard input" is selected, a keyboard 905 is displayed on the first display portion 903a as illustrated in the right of FIG. 71A. Thus, letters can be input quickly by key input as in the case of using a conventional information appliance, for example.

One of the first display portion 903a and the second display portion 903b can be detached from the portable information appliance as shown in the right of FIG. 71A. Providing the second display portion 903b with a touch input function makes the information appliance convenient to carry because the weight can be further reduced and the information appliance can be operated with one hand while the other hand supports the housing 902.

The portable information appliance in FIG. 71A can be equipped with a function of displaying a variety of information (e.g., a still image, a moving image, and a text image); a function of displaying a calendar, a date, the time, or the like on the display portion; a function of operating or editing information displayed on the display portion; a function of controlling processing by various kinds of software (programs); and the like. Furthermore, an external connection terminal (e.g., an earphone terminal or a USB terminal), a recording medium insertion portion, and the like may be provided on the back surface or the side surface of the housing.

The portable information appliance illustrated in FIG. 71A may transmit and receive data wirelessly. Through wireless communication, desired book data or the like can be purchased and downloaded from an e-book server.

In addition, the housing 902 illustrated in FIG. 71A may be equipped with an antenna, a microphone function, or a wireless communication function to be used as a mobile phone.

Figure 71B:
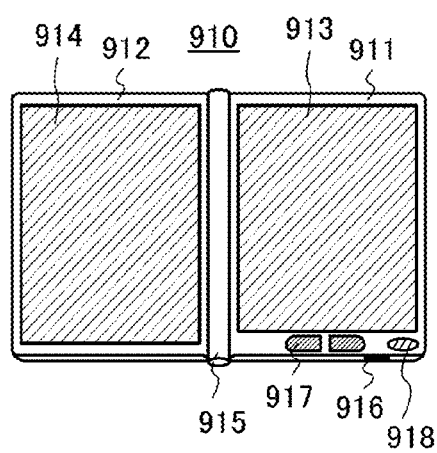

FIG. 71B illustrates an e-book reader 910 in which electronic paper is incorporated. The e-book reader 910 has two housings of a housing 911 and a housing 912. The housing 911 and the housing 912 are provided with a display portion 913 and a display portion 914, respectively. The housings 911 and 912 are connected by a hinge 915 and can be opened or closed with the hinge 915 as an axis. The housing 911 is provided with a power switch 916, an operation key 917, a speaker 918, and the like. The circuit board including the semiconductor device of the foregoing embodiment is provided in at least one of the housings 911 and 912. Consequently, it is possible to obtain an e-book reader with improved storage capacity.

Figure 71C:
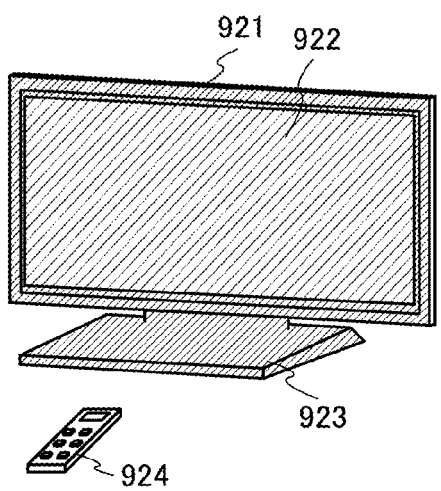

FIG. 71C illustrates a television device including a housing 921, a display portion 922, a stand 923, and the like. The television device can be operated with a switch of the housing 921 and a separate remote controller 924. The circuit board including the semiconductor device of the foregoing embodiment is mounted on the housing 921 and the remote controller 924. Thus, it is possible to obtain a television device with improved storage capacity.

Figure 71D:
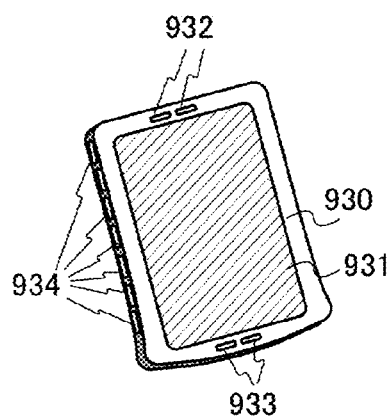

FIG. 71D illustrates a smartphone in which a main body 930 is provided with a display portion 931, a speaker 932, a microphone 933, operation buttons 934, and the like. The circuit board including the semiconductor device of the foregoing embodiment is provided in the main body 930. Thus, it is possible to obtain a smartphone with improved storage capacity.

Figure 71E:
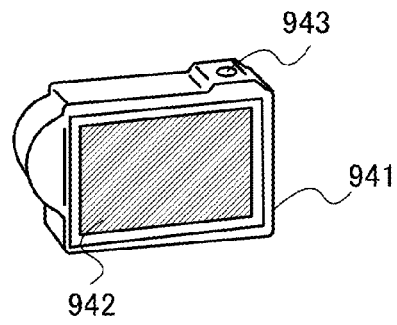

FIG. 71E illustrates a digital camera including a main body 941, a display portion 942, an operation switch 943, and the like. The circuit board including the semiconductor device of the foregoing embodiment is provided in the main body 941. Thus, it is possible to obtain a digital camera with improved storage capacity.

As described above, the electronic devices shown in this embodiment incorporate the circuit board including the semiconductor device of the foregoing embodiment. Consequently, it is possible to obtain the electronic devices with improved storage capacity.

(Supplementary Note for the Description of this Specification)

A content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constructed. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including an FET and a light-emitting element, the following case is possible: Company A manufactures and sells semiconductor devices including FETs, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including an FET and a light-emitting element, even when this specification or the like does not include a description of the case where a semiconductor device including the FET is used alone or the case where a light-emitting device including the light-emitting element is used alone, one embodiment of the invention can be constituted by only the semiconductor device including the FET and another embodiment of the invention can be constituted by only the light-emitting device including the light-emitting element. Those embodiments of the invention are clear and can be regarded as being disclosed in this specification or the like.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the invention can be clear. Furthermore, it can be determined that one embodiment of the invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, in a diagram or a text described in one embodiment, it is possible to take out part of the diagram or the text and constitute an embodiment of the invention. Thus, in the case where a diagram or a text related to a certain portion is described, the context taken out from part of the diagram or the text is also disclosed as one embodiment of the invention, and one embodiment of the invention can be constituted. The embodiment of the invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to constitute one embodiment of the invention by taking out M circuit elements (e.g., transistors or capacitors; M is an integer, where M<N). As another example, it is possible to constitute one embodiment of the invention by taking out M layers (M is an integer, where M<N) from a cross-sectional view in which N layers (N is an integer) are provided. As another example, it is possible to constitute one embodiment of the invention by taking out M elements (M is an integer, where M<N) from a flow chart in which N elements (N is an integer) are provided. As another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the invention is clear.

This application is based on Japanese Patent Application serial no. 2014-051988 filed with Japan Patent Office on Mar. 14, 2014 and Japanese Patent Application serial no. 2014-052001 filed with Japan Patent Office on Mar. 14, 2014, the entire contents of which are hereby incorporated by reference.

What is claimed is:

1. A semiconductor device comprising:
a memory cell array comprising memory cells, each of the memory cells comprising:
a first transistor;
a first circuit comprising:
a second transistor;
a third transistor; and
a first capacitor; and
a second circuit comprising:
a fourth transistor;
a fifth transistor; and
a second capacitor,
wherein a first terminal of the first transistor is electrically connected to a circuit configured to read a signal via a first wiring,
wherein a second terminal of the first transistor is electrically connected to a second wiring,
wherein a gate of the first transistor is electrically connected to a first terminal of the first circuit,
wherein the gate of the first transistor is electrically connected to a first terminal of the second circuit,
wherein a first terminal of the second transistor is electrically connected to the first terminal of the first circuit,
wherein a gate of the second transistor is electrically connected to a first terminal of the first capacitor,
wherein a first terminal of the third transistor is electrically connected to the gate of the second transistor,
wherein a first terminal of the fourth transistor is electrically connected to the first terminal of the second circuit,
wherein a gate of the fourth transistor is electrically connected to a first terminal of the second capacitor,
wherein a first terminal of the fifth transistor is electrically connected to the gate of the fourth transistor,
wherein the first transistor comprises single crystal silicon in its channel formation region, and
wherein the second transistor, the third transistor, the fourth transistor, and the fifth transistor each comprise an oxide semiconductor in their channel formation regions.

2. The semiconductor device according to claim 1, further comprising a third capacitor, wherein a first terminal of the third capacitor is electrically connected to the gate of the first transistor.

3. The semiconductor device according to claim 1, further comprising a sixth transistor, wherein a first terminal of the sixth transistor is electrically connected to the gate of the first transistor.

4. The semiconductor device according to claim 1,
wherein a second terminal of the second transistor is electrically connected to a second terminal of the third transistor, and
wherein a second terminal of the fourth transistor is electrically connected to a second terminal of the fifth transistor.

5. The semiconductor device according to claim 1,
wherein the second transistor, the third transistor, the fourth transistor, and the fifth transistor each have a same polarity, and
wherein the first transistor has a polarity different from a polarity of the second transistor.

6. The semiconductor device according to claim 1, wherein an amplitude of a potential of the gate of the first transistor is smaller than an amplitude of a potential of the gate of the second transistor.

7. The semiconductor device according to claim 1,
wherein the first circuit is configured to store data of one bit or more, and
wherein the second circuit is configured to store data of one bit or more.

8. An electronic device comprising:
the semiconductor device according to claim 1, and
a display device.

9. A semiconductor device comprising:
a memory cell array comprising memory cells, each of the memory cells comprising:
a first transistor;
a second transistor;
a third transistor;
a fourth transistor;
a fifth transistor;
a first capacitor;
a second capacitor; and
a third capacitor,
wherein a first terminal of the first transistor is electrically connected to a circuit configured to read a signal via a first wiring,
wherein a second terminal of the first transistor is electrically connected to a second wiring,
wherein a first terminal of the second transistor is electrically connected to a gate of the first transistor,
wherein a first terminal of the third capacitor is electrically connected to the gate of the first transistor,
wherein a gate of the second transistor is electrically connected to a first terminal of the first capacitor,
wherein a first terminal of the third transistor is electrically connected to the gate of the second transistor,
wherein a first terminal of the fourth transistor is electrically connected to the gate of the first transistor,
wherein a gate of the fourth transistor is electrically connected to a first terminal of the second capacitor, and
wherein a first terminal of the fifth transistor is electrically connected to the gate of the fourth transistor.

10. The semiconductor device according to claim 9,
wherein a second terminal of the second transistor is electrically connected to a second terminal of the third transistor, and
wherein a second terminal of the fourth transistor is electrically connected to a second terminal of the fifth transistor.

11. The semiconductor device according to claim 9,
wherein the first transistor comprises single crystal silicon in its channel formation region, and
wherein the second transistor, the third transistor, the fourth transistor, and the fifth transistor each comprise an oxide semiconductor in their channel formation regions.

12. The semiconductor device according to claim 9,
wherein the second transistor, the third transistor, the fourth transistor, and the fifth transistor each have a same polarity, and
wherein the first transistor has a polarity different from a polarity of the second transistor.

13. The semiconductor device according to claim 9, wherein an amplitude of a potential of the gate of the first transistor is smaller than an amplitude of a potential of the gate of the second transistor.

14. An electronic device comprising:
the semiconductor device according to claim 9, and
a display device.

15. A semiconductor device comprising:
a memory cell array comprising memory cells, each of the memory cells comprising:
a first transistor;
a second transistor;
a third transistor; and
a capacitor,
wherein a gate of the first transistor is electrically connected to a first terminal of the second transistor,
wherein a first terminal of the first transistor is electrically connected to a circuit configured to read a signal via a first wiring,
wherein a gate of the second transistor is electrically connected to a first terminal of the third transistor and a first terminal of the capacitor,
wherein the first transistor comprises single crystal silicon in its channel formation region, and
wherein the second transistor and the third transistor each comprise an oxide semiconductor in their channel formation regions.

16. The semiconductor device according to claim 15, wherein a polarity of the first transistor is different from those of the second transistor and the third transistor.

17. The semiconductor device according to claim 15,
wherein a second terminal of the second transistor is electrically connected to a second wiring, and
wherein a second terminal of the third transistor is electrically connected to a third wiring.

18. The semiconductor device according to claim 15, wherein a second terminal of the second transistor and a second terminal of the third transistor are electrically connected to a second wiring.

19. The semiconductor device according to claim 15, wherein the oxide semiconductor comprises indium, gallium, and zinc.

20. The semiconductor device according to claim 15, comprising a fourth transistor, wherein the first transistor and the fourth transistor are electrically connected in series between the first wiring and a second wiring.

21. An electronic device comprising:
the semiconductor device according to claim 15, and
a display device.

22. The semiconductor device according to claim 1, wherein the first wiring has a function of a bit line.

23. The semiconductor device according to claim 9, wherein the first wiring has a function of a bit line.

24. The semiconductor device according to claim 15, wherein the first wiring has a function of a bit line.

25. A semiconductor device comprising:
a memory cell array comprising memory cells, each of the memory cells comprising:
a first transistor;
a second transistor;
a third transistor;
a fourth transistor;
a fifth transistor;
a sixth transistor;
a first capacitor; and
a second capacitor,
wherein a first terminal of the first transistor is electrically connected to a circuit configured to read a signal via a first wiring,
wherein a second terminal of the first transistor is electrically connected to a second wiring, wherein a first terminal of the second transistor is electrically connected to a gate of the first transistor,
wherein a first terminal of the sixth transistor is electrically connected to the gate of the first transistor,
wherein a gate of the second transistor is electrically connected to a first terminal of the first capacitor,
wherein a first terminal of the third transistor is electrically connected to the gate of the second transistor,
wherein a first terminal of the fourth transistor is electrically connected to the gate of the first transistor,
wherein a gate of the fourth transistor is electrically connected to a first terminal of the second capacitor, and
wherein a first terminal of the fifth transistor is electrically connected to the gate of the fourth transistor.

26. A semiconductor device according to claim 25, further comprising a sixth transistor, wherein the first transistor and the seventh transistor are electrically connected in series to each other between the first wiring and the second wiring.

27. The semiconductor device according to claim 25,
wherein a second terminal of the second transistor is electrically connected to a second terminal of the third transistor, and
wherein a second terminal of the fourth transistor is electrically connected to a second terminal of the fifth transistor.

28. The semiconductor device according to claim 25,
wherein the first transistor comprises single crystal silicon in its channel formation region, and
wherein the second transistor, the third transistor, the fourth transistor, and the fifth transistor each comprise an oxide semiconductor in their channel formation regions.

29. The semiconductor device according to claim 25,
wherein the second transistor, the third transistor, the fourth transistor, and the fifth transistor each have a same polarity, and
wherein the first transistor has a polarity different from a polarity of the second transistor.

30. The semiconductor device according to claim 25, wherein an amplitude of a potential of the gate of the first transistor is smaller than an amplitude of a potential of the gate of the second transistor.

31. An electronic device comprising:
the semiconductor device according to claim 25, and
a display device.

32. The semiconductor device according to claim 25, wherein the first wiring has a function of a bit line.

* * * * *